(12) United States Patent
Kim et al.

(10) Patent No.: US 12,002,821 B2
(45) Date of Patent: Jun. 4, 2024

(54) DISPLAY APPARATUS AND METHOD OF MANUFACTURING THE SAME

(71) Applicant: Samsung Display Co., Ltd., Yongin-si (KR)

(72) Inventors: Joongeol Kim, Yongin-si (KR); Seulki Kim, Yongin-si (KR); Youngjae Jeon, Yongin-si (KR); Hyunseong Kang, Yongin-si (KR); Seungrae Kim, Yongin-si (KR); Jongin Kim, Yongin-si (KR); Seokhwan Bang, Yongin-si (KR); Seungsok Son, Yongin-si (KR); Donghoon Shin, Yongin-si (KR); Kapsoo Yoon, Yongin-si (KR); Kwangsoo Lee, Yongin-si (KR); Woogeun Lee, Yongin-si (KR); Jaehyun Lee, Yongin-si (KR); Kisu Jin, Yongin-si (KR); Junewhan Choi, Yongin-si (KR); Jongmoo Huh, Yongin-si (KR); Jiyun Hong, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 427 days.

(21) Appl. No.: 17/358,640

(22) Filed: Jun. 25, 2021

(65) Prior Publication Data
US 2022/0139970 A1    May 5, 2022

(30) Foreign Application Priority Data
Nov. 2, 2020    (KR) .................. 10-2020-0144578

(51) Int. Cl.
*H01L 27/12*    (2006.01)
*H01L 25/16*    (2023.01)
(Continued)

(52) U.S. Cl.
CPC ........ *H01L 27/1288* (2013.01); *H01L 25/167* (2013.01); *H01L 27/124* (2013.01);
(Continued)

(58) Field of Classification Search
CPC .................................................. H01L 27/1288
See application file for complete search history.

(56) References Cited

U.S. PATENT DOCUMENTS

| 7,309,955 B2 * | 12/2007 | Kim ..................... H10K 59/131 |
| | | 313/506 |
| 8,017,950 B2 | 9/2011 | Joo |

(Continued)

FOREIGN PATENT DOCUMENTS

| KR | 10-2007-0071083 | 7/2007 |
| KR | 10-2016-0008023 | 1/2016 |

(Continued)

*Primary Examiner* — Douglas M Menz
(74) *Attorney, Agent, or Firm* — KILE PARK REED & HOUTTEMAN PLLC

(57) ABSTRACT

A display apparatus includes a substrate including a display area and a peripheral area adjacent to the display area, a thin-film transistor located in the display area of the substrate and including a semiconductor layer and a gate electrode overlapping a channel region of the semiconductor layer, a conductive layer disposed between the substrate and the semiconductor layer and including a first electrode located in the display area of the substrate and a pad electrode located in the peripheral area of the substrate, and a first insulating layer disposed between the conductive layer and the semiconductor layer and having a first opening that exposes at least a portion of an upper surface of the pad electrode.

25 Claims, 60 Drawing Sheets

(51) Int. Cl.
*H10K 59/124* (2023.01)
*H10K 59/131* (2023.01)
*H10K 71/00* (2023.01)
H10K 59/12 (2023.01)

(52) U.S. Cl.
CPC ....... *H01L 27/1248* (2013.01); *H10K 59/124* (2023.02); *H10K 59/131* (2023.02); *H10K 71/00* (2023.02); H10K 59/1201 (2023.02)

(56) References Cited

U.S. PATENT DOCUMENTS

| | | |
|---|---|---|
| 8,633,490 B2 | 1/2014 | Park et al. |
| 8,871,590 B2 | 10/2014 | Choi et al. |
| 9,000,523 B2 | 4/2015 | Choi et al. |
| 9,142,805 B2 * | 9/2015 | Yu .................... H10K 50/841 |
| 9,153,605 B2 | 10/2015 | Kim et al. |
| 9,437,487 B2 | 9/2016 | Shu et al. |
| 10,186,568 B2 | 1/2019 | Kim et al. |
| 2019/0172884 A1 | 6/2019 | Shim et al. |

FOREIGN PATENT DOCUMENTS

| | | |
|---|---|---|
| KR | 10-2016-0012876 | 2/2016 |
| KR | 10-2016-0033296 | 3/2016 |
| KR | 10-2016-0141177 | 12/2016 |
| KR | 10-1801974 | 11/2017 |
| KR | 10-1815256 | 1/2018 |
| KR | 10-1881895 | 7/2018 |
| KR | 10-1920770 | 11/2018 |
| KR | 10-1908383 | 12/2018 |
| KR | 10-2019-0038205 | 4/2019 |
| KR | 10-2092034 | 3/2020 |

* cited by examiner

DISPLAY APPARATUS AND METHOD OF MANUFACTURING THE SAME

CROSS-REFERENCE TO RELATED APPLICATION(S)

This application claims priority to and benefits of Korean Patent Application No. 10-2020-0144578 under 35 U.S.C. § 119, filed on Nov. 2, 2020, in the Korean Intellectual Property Office, the entire contents of which are incorporated herein by reference.

BACKGROUND

1. Technical Field

One or more embodiments relate to a display apparatus and a method of manufacturing the same.

2. Description of the Related Art

Display apparatuses visually display data. Such display apparatuses are used as displays of small products, such as mobile phones, or large products, such as televisions.

A display apparatus may include a substrate including a display area and a non-display area. Gate lines and data lines may be located or arranged in the display area to be insulated from each other. A plurality of pixel regions may be defined in the display area, and pixels respectively located in the plurality of pixel regions receive electrical signals from the gate lines and the data lines intersecting each other and emit light, thereby displaying an image to the outside. A thin-film transistor and a pixel electrode electrically connected to the thin-film transistor are provided in each of the pixel regions, and an opposite electrode may be commonly provided over the pixel regions. Various wirings for transmitting an electrical signal to the pixels in the display area, a gate driver, and pads to which a data driver and a controller may be electrically connected may be provided or located in the non-display area.

Applications of conventional display apparatuses have diversified. Also, due to their relatively small thickness and light weight, the application range thereof has increased. Applications of display apparatuses have been diversified, and also, various efforts to design display apparatuses with improved quality have been made.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

In order to address several drawbacks, one or more embodiments include a display apparatus which prevents damage to a surface of an insulating layer on which pixel electrodes are arranged or disposed, and a method of manufacturing the display apparatus. However, the one or more embodiments are only examples, and the scope of the disclosure is not limited thereto.

Additional aspects will be set forth in part in the description which follows and, in part, will be apparent from the description, or may be learned by practice of the presented embodiments of the disclosure.

According to one or more embodiments, a display apparatus may include a substrate including a display area and a peripheral area adjacent to the display area; a thin-film transistor located in the display area of the substrate, and including a semiconductor layer; and a gate electrode overlapping a channel region of the semiconductor layer; a conductive layer disposed between the substrate and the semiconductor layer, and including a first electrode located in the display area of the substrate; and a pad electrode located in the peripheral area of the substrate; and a first insulating layer disposed between the conductive layer and the semiconductor layer and having a first opening that exposes at least a portion of an upper surface of the pad electrode.

The display apparatus may further include a second insulating layer disposed on the thin-film transistor and having a second opening coinciding with the first opening of the first insulating layer.

The display apparatus may further include a third insulating layer disposed on the second insulating layer and having a third opening coinciding with the first opening of the first insulating layer and the second opening of the second insulating layer, the third opening exposing the at least a portion of the upper surface of the pad electrode.

The third insulating layer may include a first portion having a first thickness; and a second portion having a second thickness less than the first thickness of the first portion.

The third opening may be located in the second portion of the third insulating layer.

The display apparatus may further include a pixel electrode located on the first portion of the third insulating layer and electrically connected to the thin-film transistor; a pixel defining layer disposed on the third insulating layer and exposing at least a portion of the pixel electrode; an intermediate layer located on the at least a portion of the pixel electrode; and an opposite electrode disposed on the intermediate layer.

The second insulating layer may include a first portion having a third thickness; and a second portion having a fourth thickness less than the third thickness of the first portion.

The second opening of the second insulating layer may include a lower opening portion and an upper opening portion. An opening area of the upper opening portion may be greater than an opening area of the lower opening portion in a plan view.

The second insulating layer may comprise a lower sidewall that defines the lower opening portion; and an upper sidewall that defines the upper opening portion, and the upper sidewall may be disposed around the lower sidewall in a plan view.

The display apparatus may further include a third insulating layer disposed on the second insulating layer and having a third opening that exposes the at least a portion of the upper surface of the pad electrode. The lower opening portion of the second opening of the second insulating layer may coincide with the first opening of the first insulating layer, and the upper opening portion of the second opening of the second insulating layer may coincide with the third opening of the third insulating layer.

The display apparatus may further include a third insulating layer disposed on the second insulating layer and having a third opening that defines a pad unit including a plurality of pad electrodes.

The first insulating layer may include a first portion having a first thickness; and a second portion having a second thickness less than the first thickness of the first portion. The first opening may be located in the second portion of the first insulating layer, and the first portion may be located around the second portion.

The display apparatus may further include a second insulating layer disposed on the thin-film transistor and having a second opening coinciding with the first opening of the first insulating layer, wherein the second insulating layer may include a first portion coinciding with the first portion of the first insulating layer; and a second portion coinciding with the second portion of the first insulating layer. The second opening may be located in the second portion of the second insulating layer.

The second opening of the second insulating layer may include a lower opening portion and an upper opening portion. An opening area of the upper opening portion may be greater than an opening area of the lower opening portion in a plan view.

The conductive layer may further include a second electrode that at least partially overlaps the channel region of the semiconductor layer.

The pad electrode may include a first layer; and a second layer disposed on the first layer and the first opening of the first insulating layer may partially expose the second layer of the pad electrode.

The gate electrode may include a lower gate electrode; and an upper gate electrode disposed on the lower gate electrode. The display apparatus may further include a lower electrode layer disposed on the lower gate electrode and the pad electrode, and the lower electrode layer may include a first pad connection electrode that electrically contacts the pad electrode through the first opening of the first insulating layer.

A width of the first pad connection electrode may be greater than a width of the at least a portion of the pad electrode exposed by the first opening of the first insulating layer.

The display apparatus may further include a gate insulating layer disposed between the semiconductor layer and the gate electrode. A portion of the gate insulating layer may be located between a portion of the first pad connection electrode and the first insulating layer.

The display apparatus may further include a second insulating layer disposed on the thin-film transistor and having a second opening that exposes an upper surface of the first pad connection electrode and a portion of the gate insulating layer.

The display apparatus may further include a second pad connection electrode disposed on the first pad connection electrode.

The display apparatus may further include a third insulating layer disposed on the thin-film transistor; and a pixel electrode layer including a pixel electrode disposed on the third insulating layer and electrically connected to the thin-film transistor; and the second pad connection electrode.

The display apparatus may further include a third insulating layer disposed on the thin-film transistor; a first pixel electrode layer including a lower pixel electrode disposed on the third insulating layer and electrically connected to the thin-film transistor; and the second pad connection electrode; and a second pixel electrode layer including an upper pixel electrode disposed on the lower pixel electrode.

According to one or more embodiments, a method of manufacturing a display apparatus may include preparing a substrate including a display area and a peripheral area adjacent to the display area; forming a conductive layer on the substrate, the conductive layer including a first electrode located in the display area and a pad electrode located in the peripheral area; forming a first insulating layer on the conductive layer, the first insulating layer having a first opening that exposes at least a portion of an upper surface of the pad electrode; forming a semiconductor layer on the first insulating layer, the semiconductor layer having a channel region that overlaps the first electrode; and forming an electrode layer including a gate electrode that overlaps the channel region of the semiconductor layer.

These and/or other aspects will become apparent and more readily appreciated from the following description of the embodiments, the claims, and the accompanying drawings.

These general embodiments may be implemented by using a system, a method, a computer program, or a combination thereof.

BRIEF DESCRIPTION OF THE DRAWINGS

The above and other aspects, features, and advantages of embodiments will be more apparent from the following description taken in conjunction with the accompanying drawings, in which.

DETAILED DESCRIPTION OF THE EMBODIMENTS

Figure 1:
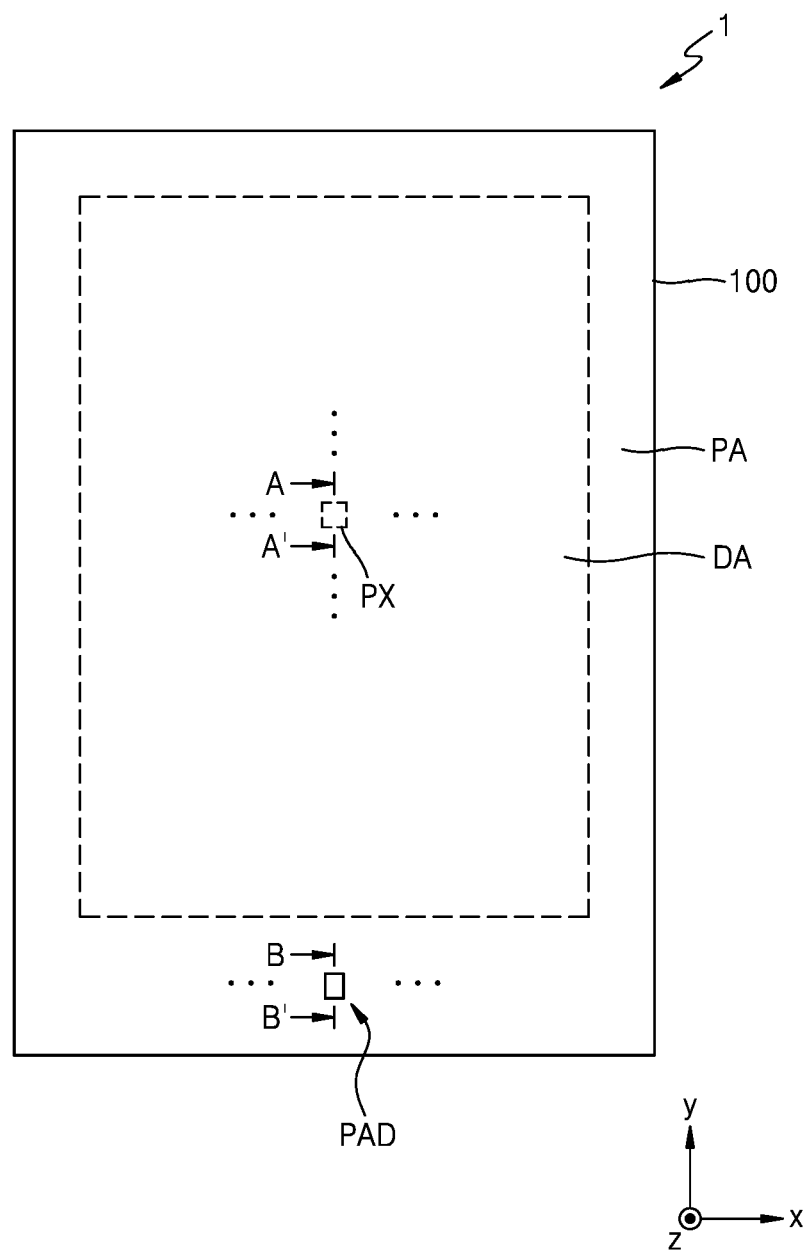
FIG. 1 is a schematic plan view of a display apparatus according to an embodiment.

Reference will now be made in detail to embodiments, examples of which are illustrated in the accompanying drawings, wherein like reference numerals refer to like elements throughout. In this regard, embodiments may have different forms and should not be construed as being limited to the descriptions set forth herein. Accordingly, the embodiments are merely described below, by referring to the figures, to explain aspects of the description.

Throughout the disclosure, the expression "at least one of a, b or c" indicates only a, only b, only c, both a and b, both a and c, both b and c, all of a, b, and c, or variations thereof.

In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or."

As the disclosure allows for various changes and numerous embodiments, embodiments will be illustrated in the drawings and described in detail in the written description. Hereinafter, effects and features of the disclosure and a method for accomplishing them will be described more fully with reference to the accompanying drawings, in which embodiments of the disclosure are shown. This disclosure may, however, be embodied in many different forms and should not be construed as limited to the embodiments set forth herein.

One or more embodiments of the disclosure will be described below in more detail with reference to the accompanying drawings. Those components that are the same or are in correspondence with each other are rendered the same reference numeral regardless of the figure number, and redundant explanations are omitted.

It will be understood that although the terms "first," "second," etc. may be used herein to describe various components, these components should not be limited by these terms. These components are only used to distinguish one component from another. For example, a first component may be referred to as a second component, and similarly, a second component may be referred to as a first component without departing from the scope of the disclosure.

As used herein, the singular forms "a," "an," and "the" are intended to include the plural forms as well, unless the context clearly indicates otherwise.

It will be further understood that the terms "comprises" and/or "comprising", "includes" and/or "including", "has", "have" and/or "having" and variations thereof used herein specify the presence of stated features or components, but do not preclude the presence or addition of one or more other features or components.

It will be understood that when a layer, region, or component is referred to as being "formed on" another layer, region, or component, it can be directly or indirectly formed on the other layer, region, or component. For example, intervening layers, regions, or components may be present.

Sizes of elements in the drawings may be exaggerated for convenience of explanation. In other words, since sizes and thicknesses of components in the drawings are arbitrarily illustrated for convenience of explanation, the following embodiments are not limited thereto.

When an embodiment may be implemented differently, a selected process order may be performed differently from the described order. For example, two consecutively described processes may be performed substantially at the same time or performed in an order opposite to the described order.

In the specification, "A and/or B" represents A or B, or A and B. The expression "at least one of A and B" indicates only A, only B, both A and B, or variations thereof.

It will also be understood that when a layer, region, or component is referred to as being "connected" or "coupled" to another layer, region, or component, it can be directly connected or coupled to the other layer, region, or/and component or intervening layers, regions, or components may be present. For example, when a layer, region, or component is referred to as being "electrically connected" or "electrically coupled" to another layer, region, or component, it can be directly electrically connected or coupled to the other layer, region, and/or component or intervening layers, regions, or components may be present.

It will be understood that the terms "connected to" or "coupled to" may include a physical or electrical connection or coupling.

In the following examples, the x-axis, the y-axis and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

The spatially relative terms "below", "beneath", "lower", "above", "upper", or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art.

When an element is described as 'not overlapping' or 'to not overlap' another element, this may include that the elements are spaced apart from each other, offset from each other, or set aside from each other or any other suitable term as would be appreciated and understood by those of ordinary skill in the art.

The terms "face" and "facing" mean that a first element may directly or indirectly oppose a second element. In a case in which a third element intervenes between the first and second element, the first and second element may be understood as being indirectly opposed to one another, although still facing each other.

The phrase "in a plan view" means viewing the object from the top, and the phrase "in a schematic cross-sectional view" means viewing a cross-section of which the object is vertically cut from the side.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which the disclosure pertains. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a schematic plan view of a display apparatus 1 according to an embodiment.

Referring to FIG. 1, the display apparatus 1 may include a display area DA where an image is displayed, and a peripheral area PA surrounding or adjacent to the display area DA. The display apparatus 1 may provide an image to the outside by using light emitted in the display area DA. Because the display apparatus 1 may include a substrate 100, it may be considered that the substrate 100 has the display area DA and the peripheral area PA.

The substrate 100 may include any of various materials, such as glass, metal, or plastic. According to an embodiment, the substrate 100 may include a flexible material. The flexible material is referred to as a substrate that may be easily bent, folded, or rolled. The substrate 100 of the flexible material may include ultra-thin glass, metal, or plastic.

Pixels PX including various display elements such as an organic light-emitting diode (OLED) may be located or disposed in the display area DA of the substrate 100. A plurality of pixels PX may be included, and the plurality of pixels PX may be arranged or disposed in any of various patterns such as a stripe pattern, a PenTile® pattern, or a mosaic pattern to form an image.

In a plan view, the display area DA may have a substantially rectangular shape as shown in FIG. 1. In an embodiment, the display area DA may have a substantially polygonal shape (for example, a substantially triangular shape, a substantially pentagonal shape, or a substantially hexagonal shape), a substantially circular shape, a substantially elliptical shape, or an irregular shape.

The peripheral area PA of the substrate 100 located or disposed around or may be adjacent to the display area DA may be an area where an image is not displayed. The peripheral area PA may entirely or partially surround or may be adjacent to the display area DA. Various wirings for transmitting electric signals to be applied to the display area DA, and a pad unit PAD to which a printed circuit board (PCB) or a driver integrated circuit (IC) chip is attached may be located or disposed in the peripheral area PA.

Figure 2:
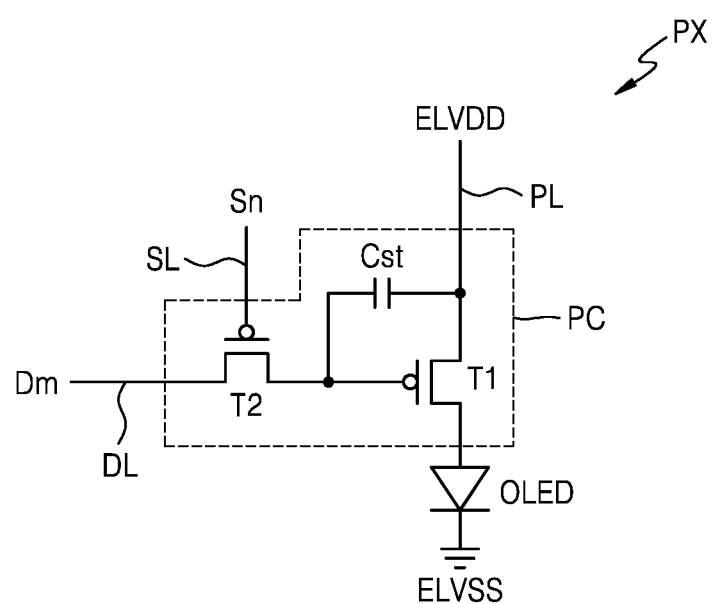
FIG. 2 is an equivalent circuit diagram of a pixel of a display apparatus according to an embodiment.

FIG. 2 is an equivalent circuit diagram of a pixel of a display apparatus according to an embodiment.

Referring to FIG. 2, each of the pixels PX may include a pixel circuit PC electrically connected to a scan line SL and a data line DL, and an organic light-emitting diode OLED electrically connected to the pixel circuit PC. The cathode of the organic light-emitting diode OLED may be a common electrode to which a common voltage ELVSS is applied.

The pixel circuit PC may include a driving thin-film transistor T1, a switching thin-film transistor T2, and a storage capacitor Cst. The switching thin-film transistor T2 may be electrically connected to the scan line SL and the data line DL, and transmits, to the driving thin-film transistor T1, a data signal Dm received via the data line DL according to a scan signal Sn received via the scan line SL.

The storage capacitor Cst may be electrically connected to the switching thin-film transistor T2 and a driving voltage line PL, and stores a voltage corresponding to a difference between a voltage received from the switching thin-film transistor T2 and a driving voltage ELVDD supplied to the driving voltage line PL.

The driving thin-film transistor T1 may be electrically connected to the driving voltage line PL and the storage capacitor Cst, and may control a driving current flowing from the driving voltage line PL to the organic light-emitting diode OLED, in accordance with a voltage value stored in the storage capacitor Cst. The organic light-emitting diode OLED may emit light having a certain or predetermined brightness due to the driving current.

Although a case where the pixel circuit PC may include two thin-film transistors and one storage capacitor is illustrated in FIG. 2, embodiments are not limited thereto. For example, the pixel circuit PC may include three or more thin-film transistors and/or two or more storage capacitors. According to an embodiment, the pixel circuit PC may include seven thin-film transistors and one storage capacitor.

Figure 3:
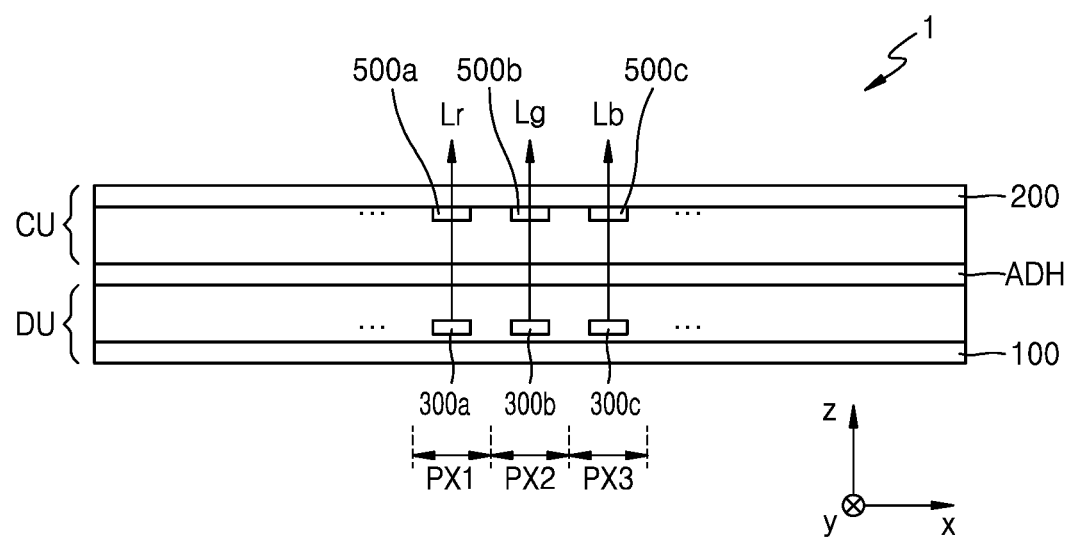
FIG. 3 is a schematic cross-sectional view of the display apparatus according to an embodiment.

FIG. 3 is a schematic cross-sectional view of the display apparatus 1 according to an embodiment.

Referring to FIG. 3, the display apparatus 1 may include a display unit or display DU and a color filter unit or color filter CU facing the display unit or display DU. The display unit or display DU may include a first pixel PX1, a second pixel PX2, and a third pixel PX3 located or disposed on the substrate 100 (hereinafter, referred to as a lower substrate). The first pixel PX1, the second pixel PX2, and the third pixel PX3 may be pixels that emit light of different colors on the lower substrate 100. For example, the first pixel PX1 may emit red light Lr, the second pixel PX2 may emit green light Lg, and the third pixel PX3 may emit blue light Lb.

The first pixel PX1, the second pixel PX2, and the third pixel PX3 may respectively include a first light-emitting device 300a, a second light-emitting device 300b, and a third light-emitting device 300c each including an organic light-emitting diode OLED. According to an embodiment, the first light-emitting device 300a, the second light-emitting device 300b, and the third light-emitting device 300c may emit blue light. According to an embodiment, the first light-emitting device 300a, the second light-emitting device 300b, and the third light-emitting device 300c may respectively emit the red light Lr, the green light Lg, and the blue light Lb.

The color filter unit or color filter CU may include filter portions 500a, 500b, and 500c. Light emitted from the first light-emitting device 300a, the second light-emitting device 300b, and the third light-emitting device 300c may pass through the filter portions 500a, 500b, and 500c and may be respectively emitted as the red light Lr, the green light Lg, and the blue light Lb.

The first portions 500a, 500b, and 500c may be located or disposed or directly located or disposed on an upper substrate 200. The filter portions 500a, 500b, and 500c may respectively include a first quantum dot layer 220a and a first filter layer 210a, a second quantum dot layer 220b and a second filter layer 210b, and a transmitting layer 220c and a third filter layer 210c of FIG. 20 which will be described below.

In case that the filter portions 500a, 500b, and 500c may be located or disposed or 'directly located or disposed on the upper substrate 200, it may mean that the first, second, and third filter layers 210a, 210b, and 210c may be formed or disposed or directly formed or disposed on the upper substrate 200 to manufacture the color filter unit or color filter CU. The display unit or display DU and the color filter unit or color filter CU may be bonded with each other such that the first, second, and third filter layers 210a, 210b, and 210c respectively face the first pixel PX1, the second pixel PX2, and the third pixel PX3.

In FIG. 3, the display unit or display DU and the color filter unit or color filter CU are bonded with each other through an adhesive layer ADH. The adhesive layer ADH may include, for example, but not limited to, an optical clear adhesive (OCA). According to an embodiment, the adhesive layer ADH may be omitted.

Although the filter portions 500a, 500b, and 500c are located or disposed on the upper substrate 200 in FIG. 3, the filter portions 500a, 500b, and 500c may be located or disposed on the display unit or display DU.

For example, the filter portions 500a, 500b, and 500c may be located or disposed on a thin-film encapsulation layer 400 of FIG. 20 which will be described below. The first quantum dot layer 220a, the second quantum dot layer 220b, the transmitting layer 220c, the first filter layer 210a, the second filter layer 210b, and the third filter layer 210c may be located or disposed on the thin-film encapsulation layer 400. First, the first quantum dot layer 220a, the second quantum dot layer 220b, and the transmitting layer 220c may be located or disposed on the thin-film encapsulation layer 400, and the first filter layer 210a, the second filter layer 210b, and the third filter layer 210c may be respectively located or disposed on the first quantum dot layer 220a, the second quantum dot layer 220b, and the transmitting layer 220c.

The display apparatus 1 may include the lower substrate 100 and the upper substrate 200 as shown in FIG. 3. The number of substrates included in the display apparatus 1 may be 2. For example, the display apparatus 1 may not include the upper substrate 200 and may include only the lower substrate 100. The filter portions 500a, 500b, and 500c may be located or disposed on the lower substrate 100. The number of substrates included in the display apparatus 1 may be 1.

Figure 4:
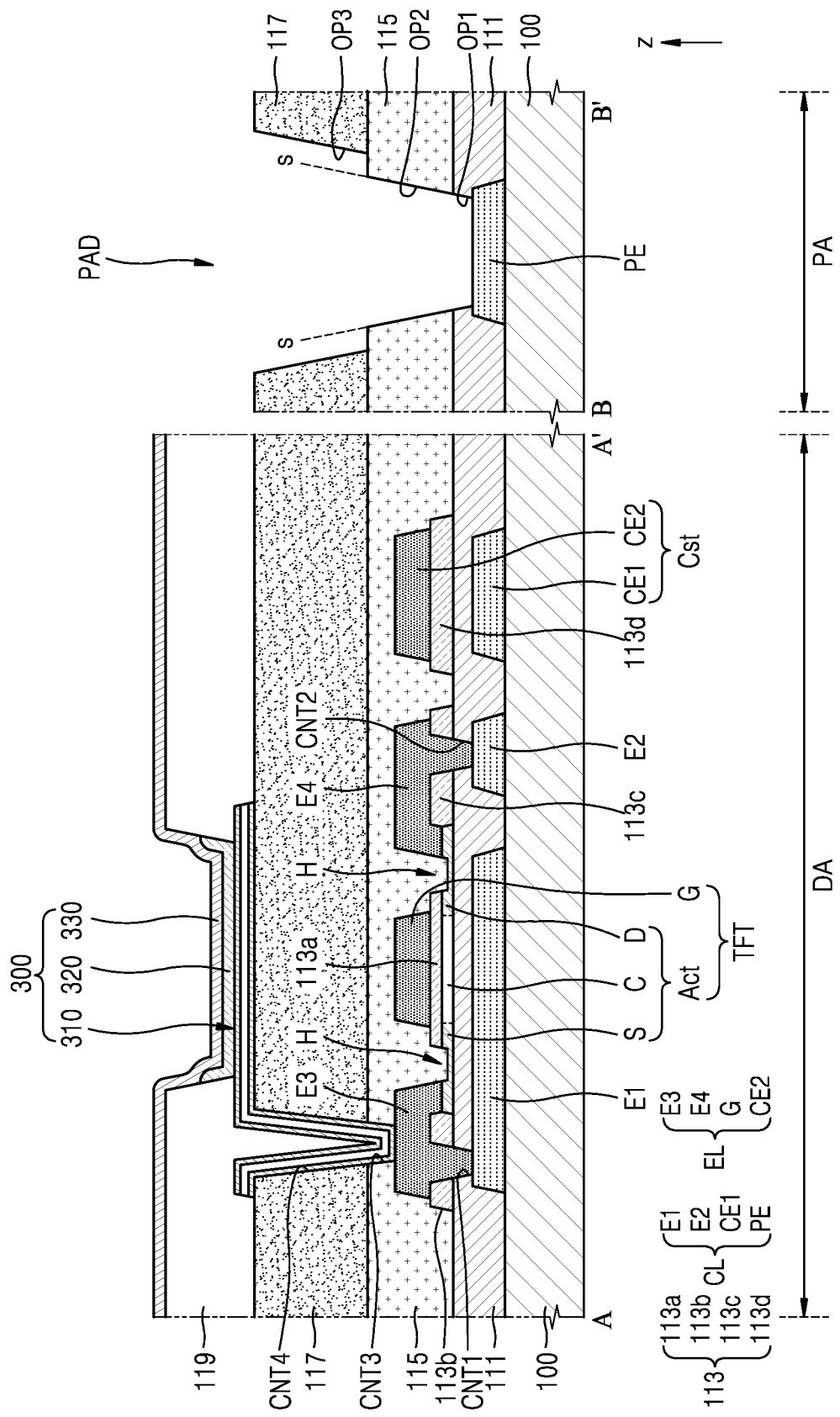
FIG. 4 is a schematic cross-sectional view of a display area and a pad unit of FIG. 1 taken along lines A-N and B-B', respectively.

FIG. 4 is a schematic cross-sectional view of a display apparatus according to an embodiment. In detail, FIG. 4 is a schematic cross-sectional view of the display area DA and the pad unit PAD of FIG. 1 taken along lines A-A' and B-B', respectively.

Referring to FIG. 4, the display apparatus 1 (see FIG. 1) may include a thin-film transistor TFT located or disposed on the substrate 100 corresponding to the display area DA and the pad unit PAD located or disposed on the substrate 100 corresponding to the peripheral area PA.

The thin-film transistor TFT may include a semiconductor layer Act, and a gate electrode G at least partially overlapping the semiconductor layer Act. The pad unit PAD may include a pad electrode PE.

A first electrode E1 may be below the semiconductor layer Act. The first electrode E1 and the pad electrode PE may be disposed on the same layer. For example, the first electrode E1 and the pad electrode PE may be disposed on the substrate 100. The first electrode E1 and the pad electrode PE may contact or directly contact the substrate 100.

A first insulating layer 111 may be below the semiconductor layer Act. The first insulating layer 111 may be disposed between the first electrode E1 and the semiconductor layer Act. The first insulating layer 111 may have a first opening OP1 exposing at least a portion of the upper surface of the pad electrode PE.

A second insulating layer 115 may be located or disposed on the thin-film transistor TFT. The second insulating layer 115 may have a second opening OP2 corresponding to the first opening OP1.

According to an embodiment, as shown in FIG. 4, the first insulating layer 111 and the second insulating layer 115 may have the same etched surface s. A lateral surface of the first insulating layer 111 exposed by the first opening OP1 and a lateral surface of the second insulating layer 115 exposed by the second opening OP2 may be located or disposed on the same etched surface s.

Elements included in the display apparatus 1 will now be described in more detail according to a stacked structure with reference to FIG. 4.

The substrate 100 may include a glass material, a metal material, or a material having flexible or bendable characteristics. In case that the substrate 100 is flexible or bendable, the substrate 100 may include polymer resin such as polyethersulphone, polyacrylate, polyetherimide, polyethylene naphthalate, polyethylene terephthalate, polyphenylene sulfide, polyarylate, polyimide, polycarbonate, or cellulose acetate propionate.

The substrate 100 may have a structure of a single layer or multiple layers of any of the aforementioned materials. The multi-layered structure may further include an inorganic layer. In an embodiment, the substrate 100 may have a structure of organic material/inorganic material/organic material.

The first insulating layer 111 may reduce or prevent infiltration of a foreign material, moisture, or ambient air from below the substrate 100 and may provide a flat surface to the substrate 100. The first insulating layer 111 may include an inorganic material (such as oxide or nitride), an organic material, or an organic and inorganic compound, and may be a single layer or multiple layers of an inorganic material and an organic material.

A buffer layer and/or a barrier layer may be further included disposed between the substrate 100 and the first insulating layer 111. The buffer layer and/or the barrier layer may prevent or minimize infiltration of impurities from the substrate 100 and the like into the semiconductor layer Act. The buffer layer and/or the barrier layer may include an inorganic material (such as oxide or nitride), an organic material, or an organic and inorganic compound, and may be a single layer or multiple layers of an inorganic material and an organic material.

In case that the buffer layer and/or the barrier layer are further included disposed between the substrate 100 and the first insulating layer 111, the first electrode E1 and the pad electrode PE may contact or directly contact the buffer layer and/or the barrier layer.

The semiconductor layer Act may be located or disposed on the first insulating layer 111.

According to an embodiment, the semiconductor layer Act may include an oxide semiconductor material. The semiconductor layer Act may include oxide of at least one selected from the group consisting of, for example, indium (In), gallium (Ga), tin (Sn), zirconium (Zr), vanadium (V), hafnium (Hf), cadmium (Cd), germanium (Ge), chromium (Cr), titanium (Ti), aluminum (Al), cesium (Cs), cerium (Ce), and zinc (Zn).

For example, the semiconductor layer Act may be an InSnZnO (ITZO) semiconductor layer, an InGaZnO (IGZO) semiconductor layer, or an InSnGaO (ITGO) semiconductor layer. Because an oxide semiconductor has a wide band gap (of about 3.1 eV), a high carrier mobility, and a low leakage current, a voltage drop is not large even in case that a driving time is long. Accordingly, a luminance change due to a voltage drop is not large even during low-frequency operation.

According to an embodiment, the semiconductor layer Act may include amorphous silicon or polysilicon.

The semiconductor layer Act may include a channel region C, and a source region S and a drain region D respectively located or disposed on both sides of the channel region C. The semiconductor layer Act may have a single-layer structure.

According to an embodiment, the semiconductor layer Act may include a plurality of holes H. For example, as shown in FIG. 4, holes H may be formed in the source region S and the drain region D of the semiconductor layer Act, respectively. The plurality of holes H may be a result of etching a portion of the semiconductor layer Act while a gate electrode G, a third electrode E3, and a fourth electrode E4 are being formed. In case that an etchant having high selectivity is used, the first insulating layer 111 may not be exposed even during partial etching of the semiconductor layer Act. As another example, in case that an etchant having low selectivity is used, the first insulating layer 111 may be exposed due to partial etching of the semiconductor layer Act. A portion of the first insulating layer 111 that overlaps the plurality of holes H may also be etched.

Even in case that the first insulating layer 111 is exposed due to partial etching of the semiconductor layer Act, an exposed region of the first insulating layer 111 is surrounded by a portion of the semiconductor layer Act not shown in a plan view, and thus movement of electrons or holes within the semiconductor layer Act is not hindered. Because the plurality of holes H are surrounded by the semiconductor layer Act in a plan view, even in case that the first insulating layer 111 is exposed through the plurality of holes H, movement of electrons or holes within the semiconductor layer Act is not hindered. In other words, the electrons or holes within the semiconductor layer Act may move by detouring around the plurality of holes H.

A conductive layer CL may be disposed between the substrate 100 and the first insulating layer 111. The conductive layer CL may include at least one of aluminum (Al), platinum (Pt), palladium (Pd), silver (Ag), magnesium (Mg), gold (Au), nickel (Ni), neodymium (Nd), iridium (Ir), chromium (Cr), calcium (Ca), molybdenum (Mo), titanium (Ti), tungsten (W), and copper (Cu) and may have a single-layered or multi-layered structure.

The conductive layer CL may include the first electrode E1, a second electrode E2, the lower electrode CE1 of the storage capacitor Cst, and the pad electrode PE. The first electrode E1, the second electrode E2, and the lower electrode CE1 of the storage capacitor Cst may be simultaneously formed by patterning a preliminary conductive layer. The first electrode E1, the second electrode E2, and the lower electrode CE1 of the storage capacitor Cst may be located or disposed on the display area DA of the substrate 100, and the pad electrode PE may be located or disposed on the peripheral area PA of the substrate 100.

According to an embodiment, as shown in FIG. 4, the first insulating layer 111 located or disposed on the pad electrode PE may have the first opening OP1. The first opening OP1 may expose at least a portion of an upper surface of the pad electrode PE.

According to an embodiment, the first electrode E1 and the second electrode E2 may be source electrodes, drain electrodes, data lines, or the like within the spirit and the scope of the disclosure.

According to an embodiment, the first electrode E1 may be overlapped by the semiconductor layer Act including an oxide semiconductor material. The first electrode E1 may be overlapped by the channel region C of the semiconductor layer Act. Because the semiconductor layer Act is weak to light in case that it may include an oxide semiconductor material, external light incident upon the substrate 100 through the first electrode E1 may induce a photocurrent in the semiconductor layer Act, thereby preventing a change in the element characteristics of the thin-film transistor TFT including an oxide semiconductor material.

The first electrode E1 may be electrically connected to the semiconductor layer Act. As shown in FIG. 4, the first electrode E1 may be electrically connected to the source region S of the semiconductor layer Act. As another example, the first electrode E1 may be electrically connected to the drain region D of the semiconductor layer Act. Because the first electrode E1 may be electrically connected to the semiconductor layer Act, a voltage of the first electrode E1 may be maintained constant without floating. Accordingly, obtainment of an unexpected result value according to a floating state of the voltage of the first electrode E1 during an operation of a pixel circuit may be prevented.

According to an embodiment, the pad electrode PE may extend toward the display area DA and may be electrically connected to one of a power supply wiring, a data supply wiring, a data line, a scan line, or the like within the spirit and the scope of the disclosure. Various voltages, a data signal, a scan signal, and the like received from a PCB or a driver IC chip through the pad electrode PE may be transmitted to the pixel circuit PC of FIG. 2. In other words, the pad electrode PE may serve as a bridge that electrically connects the PCB or the driver IC chip to a display panel.

According to an embodiment, the pad electrode PE may be electrically connected to a connecting electrode located or disposed on the same layer as or a different layer from the layer on which the pad electrode PE may be located or disposed. The pad electrode PE may be exposed and may be electrically connected to the PCB or the driver IC chip, and the connecting electrode may extend toward the display area DA and may be electrically connected to one of a power supply wiring, a data supply wiring, a data line, a scan line, or the like within the spirit and the scope of the disclosure. In other words, the pad electrode PE and the connecting electrode may serve as bridges that electrically connect the PCB or the driver IC chip to a display panel.

A first insulating layer 113 may be located or disposed on the semiconductor layer Act. The gate insulating layer 113 may include silicon oxide ($SiO_x$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), zinc oxide ($ZnO_2$), or the like within the spirit and the scope of the disclosure.

As shown in FIG. 4, the gate insulating layer 113 may be patterned to overlap a portion of the semiconductor layer Act. The gate insulating layer 113 may be patterned to expose at least portions of the source region S and the drain region D.

The gate insulating layer 113 may include a first portion 113a, a second portion 113b, a third portion 113c, and a fourth portion 113d. The first portion 113a of the gate insulating layer 113 may overlap the channel region C, the second portion 113b of the gate insulating layer 113 may overlap a portion of the source region S, the third portion 113c of the gate insulating layer 113 may overlap a portion of the drain region D, and the fourth portion 113d of the gate insulating layer 113 may overlap an upper electrode CE2 of the storage capacitor Cst which will be described later. The first portion 113a of the gate insulating layer 113 may overlap the gate electrode G which will be described later. The second portion 113b and the third portion 113c of the gate insulating layer 113 may cover or overlap both ends of the semiconductor layer Act, respectively.

The source region S and the drain region D may be subjected to a conductivity increasing process such as plasma treatment. A portion of the semiconductor layer Act overlapping the gate insulating layer 113 is not exposed to the plasma treatment and thus may have properties different from those of regions exposed to the plasma treatment. By using the gate insulating layer 113 as a self-alignment mask during the plasma treatment of the semiconductor layer Act, a plurality of regions having different properties may be formed in the semiconductor layer Act. The plurality of regions may be separated according to exposure or non-exposure during the plasma treatment.

For example, as shown in FIG. 4, the semiconductor layer Act may include the channel region C not subjected to plasma treatment and formed at a location overlapped by the first portion 113a of the gate insulating layer 113, and the source region S and the drain region D subjected to plasma treatment and respectively formed on both sides of the channel region C.

Because a portion of the source region S may be overlapped by the second portion 113b of the gate insulating layer 113, the portion of the source region S may not be subjected to plasma treatment due to the second portion 113b of the gate insulating layer 113. In contrast, as shown in FIG. 4, even in case that a portion of the source region S is overlapped by the second portion 113b of the gate insulating layer 113, all portions of the source region S may undergo plasma treatment, because a portion of the source region S subjected to plasma treatment is wider than the portion of the source region S overlapped by the second portion 113b of the gate insulating layer 113. Although the source region S has been focused on and described above, this description is equally applicable to the drain region D.

At least a portion of the source region S subjected to plasma treatment and at least a portion of the drain region D subjected to plasma treatment may become respectively conductive. For example, in case that the semiconductor layer Act is an n-type semiconductor, at least a portion of the source region S and at least a portion of the drain region D that undergoes plasma treatment may become of an n+ type.

In FIG. 4, the gate insulating layer 113 is patterned. However, as another example, the gate insulating layer 113 may be located or disposed on the entire surface of the substrate 100 to cover or overlap an upper surface and a lateral surface of the semiconductor layer Act.

The electrode layer EL may be located or disposed on the gate insulating layer 113. The electrode layer EL may include at least one of aluminum (Al), platinum (Pt), palladium (Pd), silver (Ag), magnesium (Mg), gold (Au), nickel (Ni), neodymium (Nd), iridium (Ir), chromium (Cr), calcium (Ca), molybdenum (Mo), titanium (Ti), tungsten (W), and copper (Cu) and may have a single-layered or multi-layered structure.

The electrode layer EL may include the gate electrode G, the third electrode E3, the fourth electrode E4, and the upper electrode CE2 of the storage capacitor Cst. The gate electrode G, the third electrode E3, the fourth electrode E4, and the upper electrode CE2 of the storage capacitor Cst may be simultaneously formed by patterning a preliminary electrode layer. The gate electrode G, the third electrode E3, the fourth electrode E4, and the upper electrode CE2 of the storage capacitor Cst may be located or disposed on the display area DA of the substrate 100.

At least a portion of the gate electrode G may overlap the semiconductor layer Act. The gate electrode G may overlap the channel region C of the semiconductor layer Act. The gate electrode G may overlap the first portion 113a of the gate insulating layer 113.

The third electrode E3 may be electrically connected to the source region S and the fourth electrode E4 may be electrically connected to the drain region D. The third electrode E3 may overlap the second portion 113b of the gate insulating layer 113, and the fourth electrode E4 may overlap the third portion 113c of the gate insulating layer 113. The third electrode E3 may surround one or a lateral surface of the second portion 113b of the gate insulating layer 113, and the fourth electrode E4 may surround one or a lateral surface of the third portion 113c of the gate insulating layer 113.

Although a portion of the second portion 113b of the gate insulating layer 113 may be disposed between the third electrode E3 and the semiconductor layer Act in FIG. 4, the second portion 113b of the gate insulating layer 113 disposed between the third electrode E3 and the semiconductor layer Act may be omitted. An area by which the third electrode E3 and the semiconductor layer Act contact or directly contact each other may increase.

Although the third electrode E3 has been focused on and described above, this description is equally applicable to the fourth electrode E4. In other words, the third portion 113c of the gate insulating layer 113 disposed between the fourth electrode E4 and the semiconductor layer Act may be omitted, and an area by which the fourth electrode E4 and the semiconductor layer Act contact or directly contact may increase.

The third electrode E3 may be electrically connected to the first electrode E1 via the second portion 113b of the gate insulating layer 113 and a first contact hole CNT1 defined in the first insulating layer 111. Because the third electrode E3 may be electrically connected to the semiconductor layer Act, the semiconductor layer Act and the first electrode E1 may be electrically connected to each other via the third electrode E3. The third electrode E3 may serve as a bridge that electrically connects the semiconductor layer Act to the first electrode E1.

The fourth electrode E4 may be electrically connected to the second electrode E2 via the third portion 113c of the gate insulating layer 113 and a second contact hole CNT2 defined in the first insulating layer 111. Because the fourth electrode E4 may be electrically connected to the semiconductor layer Act, the semiconductor layer Act and the second electrode E2 may be electrically connected to each other via the fourth electrode E4. The fourth electrode E4 may serve as a bridge that electrically connects the semiconductor layer Act to the second electrode E2.

The upper electrode CE2 of the storage capacitor Cst may overlap the lower electrode CE1 with the first insulating layer 111 and the gate insulating layer 113 therebetween, and may form a capacitance. The first insulating layer 111 and the gate insulating layer 113 may function as a dielectric layer of the storage capacitor Cst.

According to an embodiment, the storage capacitor Cst may include the lower electrode CE1 and the upper electrode CE2, and may not overlap the thin-film transistor TFT and may be separately located or disposed as shown in FIG. 4. For example, the storage capacitor Cst may overlap the thin-film transistor TFT. For example, the gate electrode G of the thin-film transistor TFT may function as the lower electrode CE1 of the storage capacitor Cst.

The second insulating layer 115 may be located or disposed on the electrode layer EL. The second insulating layer 115 may be located or disposed to cover or overlap the gate electrode G, the third electrode E3, the fourth electrode E4, and the upper electrode CE2 of the storage capacitor Cst. The gate electrode G, the third electrode E3, the fourth electrode E4, and the upper electrode CE2 of the storage capacitor Cst may be covered with or overlapped by the second insulating layer 115. The second insulating layer 115 may be an inorganic insulating layer including an inorganic material. Polysiloxane, silicon nitride, silicon oxide, silicon oxynitride, or the like may be used as the inorganic material. The second insulating layer 115 may be a single layer or multi-layer of silicon nitride ($SiN_x$) and silicon oxide ($SiO_x$). The second insulating layer 115 may be introduced to cover or overlap and protect some or a number of wires located or disposed on the first insulating layer 111.

According to an embodiment, the second insulating layer 115 may have the second opening OP2 corresponding to or coinciding with the first opening OP1 of the first insulating layer 111. The second opening OP2 may expose at least a portion of the upper surface of the pad electrode PE. The pad electrode PE may be electrically connected to a PCB or a driver IC chip through the first opening OP1 and the second opening OP2.

According to an embodiment, as shown in FIG. 4, the first insulating layer 111 and the second insulating layer 115 may have the same etched surface s. The lateral surface of the first insulating layer 111 exposed by the first opening OP1 and the lateral surface of the second insulating layer 115 exposed by the second opening OP2 may be located or disposed on the same etched surface s.

Figure 6A:
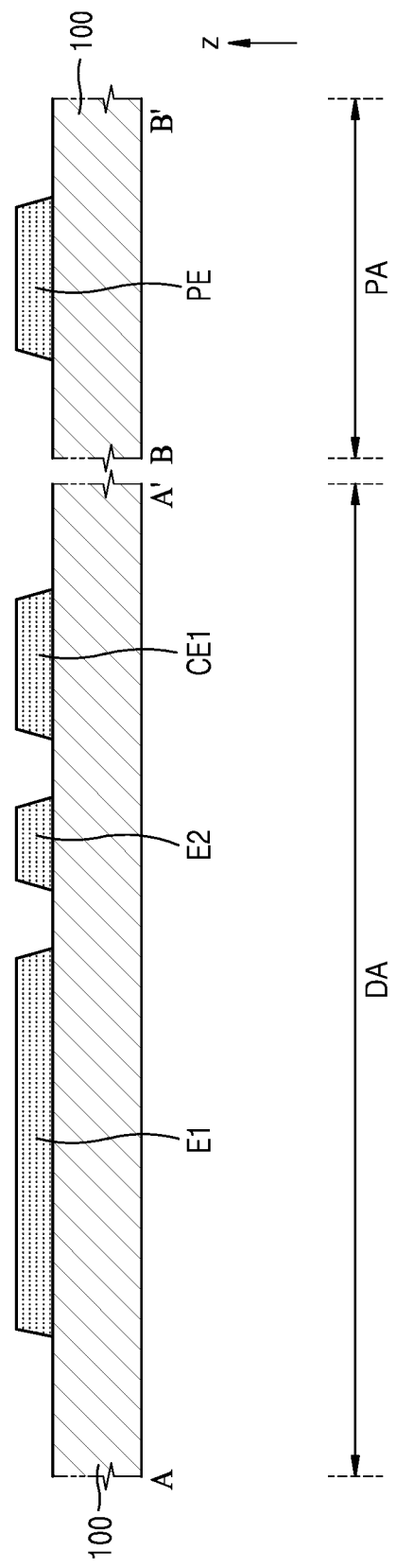
FIGS. 6A through 6K are schematic cross-sectional views schematically illustrating, based on FIG. 4, a method of manufacturing a display apparatus according to an embodiment.
Figure 6B:
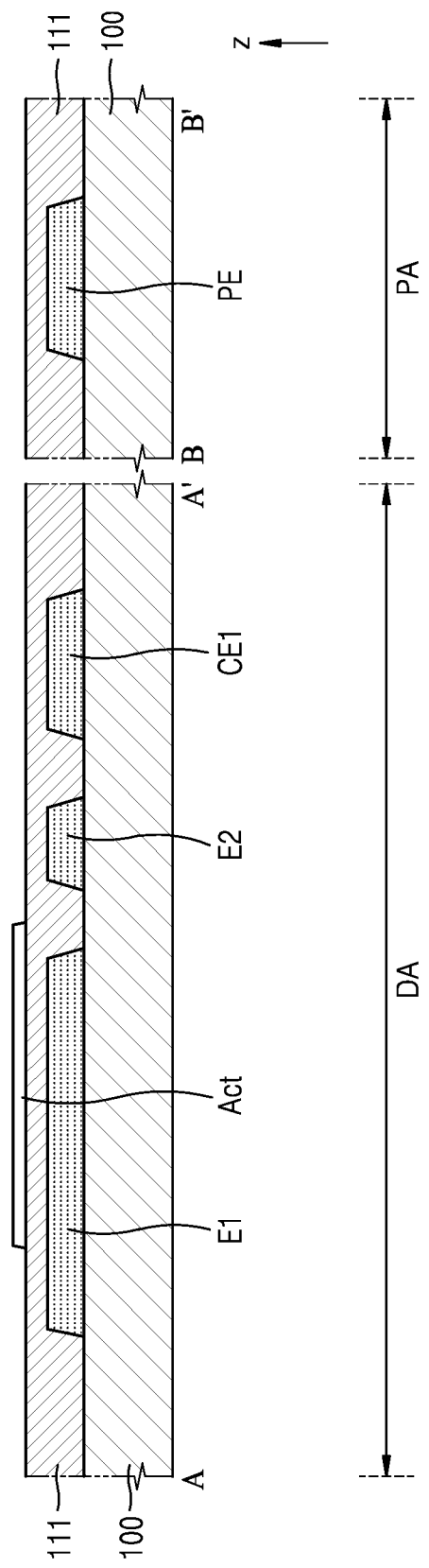
Figure 6C:
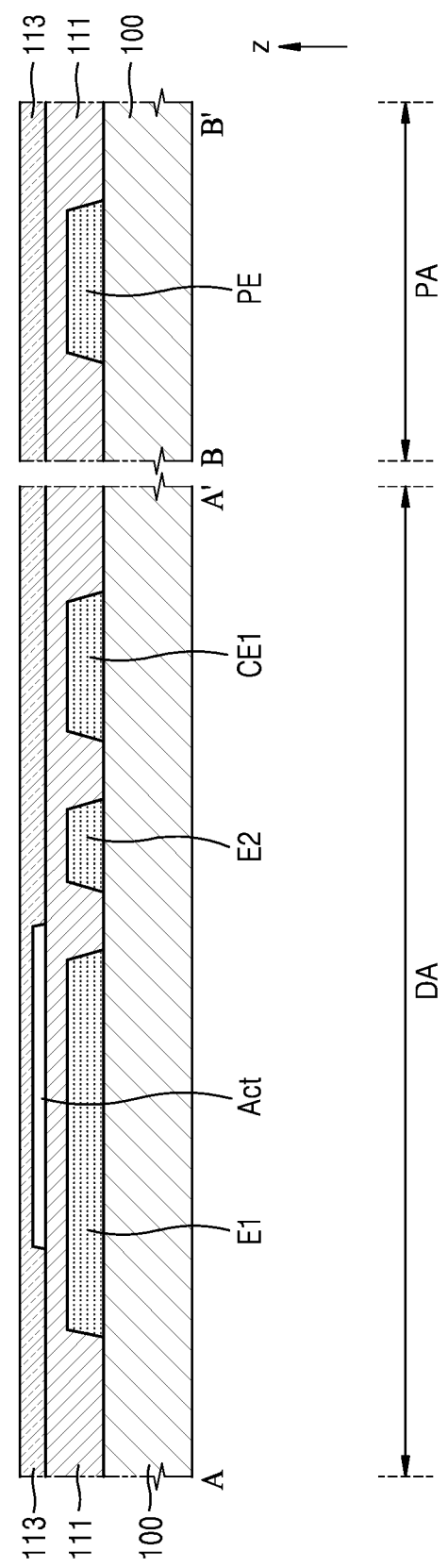
Figure 6D:
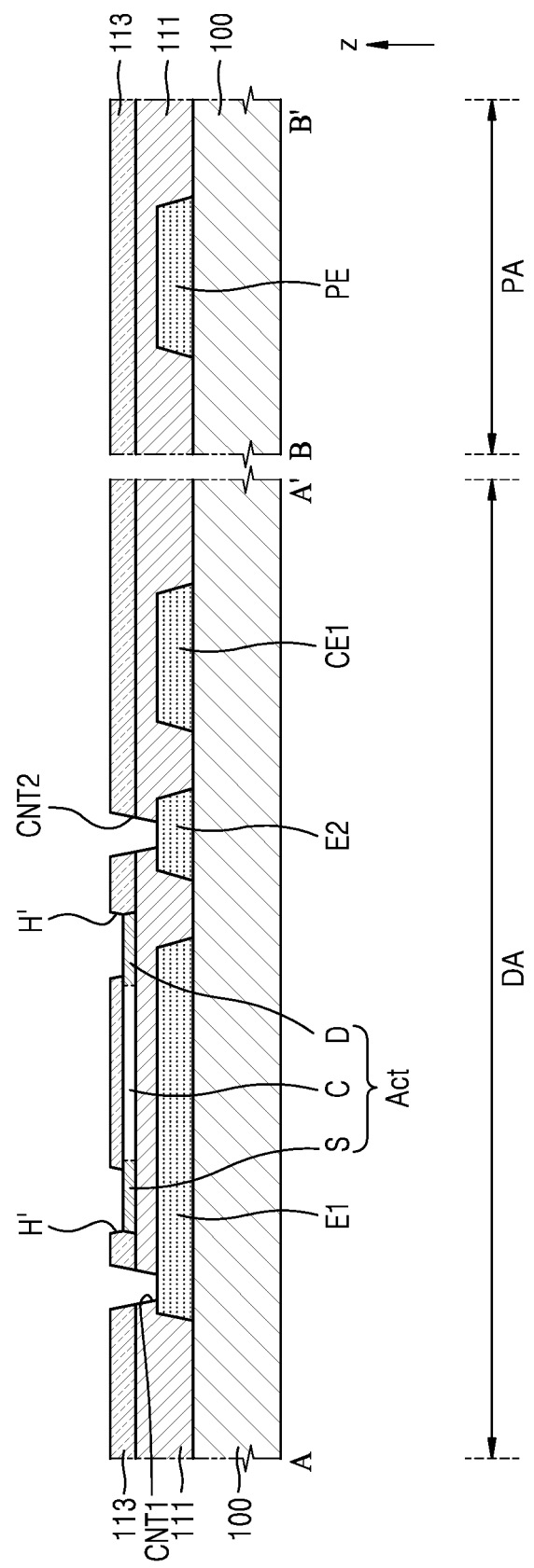
Figure 6E:
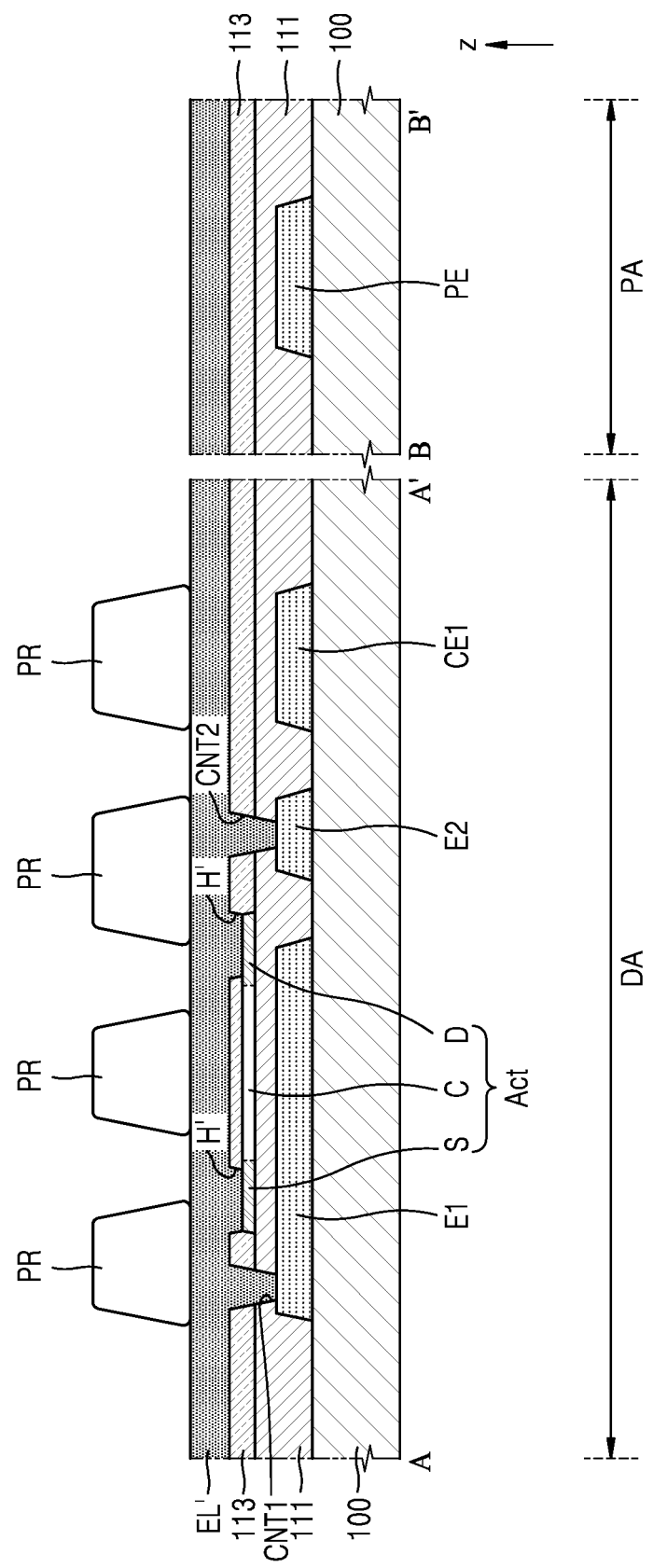
Figure 6F:
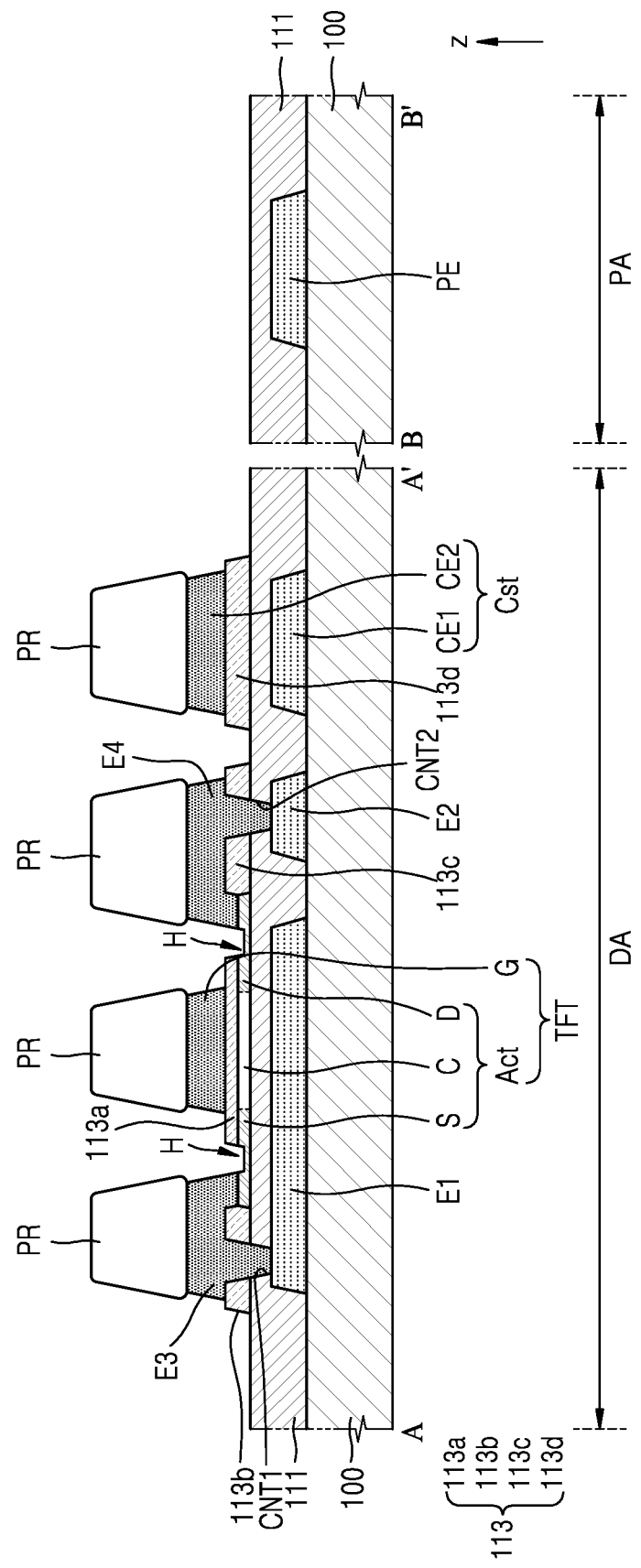
Figure 6G:
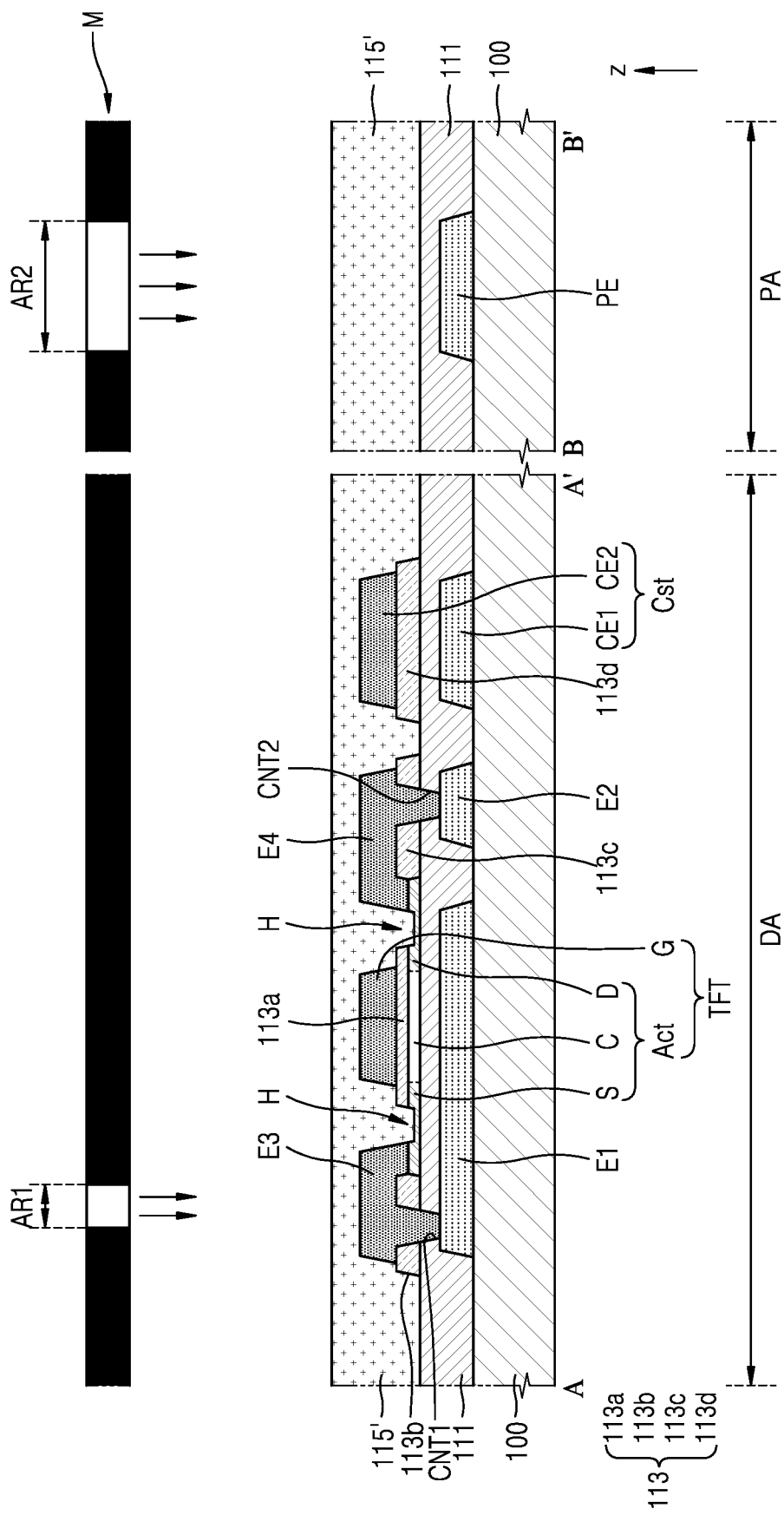
Figure 6H:
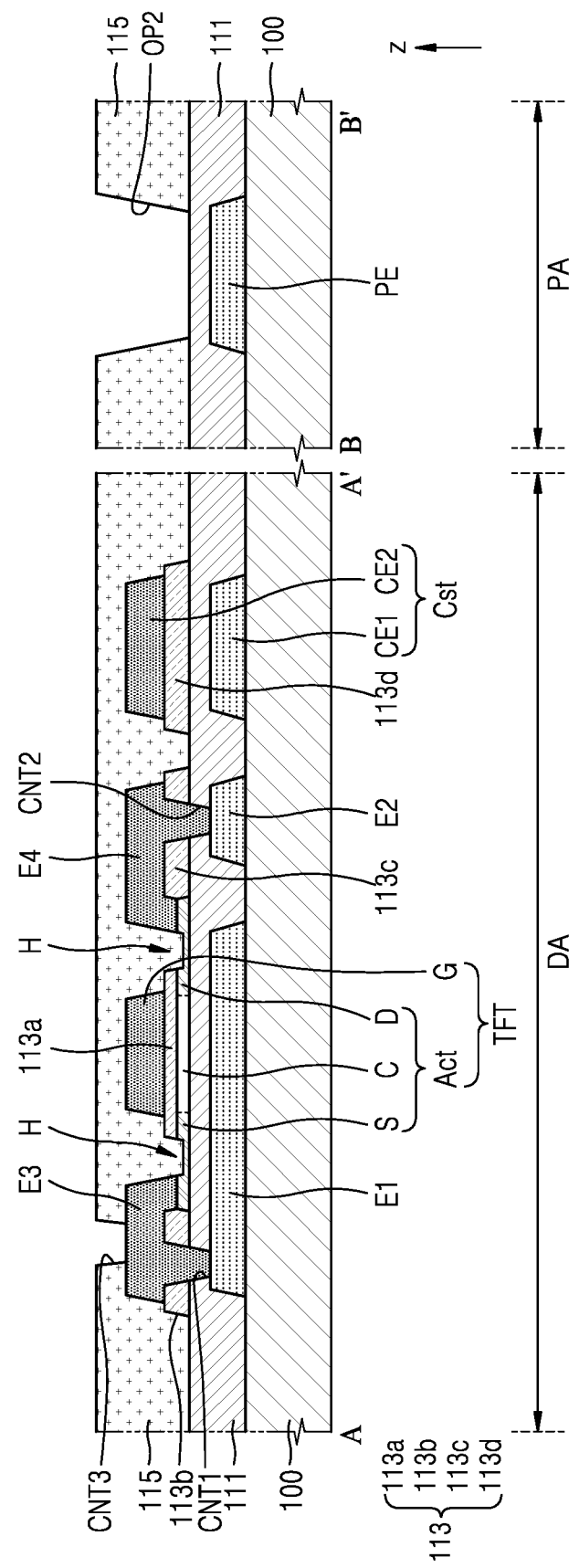

As shown in FIG. 6H which will be described later, because the first opening OP1 of the first insulating layer 111 is defined using the second insulating layer 115 as an etch mask, a substantially planar shape of the first opening OP1 may substantially correspond to that of the second opening OP2. The sidewall of the first insulating layer 111 exposed by the first opening OP1 and the sidewall of the second insulating layer 115 exposed by the second opening OP2 may also correspond to each other. The sidewall of the first insulating layer 111 exposed by the first opening OP1 and the sidewall of the second insulating layer 115 exposed by the second opening OP2 may be formed without steps. The sidewall of the first insulating layer 111 exposed by the first opening OP1 and the sidewall of the second insulating layer 115 exposed by the second opening OP2 may be formed without boundaries.

The third insulating layer 117 may be located or disposed on the second insulating layer 115. The third insulating layer 117 may be a single layer including an organic material or a multi-layer formed by stacking single layers each including an organic material, and provides a flat upper surface. The third insulating layer 117 may include a commercial polymer such as benzocyclobutene (BCB), polyimide, hexamethyldisiloxane (HMDSO), polymethyl methacrylate (PMMA) or polystyrene (PS), a polymer derivative having a phenol-based group, an acryl-based polymer, an imide-based polymer, an acryl ether-based polymer, an amide-based polymer, a fluorine-based polymer, a p-xylene-based polymer, a vinyl alcohol-based polymer, a blend thereof, or the like within the spirit and the scope of the disclosure.

The third insulating layer 117 may have a third opening OP3 exposing at least a portion of the upper surface of the pad electrode PE. The third opening OP3 of the third insulating layer 117 may correspond to or coincide with the first opening OP1 of the first insulating layer 111 and the second opening OP2 of the second insulating layer 115. The pad electrode PE may be electrically connected to a PCB or a driver IC chip through the first opening OP1, the second opening OP2, and the third opening OP3.

A light-emitting device 300 may be located or disposed on the third insulating layer 117. The light-emitting device 300 may include a pixel electrode 310, an intermediate layer 320 including an organic emission layer, and an opposite electrode 330. The light-emitting device 300 may be electrically connected to the thin-film transistor TFT through a third contact hole CNT3 formed in the second insulating layer 115 and a fourth contact hole CNT4 formed in the third insulating layer 117.

The pixel electrode 310 may be a (semi) light-transmissive electrode or a reflective electrode. According to an embodiment, the pixel electrode 310 may include a reflection layer formed of silver (Ag), magnesium (Mg), aluminum (Al), platinum (Pt), palladium (Pd), gold (Au), nickel (Ni), neodymium (Nd), iridium (Ir), chromium (Cr), or a compound thereof, and a transparent or semi-transparent electrode layer formed on the reflection layer. The transparent or semi-transparent electrode layer may include at least one selected from the group consisting of indium tin oxide (ITO), indium zinc oxide (IZO), zinc oxide (ZnO), indium oxide ($In_2O_3$), indium gallium oxide (IGO), and aluminum zinc oxide (AZO). According to an embodiment, as shown in FIG. 4, the pixel electrode 310 may have three layers. For example, the three layers of the pixel electrode 310 may be ITO/Ag/ITO.

A pixel defining layer 119 may be located or disposed on the third insulating layer 117. The pixel defining layer 119 may expose an edge of the pixel electrode 310 and may have an opening that exposes a portion of the pixel electrode 310. The pixel defining layer 119 may prevent an electric arc or the like from occurring on the edge of the pixel electrode 310 by increasing a distance between the edge of the pixel electrode 310 and the opposite electrode 330 that is on the pixel electrode 310.

The pixel defining layer 119 may be formed of at least one organic insulating material selected from the group consisting of polyimide, polyamide, acryl resin, benzocyclobutene, and a phenolic resin, by using a method such as spin coating.

The intermediate layer 320 may be located or disposed in an opening defined in the pixel defining layer 119 and may include an organic emission layer. The organic emission layer may include an organic material including a fluorescent or phosphorescent material that emits red, green, blue, or white light. The organic emission layer may include a low molecular organic material or a high molecular organic material, and one or more functional layers, such as a hole transport layer (HTL), a hole injection layer (HIL), an electron transport layer (ETL), and an electron injection layer (EIL), may be further located or disposed below and above the organic emission layer.

The opposite electrode 330 may be a light-transmissive electrode or a reflective electrode. According to an embodiment, the opposite electrode 330 may be a transparent or semi-transparent electrode, and may include a metal thin film having a small work function, including lithium (Li), calcium (Ca), lithium fluoride/calcium (LiF/Ca), lithium fluoride/aluminum (LiF/Al), aluminum (Al), silver (Ag), magnesium (Mg), or a compound thereof. A transparent conductive oxide (TCO) layer including, for example, ITO, IZO, ZnO, or $In_2O_3$, may be further located or disposed on the metal thin film. The opposite electrode 330 may extend over the display area DA, and may be located or disposed on the intermediate layer 320 and the pixel defining layer 119. The opposite electrode 330 may be formed as a single body that constitutes a plurality of light-emitting devices 300, and thus may correspond to a plurality of pixel electrodes 310.

Figure 20:
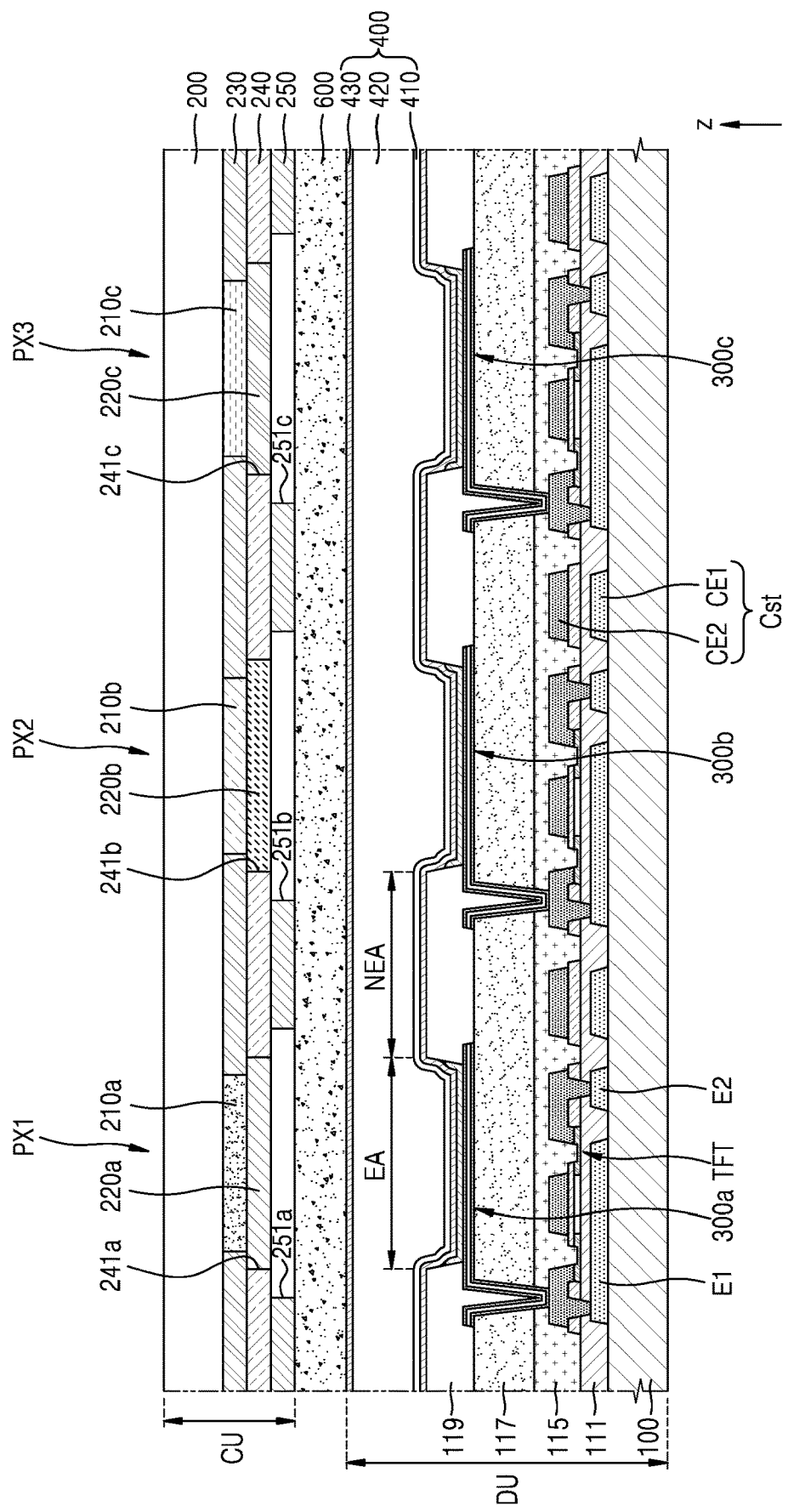
FIG. 20 is a schematic cross-sectional view of a display apparatus according to an embodiment.

Because these organic light-emitting devices may be easily damaged by external moisture, oxygen, or the like, as shown in FIG. 20 which will be described later, a thin-film encapsulation layer 400 may cover or overlap and protect the organic light-emitting devices. The thin-film encapsulation layer 400 may include a first inorganic encapsulation layer 410, an organic encapsulation layer 420, and a second inorganic encapsulation layer 430.

The display apparatus 1 according to an embodiment may include the pad electrode PE located or disposed in the peripheral area PA. The pad electrode PE may be a portion of the conductive layer CL located or disposed below the semiconductor layer Act.

As a comparative example, a pad electrode located or disposed in a peripheral area may include the same material or similar material as the material included in a gate electrode. The gate electrode may include a copper (Cu) layer, and the pad electrode may also include a Cu layer. The pad electrode may be partially exposed by an insulating layer, and an ITO layer may be formed on the CU layer in order to prevent the CU layer from being exposed by the pad electrode. Accordingly, the gate electrode and the pad electrode may have a multi-layered structure of Ti/Cu/ITO.

An etchant that etches the ITO layer may be used to pattern the gate electrode. The etchant may also etch IGZO that is similar to ITO. Accordingly, in case that the gate electrode is patterned, a semiconductor layer located or disposed below the gate electrode and including IGZO may also be partially etched. The gate electrode may not form a normal pattern, and a portion of the gate electrode may be eroded. As a result, a thin-film transistor including the gate electrode and the semiconductor layer may not perform a normal operation.

However, according to an embodiment, in case that the pad electrode PE is a portion of the conductive layer CL located or disposed below the semiconductor layer Act, because other metal layers are not located or disposed below the pad electrode PE, the other metal layers may be prevented from being eroded by an etchant in case that the pad electrode PE is formed by etching a preliminary conductive layer.

Because the pad electrode PE may be located or disposed closer to the substrate 100 than the other metal layers are, the pad electrode PE may be protected from an external foreign material. Because the pad electrode PE may be located or disposed on the lowest layer from among several metal layers, defects due to the external foreign material may be prevented.

Figure 5:
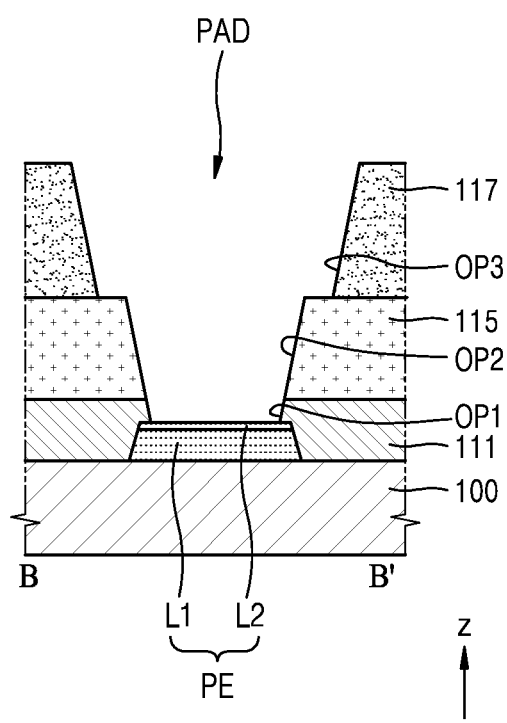
FIG. 5 is a schematic cross-sectional view of a pad unit of FIG. 1 taken along line B-B'.

FIG. 5 is a schematic cross-sectional view of a display apparatus according to an embodiment. In detail, FIG. 5 is a schematic cross-sectional view of the pad unit PAD of FIG. 1 taken along line B-B'. The same reference numerals in FIGS. 4 and 5 denote the same elements, and thus repeated descriptions thereof are omitted.

Referring to FIG. 5, the pad electrode PE may include a first layer L1 and a second layer L2.

The first layer L1 of the pad electrode PE may include at least one of aluminum (Al), platinum (Pt), palladium (Pd), silver (Ag), magnesium (Mg), gold (Au), nickel (Ni), neodymium (Nd), iridium (Ir), chromium (Cr), calcium (Ca), molybdenum (Mo), titanium (Ti), tungsten (W), and copper (Cu) and may have a single-layered or multi-layered structure. For example, the first layer L1 of the pad electrode PE may be a multi-layer of Ti/Al.

The second layer L2 of the pad electrode PE may be located or disposed on the first layer L1. At least a portion of the second layer L2 of the pad electrode PE may be exposed by the first opening OP1 of the first insulating layer 111. The second layer L2 of the pad electrode PE may protect the first layer L1.

The second layer L2 of the pad electrode PE may include at least one selected from the group consisting of indium tin oxide (ITO), indium zinc oxide (IZO), zinc oxide (ZnO), indium oxide ($In_2O_3$), indium gallium oxide (IGO), and aluminum zinc oxide (AZO).

Although the pad electrode PE may include two layers in FIG. 5, the pad electrode PE may include one layer, three layers, or more than three layers.

FIGS. 6A through 6K are schematic cross-sectional views schematically illustrating a method of manufacturing a display apparatus according to an embodiment, based on FIG. 4.

Referring to FIG. 6A, first, the first electrode E1, the second electrode E2, the lower electrode CE1 of the storage capacitor Cst, and the pad electrode PE may be formed on the substrate 100.

The first electrode E1, the second electrode E2, the lower electrode CE1 of the storage capacitor Cst, and the pad electrode PE may be formed by patterning a preliminary conductive layer (not shown). The preliminary conductive layer may include a conductive material including molybdenum (Mo), aluminum (Al), copper (Cu), and titanium (Ti), and may be formed as a multi-layer or single layer including the aforementioned materials.

According to an embodiment, each of the first electrode E1, the second electrode E2, the lower electrode CE1 of the storage capacitor Cst, and the pad electrode PE may have a multi-layered structure. For example, each of the first electrode E1, the second electrode E2, the lower electrode CE1 of the storage capacitor Cst, and the pad electrode PE may have a multi-layered structure of Ti/Cu/ITO. Two or more etching processes using different etchants may be conducted to prevent tip of the upper ITO. For example, an etching process using an etchant that etches all of Ti, Cu, and ITO may be conducted only once.

Referring to FIG. 6B, the first insulating layer 111 and the semiconductor layer Act are sequentially formed on the first electrode E1, the second electrode E2, the lower electrode CE1 of the storage capacitor Cst, and the pad electrode PE.

The first insulating layer 111 may include silicon oxide ($SiO_x$) or silicon nitride ($SiN_x$), and may be formed using a deposition method such as chemical vapor deposition (CVD) or sputtering.

The semiconductor layer Act may be located or disposed on the first insulating layer 111. The semiconductor layer Act may be formed by patterning a preliminary semiconductor layer (not shown). The preliminary semiconductor layer may include amorphous silicon, polysilicon, or an oxide semiconductor material. The preliminary semiconductor layer may be formed by CVD.

Referring to FIG. 6C, the gate insulating layer 113 may be formed on the semiconductor layer Act. The gate insulating layer 113 may include silicon oxide ($SiO_x$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), zinc oxide ($ZnO_2$), or the like, and may be formed using a deposition method such as CVD or sputtering, but embodiments are not limited thereto.

Referring to FIG. 6D, the first contact hole CNT1, the second contact hole CNT2, and a plurality of holes H' may be formed in the first insulating layer 111 and the gate insulating layer 113. Although the first contact hole CNT1 and the holes H' are spaced apart from one another in FIG. 6D, the first contact hole CNT1 and the holes H' may be integral with one another. In other words, portions of the gate insulating layer 113 disposed between the first contact hole CNT1 and the holes H' may be removed. The first contact hole CNT1 and the holes H' have been focused on and described, but this description is equally applicable to the second contact hole CNT2 and the holes H'.

At least a portion of the first electrode E1 may be exposed by the first contact hole CNT1, at least a portion of the second electrode E2 may be exposed by the second contact hole CNT2, and at least a portion of the semiconductor layer Act may be exposed by the plurality of holes H'. The portion of the semiconductor layer Act exposed by the plurality of holes H' may become conductive due to plasma treatment or the like within the spirit and the scope of the disclosure.

The first contact hole CNT1, the second contact hole CNT2, and the plurality of holes H' may correspond to portions not protected by a photoresist pattern, and may be formed by partially etching the first insulating layer 111 and the gate insulating layer 113.

Referring to FIGS. 6E and 6F, the gate electrode G, the third electrode E3, the fourth electrode E4, and the upper electrode CE2 of the storage capacitor Cst may be formed on the gate insulating layer 113.

The gate electrode G, the third electrode E3, the fourth electrode E4, and the upper electrode CE2 of the storage capacitor Cst may be formed by patterning a preliminary electrode layer EL'. The preliminary electrode layer EL' may have a single or multi-layer structure including at least one metal selected from among aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and copper (Cu), and may be formed by using a deposition method such as, but not limited to, CVD, plasma-enhanced CVD (PECVD), low-pressure CVD (LPCVD), physical vapor deposition (PVD), sputtering, or atomic layer deposition (ALD).

As shown in FIG. 6E, photoresist patterns PR may be formed to respectively correspond to the gate electrode G, the third electrode E3, the fourth electrode E4, and the upper electrode CE2 of the storage capacitor Cst which will be formed on the preliminary electrode layer EL'. As shown in FIG. 6F, the gate electrode G, the third electrode E3, the fourth electrode E4, and the upper electrode CE2 of the storage capacitor Cst may be formed by etching a portion of the preliminary electrode layer EL' having no photoresist patterns PR. At this time, a portion of the semiconductor layer Act may also be etched to form a plurality of holes H. According to an etchant, the first insulating layer 111 may be exposed or may not be exposed by the plurality of holes H. As another example, the semiconductor layer Act may not be etched.

Without removing the photoresist pattern PR, a portion of the gate insulating layer 113 may be etched by only changing the etchant. The first portion 113a, the second portion 113b, the third portion 113c, and the fourth portion 113d may be formed by etching a portion of the gate insulating layer 113.

Plasma treatment is performed in case that the portion of the gate insulating layer 113 is etched, and an exposed portion of the semiconductor layer Act is subjected to a conductivity increasing process during the plasma treatment. In case that the portion of the gate insulating layer 113 is etched out, the photoresist patterns PR may also be removed.

Because the gate electrode G and the first portion 113a of the gate insulating layer 113 are formed using the same photoresist pattern PR, the substantially planar shape of the gate electrode G may substantially correspond to that of the first portion 113a of the gate insulating layer 113. The gate electrode G and the first portion 113a of the gate insulating layer 113 have been focused on and described, but this description is equally applicable to a pair of the third electrode E3 and the second portion 113b of the gate insulating layer 113, a pair of the fourth electrode E4 and the third portion 113c of the gate insulating layer 113, and a pair of the upper electrode CE2 of the storage capacitor Cst and the fourth portion 113d of the gate insulating layer 113.

Referring to FIG. 6G, an insulating material layer 115' may be formed on the gate electrode G, the third electrode E3, the fourth electrode E4, and the upper electrode CE2 of the storage capacitor Cst. The insulating material layer 115' may include a positive photoresist, and may be formed by applying a positive photoresist solution (not shown) onto the gate electrode G, the third electrode E3, the fourth electrode E4, and the upper electrode CE2 of the storage capacitor Cst by using any of various methods such as spin coating, spraying, or dipping.

A mask M may be located or disposed on the insulating material layer 115'. A first area AR1 and a second area AR2 of the mask M may not be shielded so that the insulating material layer 115' is exposed to light, and the other areas may be shielded so that the insulating material layer 115' is not exposed to light.

The insulating material layer 115' may be exposed to light through the mask M according to areas, and the second insulating layer 115 may be formed by removing a portion of the insulating material layer 115' by using a developing process. The second insulating layer 115 may be a single layer including an organic or inorganic material or a multi-layer formed by stacking single layers each including an organic or inorganic material. After the second insulating layer 115 may be formed, chemical and mechanical polishing may be performed to provide a flat upper surface.

Although the insulating material layer 115' may include a positive photoresist in FIG. 6G, the insulating material layer 115' may include a negative photoresist. In contrast to in case that the insulating material layer 115' may include a positive photoresist, an exposed area of the insulating material layer 115' remains after a developing process.

Referring to FIG. 6H, the second insulating layer 115 may have the third contact hole CNT3 that exposes a portion of the third electrode E3 in correspondence with a portion exposed by the first area AR1 of the mask M. The second insulating layer 115 may have the second opening OP2 in correspondence with a portion exposed by the second area AR2 of the mask M.

Figure 6I:
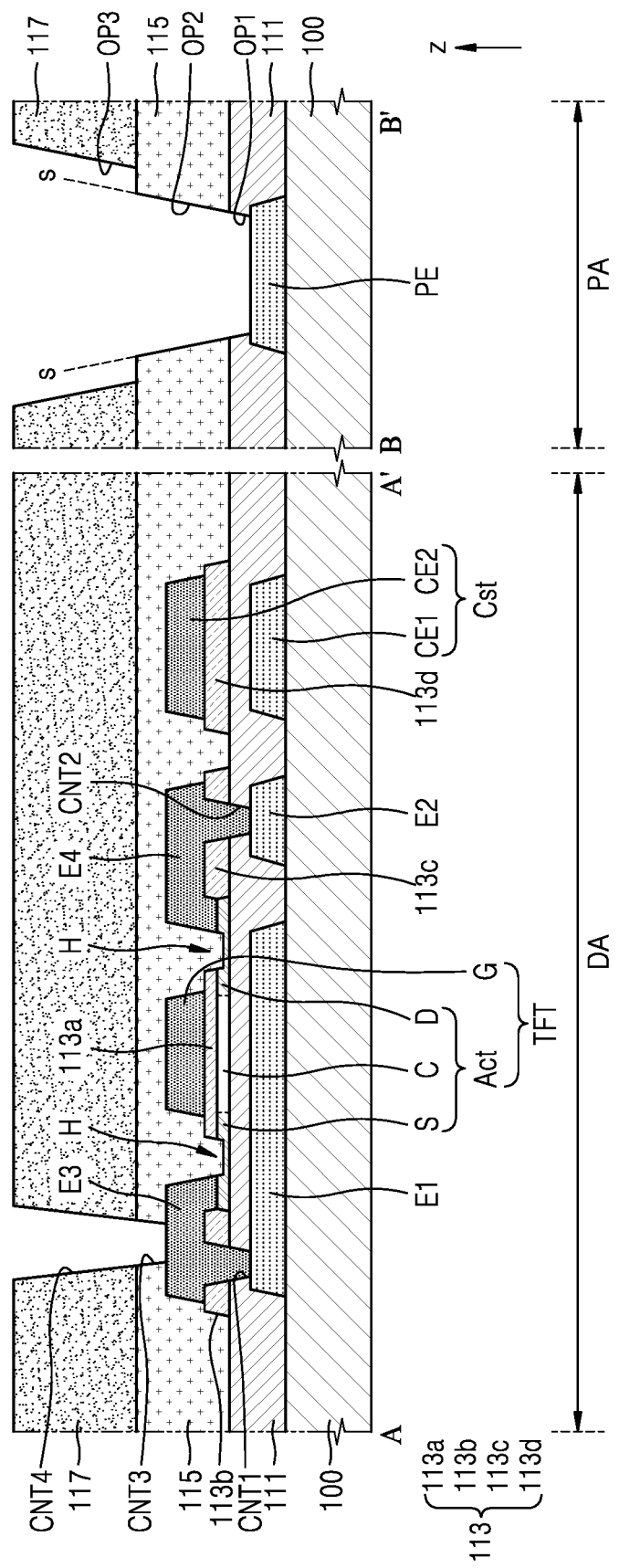

Referring to FIG. 6I, the first opening OP1 exposing at least a portion of the upper surface of the pad electrode PE may be formed in the first insulating layer 111 by using the second insulating layer 115 as an etch mask. Because the first opening OP1 of the first insulating layer 111 is formed using the second insulating layer 115 as an etch mask, the substantially planar shape of the first opening OP1 may substantially correspond to that of the second opening OP2. The sidewall of the first insulating layer 111 may correspond to that of the second insulating layer 115. The lateral surface of the first insulating layer 111 exposed by the first opening OP1 and the lateral surface of the second insulating layer 115 exposed by the second opening OP2 may be located or disposed on the same etched surface s.

The third insulating layer 117 may be formed on the second insulating layer 115. The third insulating layer 117 may be a single layer including an organic material or a multi-layer formed by stacking single layers each including an organic material. The third insulating layer 117 may have the fourth contact hole CNT4 corresponding to the third contact hole CNT3, and the third opening OP3 corresponding to the second opening OP2. The third insulating layer 117 may be formed using the same method as that used to form the second insulating layer 115.

As a comparative example, in case that a buffer layer and an inorganic insulating layer for exposing a portion of a pad electrode are partially etched, the etching may be performed using, as a mask, a planarization layer on which a pixel electrode may be located or disposed. While a portion of each of the buffer layer and the inorganic insulating layer is being etched, a thickness of the planarization layer may gradually decrease. In case that a foreign material exists on the planarization layer, a thickness of the planarization layer on which the foreign material exists may be maintained, and a protrusion may be formed. The pixel electrode is curved in accordance with the protrusion formed on the planarization layer, and, consequently, a light-emitting device including the pixel electrode may not perform a normal operation. Because the light-emitting device does not perform a normal operation, black spots may be generated during an operation of a display apparatus.

However, as in a manufacturing method of a display apparatus according to an embodiment, in case that the first opening OP1 of the first insulating layer 111 is formed using, as a mask, the second insulating layer 115 not in contact with the pixel electrode 310, no protrusions may be formed on the or a surface of the third insulating layer 117 which may be in contact with the pixel electrode 310. Thus, the pixel electrode 310 may be located or disposed on the third insulating layer 117 providing a flat surface, and occurrence of a defect in the light-emitting device 300 including the pixel electrode 310 may be handled.

Figure 6J:
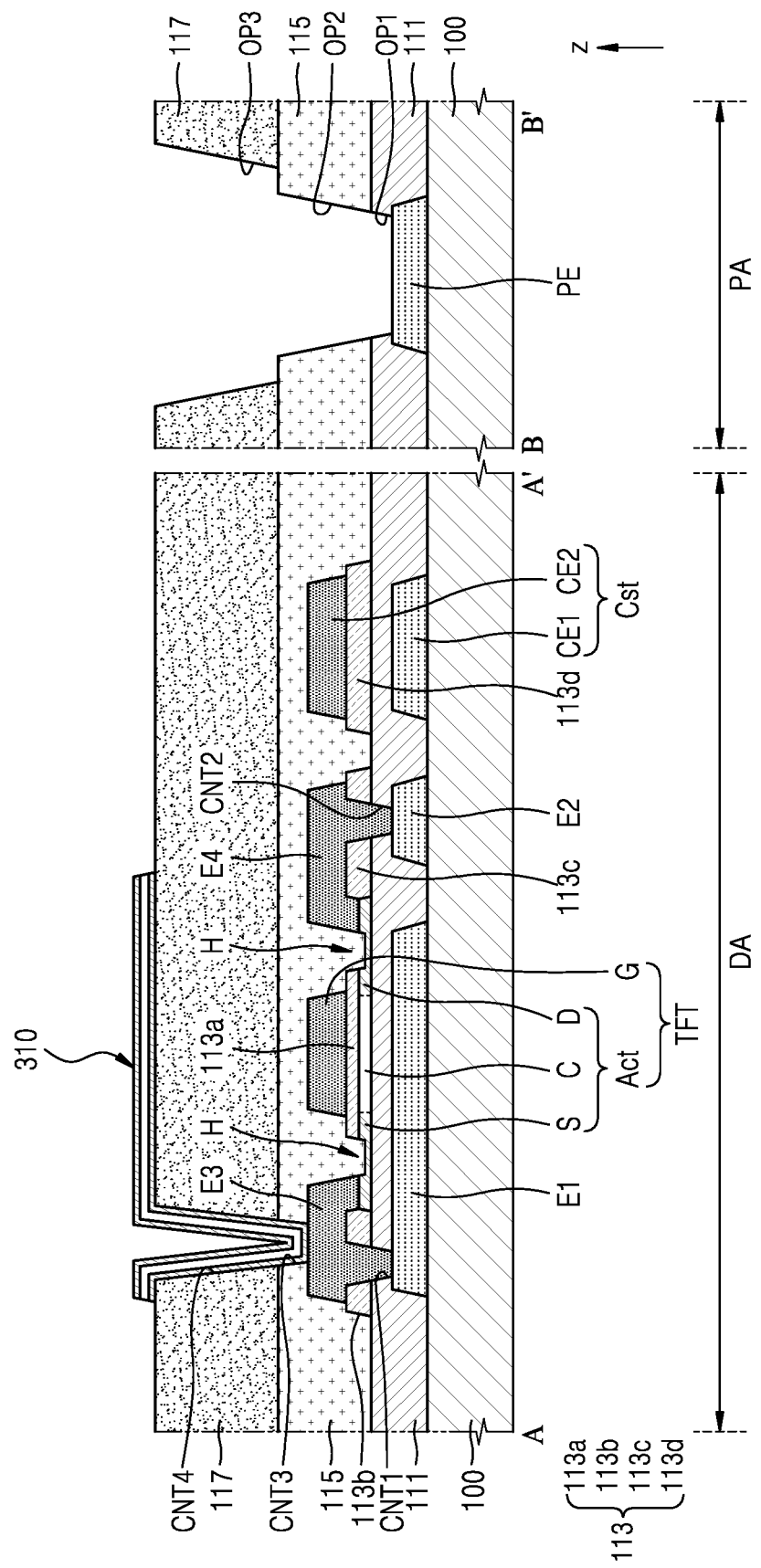

Referring to FIG. 6J, the pixel electrode 310 may be formed over the third insulating layer 117. The pixel electrode 310 may be formed by depositing a pixel electrode material layer on the entire upper surface of the third insulating layer 117 and performing a mask process and an etching process.

Figure 6K:
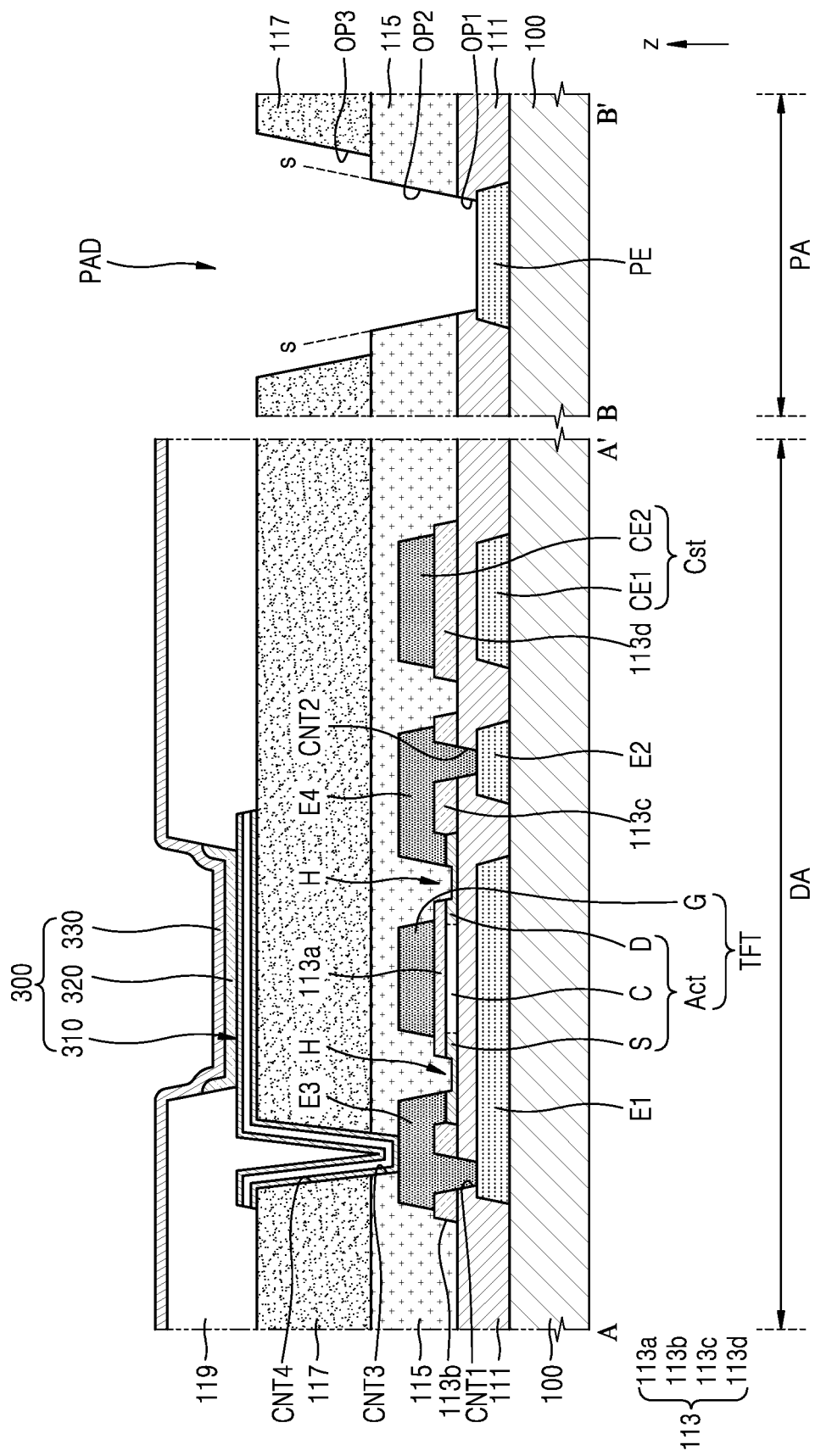

Referring to FIG. 6K, the pixel defining layer 119 covering or overlapping an edge of the pixel electrode 310 and including an opening that exposes a center portion of the pixel electrode 310 may be formed on the entire upper surface of the third insulating layer 117. The pixel defining layer 119 may be formed of at least one organic insulating material selected from the group consisting of polyimide, polyamide, acryl resin, benzocyclobutene, and a phenolic resin, by using a method such as spin coating.

The intermediate layer 320 may be formed on the pixel electrode 310, namely, within the opening of the pixel defining layer 119. The intermediate layer 320 may include a low-molecular weight or high-molecular weight material. The intermediate layer 320 may be formed via vacuum deposition, screen printing, inkjet printing, laser induced thermal imaging (LITI), or the like within the spirit and the scope of the disclosure.

The intermediate layer 320 of the light-emitting device 300 may include an organic emission layer. The organic emission layer may include an organic material including a fluorescent or phosphorescent material that emits red, green, blue, or white light. The organic emission layer may include a low molecular organic material or a high molecular organic material, and one or more functional layers, such as a hole transport layer (HTL), a hole injection layer (HIL), an electron transport layer (ETL), and an electron injection layer (EIL), may be further located or disposed below and above the organic emission layer. The intermediate layer 320 may be located or disposed to correspond to each of the plurality of pixel electrodes 310. However, embodiments are not limited thereto. Various modifications may be made to the intermediate layer 320. For example, the intermediate layer 320 may include an integrated layer over the plurality of pixel electrodes 310.

The opposite electrode 330 may be formed to correspond to a plurality of light-emitting devices 300. The opposite electrode 330 may be formed to cover or overlap the display area DA of the substrate 100 through an open mask. The opposite electrode 330 may be formed by using a deposition method such as CVD, PECVD, LPCVD, PVD, sputtering, or ALD.

Figure 7:
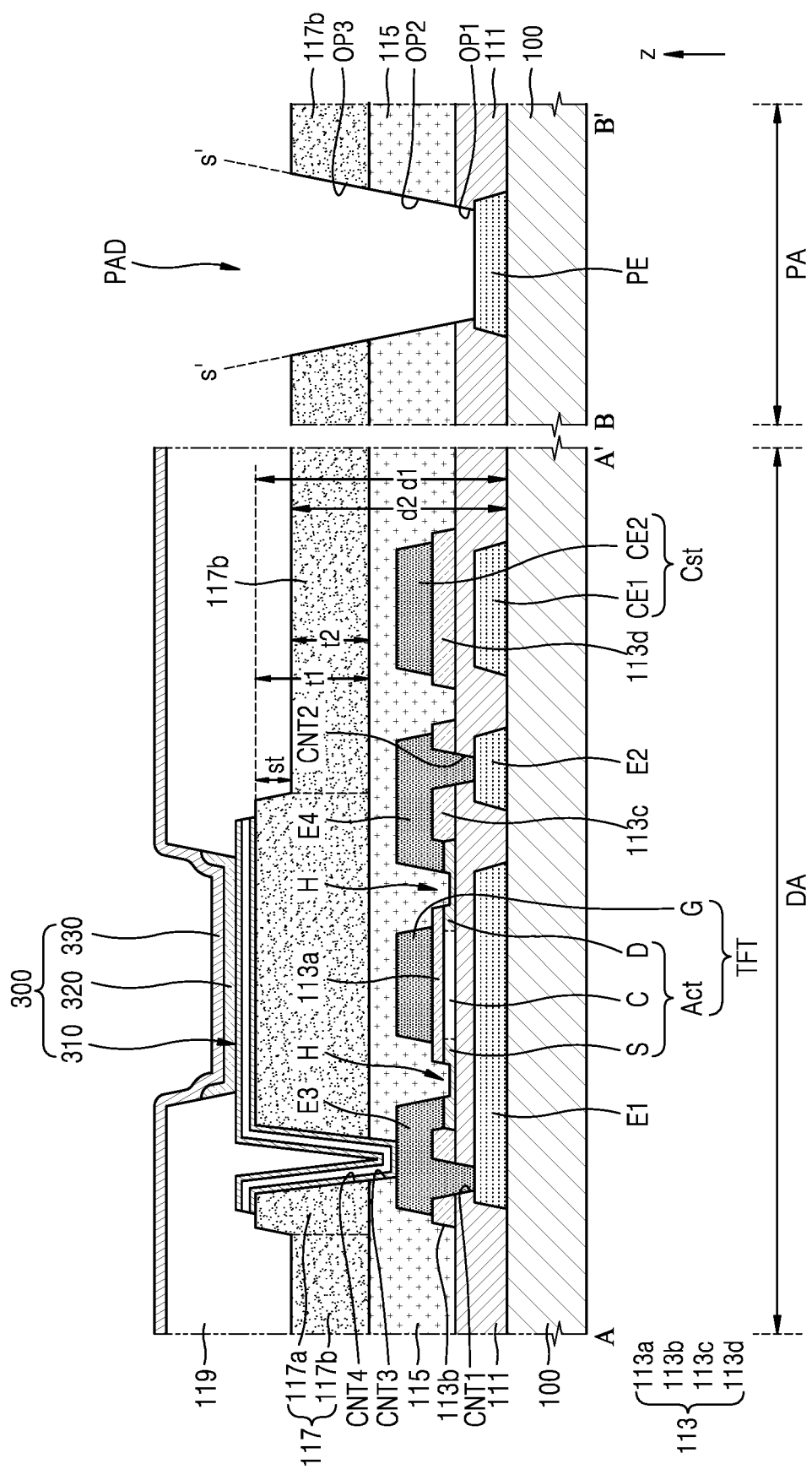
FIG. 7 is a schematic cross-sectional view of a display area and a pad unit of FIG. 1 taken along lines A-A' and B-B', respectively.

FIG. 7 is a schematic cross-sectional view of a display apparatus according to an embodiment. In detail, FIG. 7 is a schematic cross-sectional view of the display area DA and the pad unit PAD of FIG. 1 taken along lines A-A' and B-B', respectively. The same reference numerals in FIGS. 4 and 7 denote the same elements, and thus repeated descriptions thereof are omitted. FIG. 7 corresponds to a partial modification of FIG. 4, and thus will be described by focusing on differences from FIG. 4.

Referring to FIG. 7, the third insulating layer 117 may include a first portion 117a, and a second portion 117b extending from the first portion 117a.

According to an embodiment, the first portion 117*a* may have a first thickness t1, and the second portion 117*b* may have a second thickness t2. The first thickness t1 of the first portion 117*a* may be different from the second thickness t2 of the second portion 117*b*. For example, as shown in FIG. 7, the first thickness t1 of the first portion 117*a* may be greater than the second thickness t2 of the second portion 117*b*.

According to an embodiment, an upper surface of the third insulating layer 117 may have a step st between the first portion 117*a* and the second portion 117*b*. A vertical distance d1 from the upper surface of the substrate 100 to an upper surface of the first portion 117*a* may be different from a vertical distance d2 from the upper surface of the substrate 100 to an upper surface of the second portion 117*b*. For example, as shown in FIG. 7, the vertical distance d1 from the upper surface of the substrate 100 to the upper surface of the first portion 117*a* may be greater than the vertical distance d2 from the upper surface of the substrate 100 to the upper surface of the second portion 117*b*.

Figure 8A:
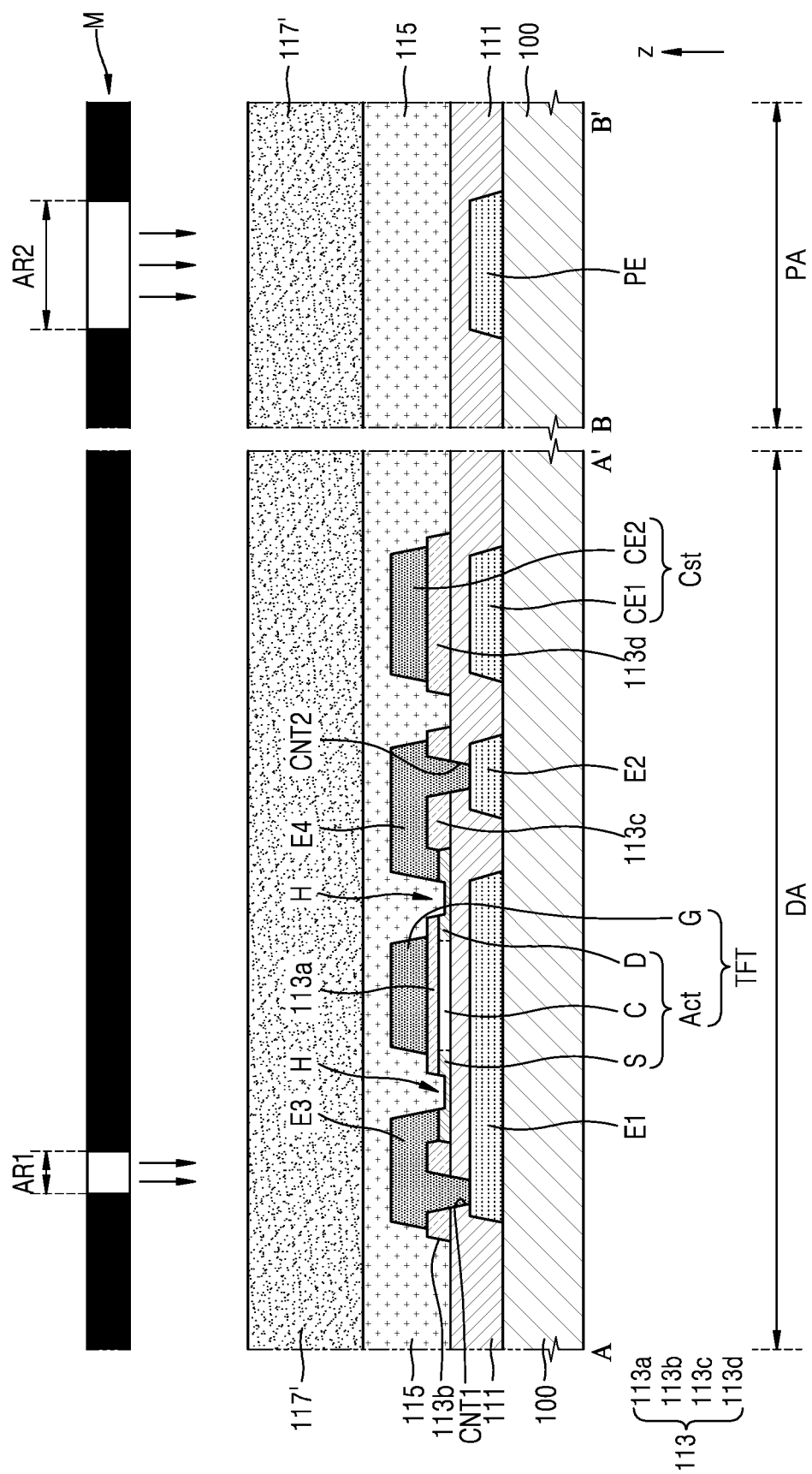
FIGS. 8A through 8F are schematic cross-sectional views schematically illustrating, based on FIG. 7, a method of manufacturing a display apparatus according to an embodiment.
Figure 8B:
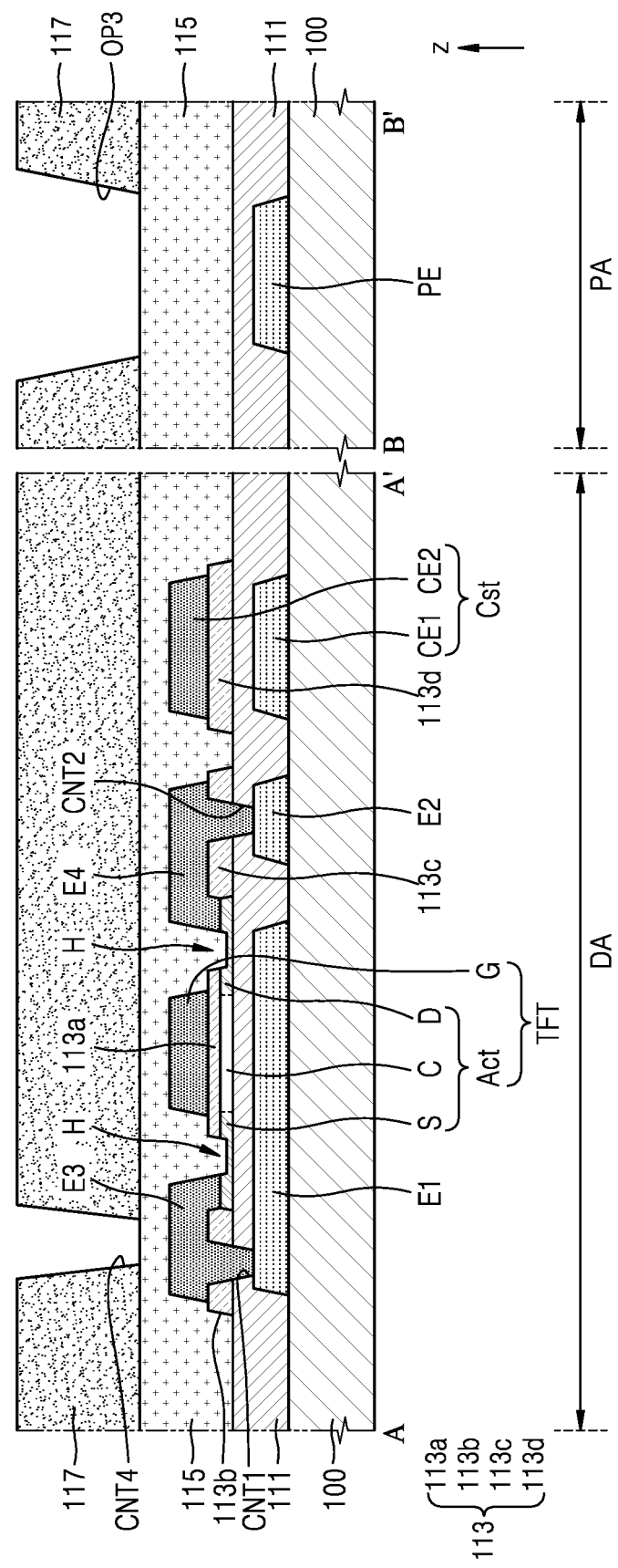

According to an embodiment, the pixel electrode 310 may be located or disposed on the first portion 117*a* of the third insulating layer 117. The pixel electrode 310 may be surrounded by the step st between the first portion 117*a* and the second portion 117*b*. Because the pixel electrode 310 is formed using a photoresist pattern PR as an etch mask as shown in FIG. 8D which will be described later, and the first portion 117*a* of the third insulating layer 117 is also formed using the photoresist pattern PR as an etch mask as shown in FIG. 8E, both a substantially planar shape of the pixel electrode 310 and a substantially planar shape of the first portion 117*a* may substantially correspond to a substantially planar shape of the photoresist pattern PR. An edge of the pixel electrode 310 may correspond to a sidewall of the first portion 117*a*.

According to an embodiment, the third opening OP3 exposing at least a portion of the pad electrode PE may be located or disposed in the second portion 117*b* of the third insulating layer 117. The first insulating layer 111 and the second insulating layer 115 may have the same etched surface s', and the second insulating layer 115 and the third insulating layer 117 may have the same etched surface s'. The lateral surface of the first insulating layer 111 exposed by the first opening OP1 and the lateral surface of the second insulating layer 115 exposed by the second opening OP2 may be located or disposed on the same etched surface s'. The lateral surface of the second insulating layer 115 exposed by the second opening OP2 and the lateral surface of the third insulating layer 117 exposed by the third opening OP3 may be located or disposed on the same etched surface s'.

Figure 8C:
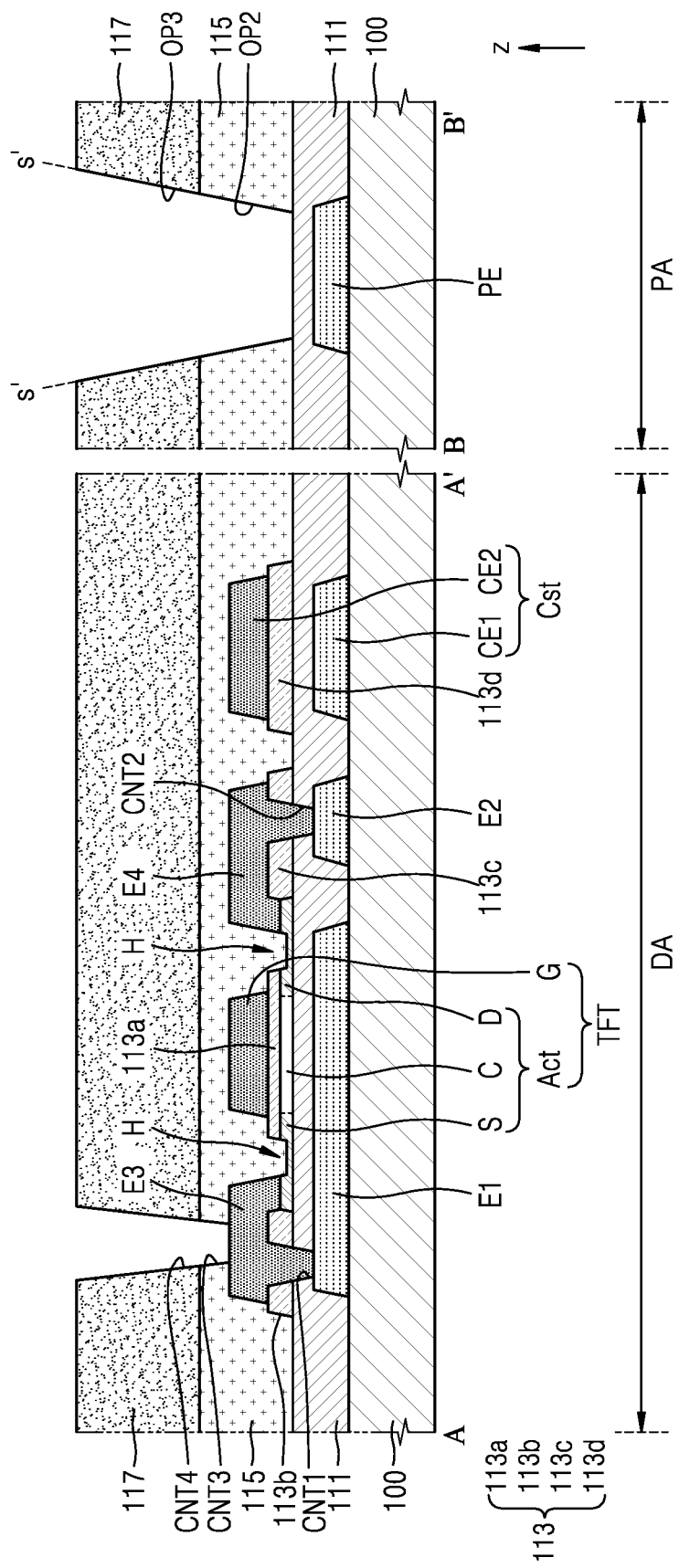
Figure 8D:
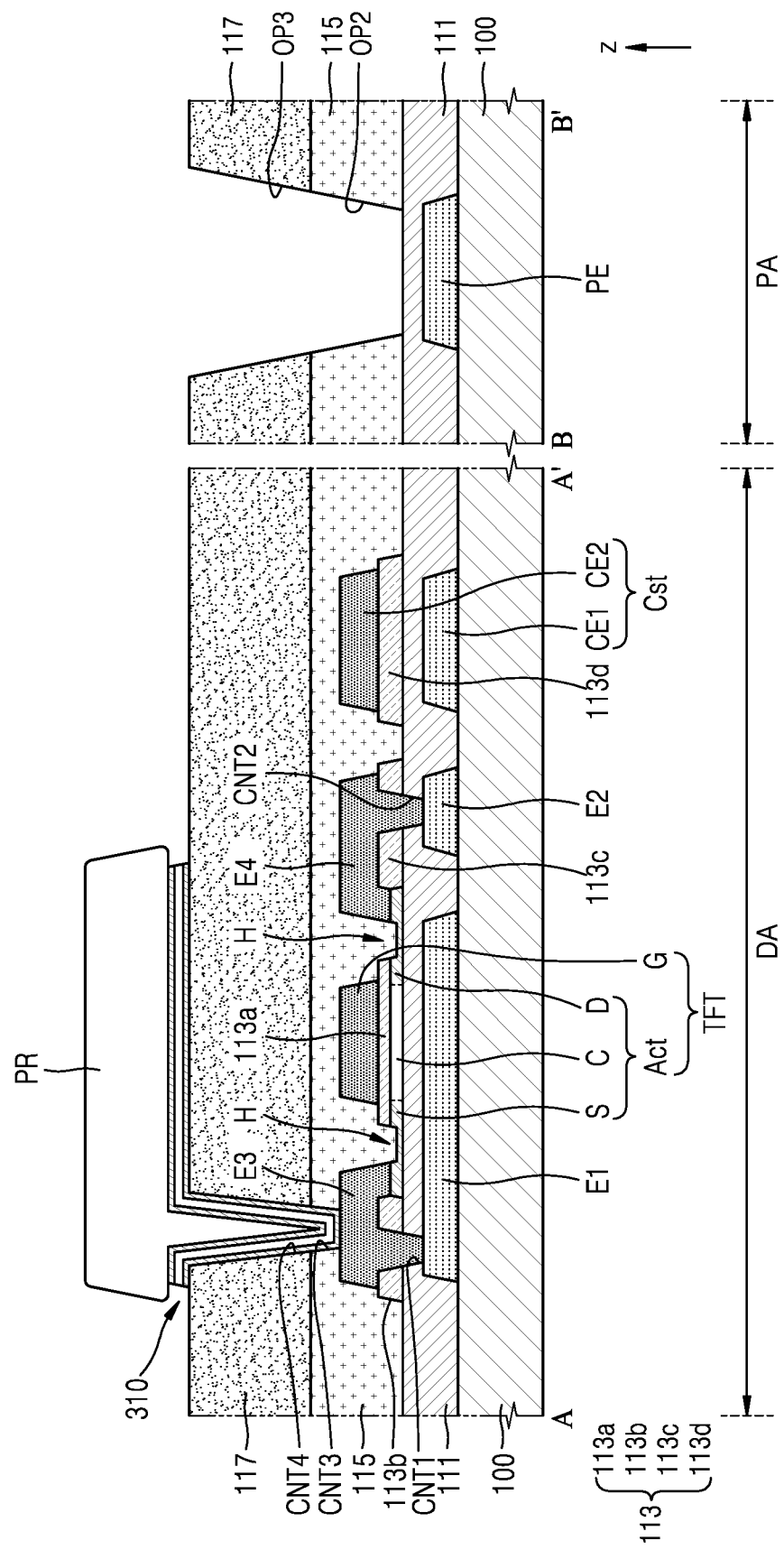
Figure 8E:
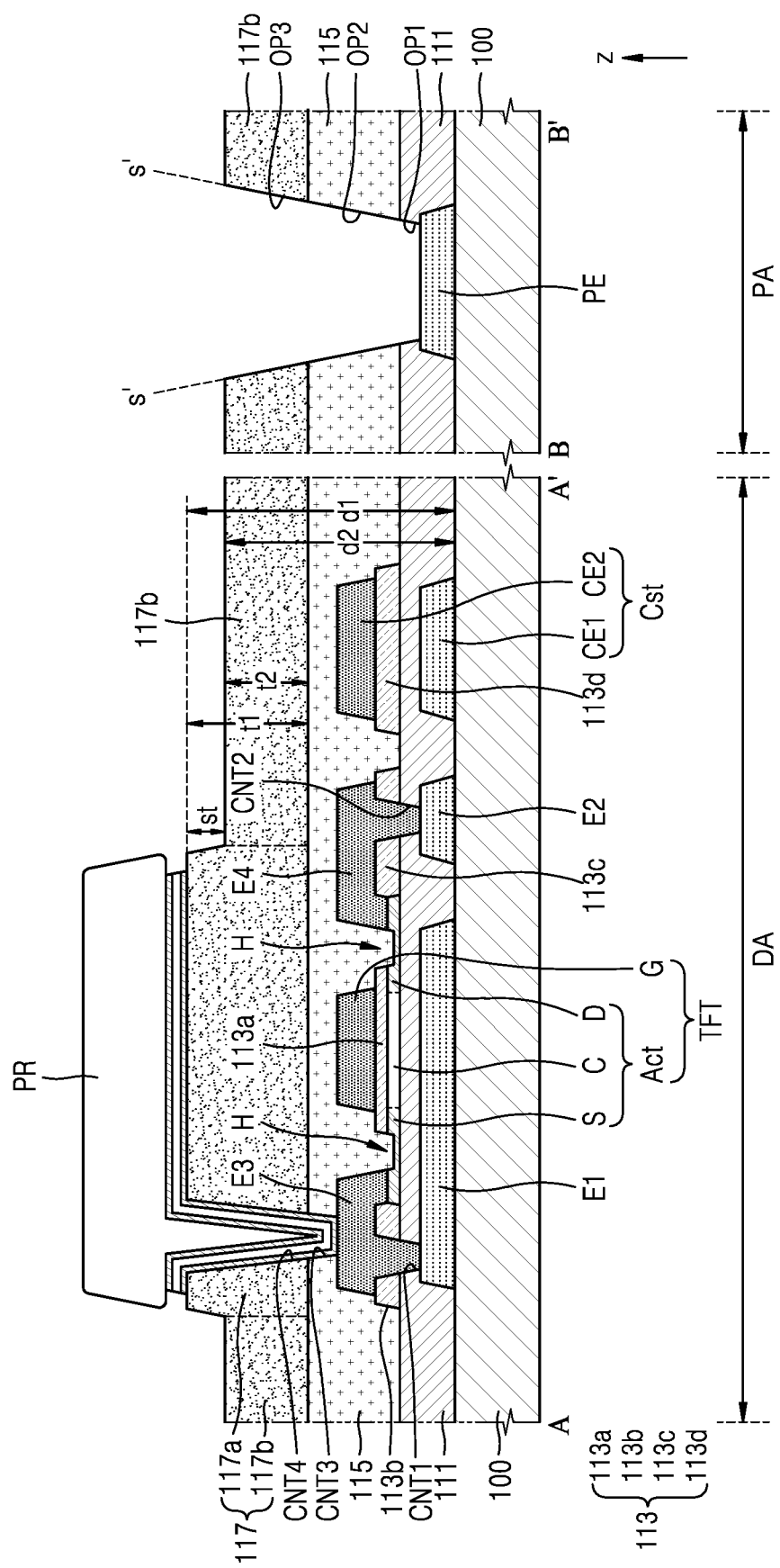

As shown in FIG. 8C which will be described later, because the second opening OP2 of the second insulating layer 115 is defined using the second insulating layer 117 as an etch mask, the substantially planar shape of the second opening OP2 may substantially correspond to that of the third opening OP3. The sidewall of the second insulating layer 115 exposed by the second opening OP2 and the sidewall of the third insulating layer 117 exposed by the third opening OP3 may also correspond to each other. Although the second insulating layer 115 has been focused on and described above, this description is equally applicable to the first insulating layer 111.

As shown in FIG. 8E which will be described later, because the first opening OP1 of the first insulating layer 111 is defined using the second and third insulating layers 115 and 117 as an etch mask, the substantially planar shape of the first opening OP1 may substantially correspond to that of the second and third openings OP2 and OP3. The sidewall of the first insulating layer 111 exposed by the first opening OP1 and the sidewall of the second insulating layer 115 exposed by the second opening OP2 may also correspond to each other. The sidewall of the first insulating layer 111 exposed by the first opening OP1 and the sidewall of the third insulating layer 117 exposed by the third opening OP3 may also correspond to each other.

As the third opening OP3 may be located or disposed in the third insulating layer 117, a total thickness of an insulation layer existing in the pad unit PAD may decrease. As the total thickness of the insulation layer existing in the pad unit PAD decreases, it may be relatively easier to make the pad electrode PE and the PCB or the driver IC chip electrically contact each other.

FIGS. 8A through 8F are schematic cross-sectional views schematically illustrating a method of manufacturing a display apparatus according to an embodiment, based on FIG. 7. The same reference numerals in FIGS. 6A through 6K and FIGS. 8A through 8F denote the same elements, and thus repeated descriptions thereof are omitted. FIGS. 8A through 8F correspond to a partial modification of FIGS. 6A through 6K, and thus will be described by focusing on differences from FIGS. 6A through 6K.

Referring to FIG. 8A, an insulating material layer 117' may be located or disposed on the second insulating layer 115. Processes before the insulating material layer 117' may be located or disposed on the second insulating layer 115 may be the same as FIGS. 6A through 6H.

The insulating material layer 117' may include a positive photoresist, and may be formed by applying a positive photoresist solution (not shown) onto the second insulating layer 115 by using any of various methods such as spin coating, spraying, or dipping. Before the insulating material layer 117' is applied to the upper surface of the second insulating layer 115, a process of polishing the upper surface of the second insulating layer 115 to which the insulating material layer 117' is to be applied may be additionally performed.

A mask M may be located or disposed on the insulating material layer 117'. A first area AR1 and a second area AR2 of the mask M may not be shielded so that the insulating material layer 117' is exposed to light, and the other areas may be shielded so that the insulating material layer 117' is not exposed to light.

The insulating material layer 117' may be exposed to light through the mask M according to areas, and the third insulating layer 117 may be formed by removing a portion of the insulating material layer 117' by using a developing process. The third insulating layer 117 may be a single layer including an organic or inorganic material or a multi-layer formed by stacking single layers each including an organic or inorganic material. A degree of adhesion of the third insulating layer 117 to the second insulating layer 115 may be increased through a curing and drying process. The curing and drying process may include a heat treatment process. After the third insulating layer 117 may be formed, chemical and mechanical polishing may be performed to provide a flat upper surface.

Although the insulating material layer 117' may include a positive photoresist in FIG. 8A, the insulating material layer 117' may include a negative photoresist. In contrast to in case that the insulating material layer 117' may include a positive photoresist, an exposed area of the insulating material layer 117' remains after a developing process.

Referring to FIG. 8B, the third insulating layer 117 may have the fourth contact hole CNT4 in correspondence with a portion exposed by the first area AR1 of the mask M. The third insulating layer 117 may have the third opening OP3 in correspondence with a portion exposed by the second area AR2 of the mask M.

Referring to FIG. 8C, the third contact hole CNT3 exposing a portion of the third electrode E3 and the second opening OP2 corresponding to the third opening OP3 may be formed using the third insulating layer 117 as an etch mask. Because the second opening OP2 of the second insulating layer 115 is formed using the third insulating layer 117 as an etch mask, the substantially planar shape of the second opening OP2 may substantially correspond to that of the third opening OP3. The sidewall of the second insulating layer 115 may correspond to that of the third insulating layer 117. The lateral surface of the second insulating layer 115 exposed by the second opening OP2 and the lateral surface of the third insulating layer 117 exposed by the third opening OP3 may be located or disposed on the same etched surface s'.

In FIG. 8C, only the second insulating layer 115 is etched. However, according to the time of an etch process, only a portion of the second insulating layer 115 may be etched or a portion of the first insulating layer 111 may also be etched.

Referring to FIG. 8D, the pixel electrode 310 may be formed on the third insulating layer 117. The pixel electrode 310 may be formed by depositing a pixel electrode material layer on the entire upper surface of the third insulating layer 117 and performing a mask process and an etching process.

A photoresist pattern PR may be formed to substantially correspond to the pixel electrode 310 to be formed on the pixel electrode material layer. The pixel electrode 310 may be formed by etching a portion of the pixel electrode material layer where the photoresist pattern PR does not exist.

Referring to FIG. 8E, the photoresist pattern PR is not removed, and the first opening OP1 corresponding to the second opening OP2 and the third opening OP3 may be formed by varying an etchant. The first opening OP1 may be formed by etching a portion of the first insulating layer 111.

The first insulating layer 111 and the second insulating layer 115 may have the same etched surface s', and the second insulating layer 115 and the third insulating layer 117 may have the same etched surface s'. The lateral surface of the first insulating layer 111 exposed by the first opening OP1 and the lateral surface of the second insulating layer 115 exposed by the second opening OP2 may be located or disposed on the same etched surface s'. The lateral surface of the second insulating layer 115 exposed by the second opening OP2 and the lateral surface of the third insulating layer 117 exposed by the third opening OP3 may be located or disposed on the same etched surface s'.

Because the first opening OP1 of the first insulating layer 111 is formed using the third insulating layer 117 as an etch mask, the substantially planar shape of the first opening OP1 may substantially correspond to that of the third opening OP3. Because the second opening OP2 of the second insulating layer 115 is formed using the third insulating layer 117 as an etch mask, the substantially planar shape of the second opening OP2 may substantially correspond to that of the third opening OP3.

In case that a portion of the first insulating layer 111 is etched, a portion of the photoresist pattern PR and a portion of the third insulating layer 117 may also be etched. Consequently, the third insulating layer 117 may include the first portion 117a having the first thickness t1, and the second portion 117b having the second thickness t2 smaller than the first thickness t1. The upper surface of the third insulating layer 117 may have the step st between the first portion 117a and the second portion 117b. The vertical distance d1 from the upper surface of the substrate 100 to the upper surface of the first portion 117a may be different from the vertical distance d2 from the upper surface of the substrate 100 to the upper surface of the second portion 117b. For example, as shown in FIG. 8E, the vertical distance d1 from the upper surface of the substrate 100 to the upper surface of the first portion 117a may be greater than the vertical distance d2 from the upper surface of the substrate 100 to the upper surface of the second portion 117b.

Because the pixel electrode 310 is formed using the photoresist pattern PR as an etch mask and the first portion 117a of the third insulating layer 117 is also formed using the photoresist pattern PR as an etch mask, both the substantially planar shape of the pixel electrode 310 and the substantially planar shape of the first portion 117a may substantially correspond to the substantially planar shape of the photoresist pattern PR. The edge of the pixel electrode 310 may correspond to the sidewall of the first portion 117a.

As a comparative example, in case that a buffer layer and an inorganic insulating layer for exposing a portion of a pad electrode are partially etched, the etching may be performed using, as a mask, a planarization layer on which a pixel electrode may be located or disposed. In case that a foreign material exists on a surface of the planarization layer, a step may be formed between a portion on which the foreign material exists and a portion on which the foreign material does not exist during the etching process. In case that a light-emitting device may be located or disposed on the surface of the planarization layer having the step, a short may occur between the pixel electrode and an opposite electrode, thereby resulting in dark spots on a display panel. Also, because the surface of the planarization layer is not protected during the etching process, a surface roughness of the planarization layer may be increased. In case that the pixel electrode may be located or disposed on the surface of the planarization layer having the increased surface roughness, a reflectance of external light may be reduced, and luminous efficiency may be reduced.

However, according to an embodiment, after the pixel electrode 310 is formed, the photoresist pattern PR may not be removed, and an etching process for exposing a portion of the pad electrode PE may be performed. A surface of the third insulating layer 117 on which the pixel electrode 310 may be located or disposed may be protected by the photoresist pattern PR. Accordingly, a step due to a foreign material is not formed on the surface of the third insulating layer 117, and a surface roughness of the third insulating layer 117 is not increased. In other words, dark spots are not formed on a display panel, and a reflectance of external light is not reduced and thus luminous efficiency is not reduced.

Figure 8F:
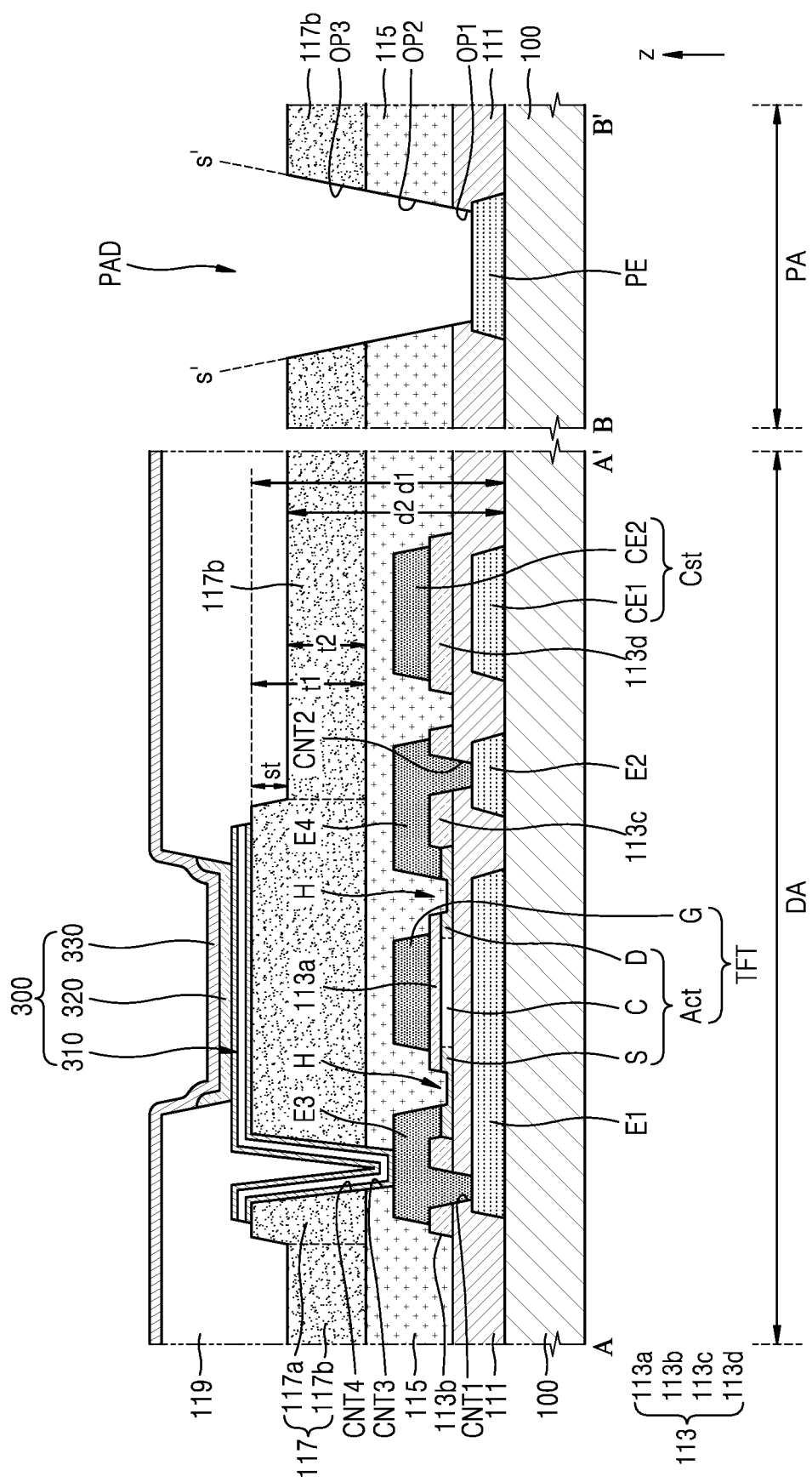

Referring to FIG. 8F, the pixel defining layer 119 covering or overlapping an edge of the pixel electrode 310 and including an opening that exposes a center portion of the pixel electrode 310 may be formed on the entire upper surface of the third insulating layer 117. The pixel defining layer 119 may be formed of at least one organic insulating material selected from the group consisting of polyimide, polyamide, acryl resin, benzocyclobutene, and a phenolic resin, by using a method such as spin coating.

The intermediate layer 320 may be formed on the pixel electrode 310, namely, within the opening of the pixel defining layer 119. The intermediate layer 320 may include a low-molecular weight or high-molecular weight material.

The intermediate layer 320 may be formed via vacuum deposition, screen printing, inkjet printing, LITI, or the like within the spirit and the scope of the disclosure.

The opposite electrode 330 may be formed to correspond to a plurality of light-emitting devices 300. The opposite electrode 330 may be formed to cover or overlap the display area DA of the substrate 100 through an open mask. The opposite electrode 330 may be formed by using a deposition method such as CVD, PECVD, LPCVD, PVD, sputtering, or ALD.

Figure 9:
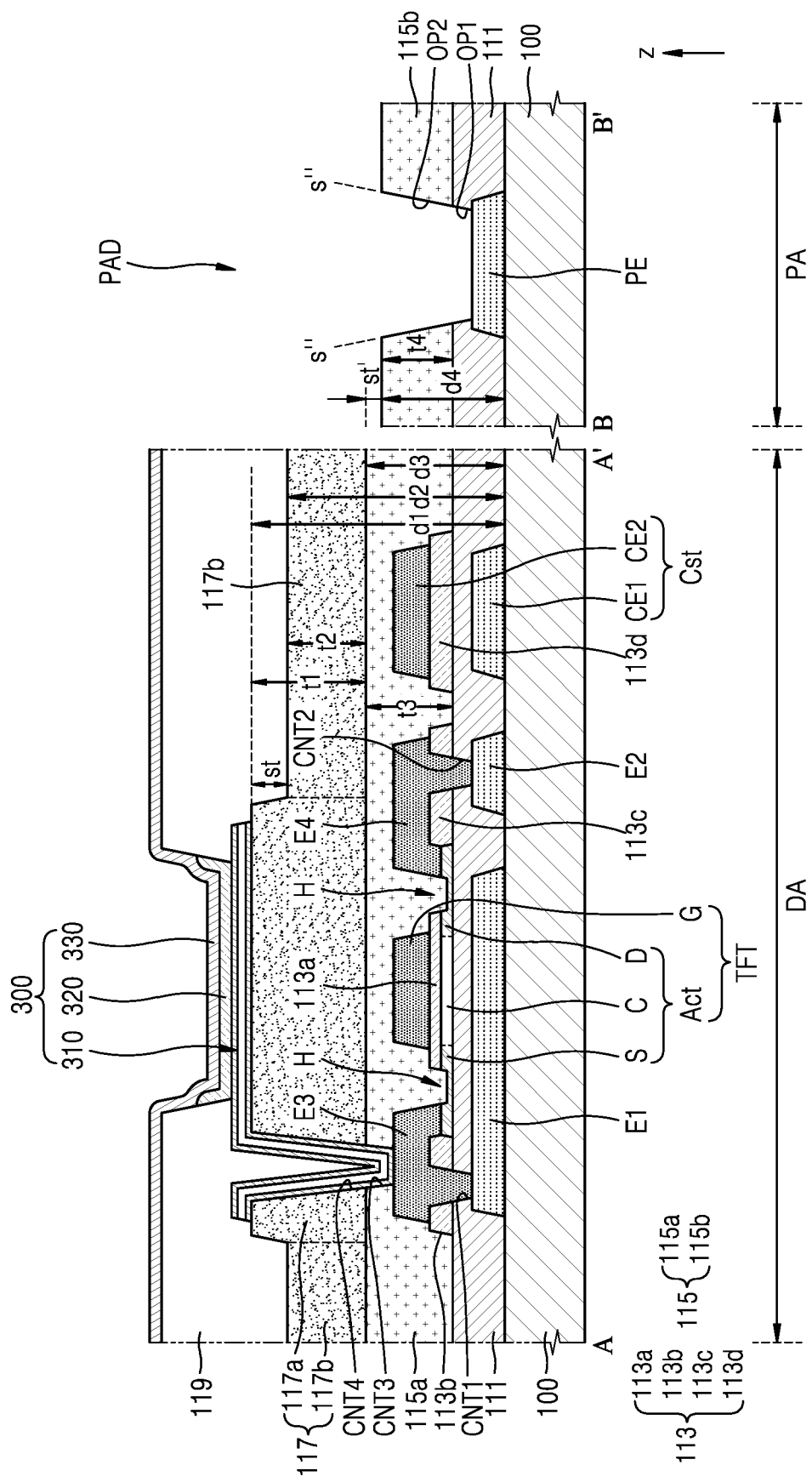
FIG. 9 is a schematic cross-sectional view of a display area and a pad unit of FIG. 1 taken along lines A-A' and B-B', respectively.

FIG. 9 is a schematic cross-sectional view of a display apparatus according to an embodiment. In detail, FIG. 9 is a schematic cross-sectional view of the display area DA and the pad unit PAD of FIG. 1 taken along lines A-A' and B-B', respectively. The same reference numerals in FIGS. 4 and 9 denote the same elements, and thus repeated descriptions thereof are omitted. FIG. 9 corresponds to a partial modification of FIG. 4, and thus will be described by focusing on differences from FIG. 4.

Referring to FIG. 9, the third insulating layer 117 may include the first portion 117a, and the second portion 117b extending from the first portion 117a.

According to an embodiment, the first portion 117a of the third insulating layer 117 may have the first thickness t1, and the second portion 117b of the third insulating layer 117 may have the second thickness t2. The first thickness t1 of the first portion 117a of the third insulating layer 117 may be different from the second thickness t2 of the second portion 117b of the third insulating layer 117. For example, as shown in FIG. 9, the first thickness t1 of the first portion 117a of the third insulating layer 117 may be greater than the second thickness t2 of the second portion 117b of the third insulating layer 117.

According to an embodiment, the upper surface of the third insulating layer 117 may have the step st between the first portion 117a and the second portion 117b. The vertical distance d1 from the upper surface of the substrate 100 to the upper surface of the first portion 117a may be different from the vertical distance d2 from the upper surface of the substrate 100 to the upper surface of the second portion 117b. For example, as shown in FIG. 9, the vertical distance d1 from the upper surface of the substrate 100 to the upper surface of the first portion 117a may be greater than the vertical distance d2 from the upper surface of the substrate 100 to the upper surface of the second portion 117b.

As shown in FIG. 9, the second insulating layer 115 may include a first portion 115a, and a second portion 115b extending from the first portion 115a.

According to an embodiment, the first portion 115a of the second insulating layer 115 may have a third thickness t3, and the second portion 115b of the second insulating layer 115 may have a fourth thickness t4. The third thickness t3 of the first portion 115a of the second insulating layer 115 may be different from the fourth thickness t4 of the second portion 115b of the second insulating layer 115. For example, as shown in FIG. 9, the first thickness t3 of the first portion 115a of the second insulating layer 115 may be greater than the fourth thickness t4 of the second portion 115b of the second insulating layer 115.

According to an embodiment, the upper surface of the second insulating layer 115 may have the step st' between the first portion 115a and the second portion 115b. A vertical distance d3 from the upper surface of the substrate 100 to the upper surface of the first portion 115a may be different from a vertical distance d4 from the upper surface of the substrate 100 to the upper surface of the second portion 115b. For example, as shown in FIG. 9, the vertical distance d3 from the upper surface of the substrate 100 to the upper surface of the first portion 115a may be greater than the vertical distance d4 from the upper surface of the substrate 100 to the upper surface of the second portion 115b.

According to an embodiment, the second opening OP2 exposing at least a portion of the pad electrode PE may be located or disposed in the second portion 115b of the second insulating layer 115. The first insulating layer 111 and the second insulating layer 115 may have the same etched surface s". The lateral surface of the first insulating layer 111 exposed by the first opening OP1 and the lateral surface of the second insulating layer 115 exposed by the second opening OP2 may be located or disposed on the same etched surface s".

Because the second opening OP2 may be located or disposed in the second portion 115b of the second insulating layer 115 and there is no third insulating layer 117 remaining in the peripheral area PA, a total thickness of the insulating layer existing in the pad unit PAD may decrease. As the total thickness of the insulation layer existing in the pad unit PAD decreases, it may be relatively easier to make the pad electrode PE and the PCB or the driver IC chip electrically contact each other.

FIGS. 10A through 10D are schematic cross-sectional views schematically illustrating a method of manufacturing a display apparatus according to an embodiment, based on FIG. 9. The same reference numerals in FIGS. 6A through 6K and FIGS. 10A through 10D denote the same elements, and thus repeated descriptions thereof are omitted. FIGS. 10A through 10D correspond to a partial modification of FIGS. 6A through 6K, and thus will be described by focusing on differences from FIGS. 6A through 6K.

Figure 10A:
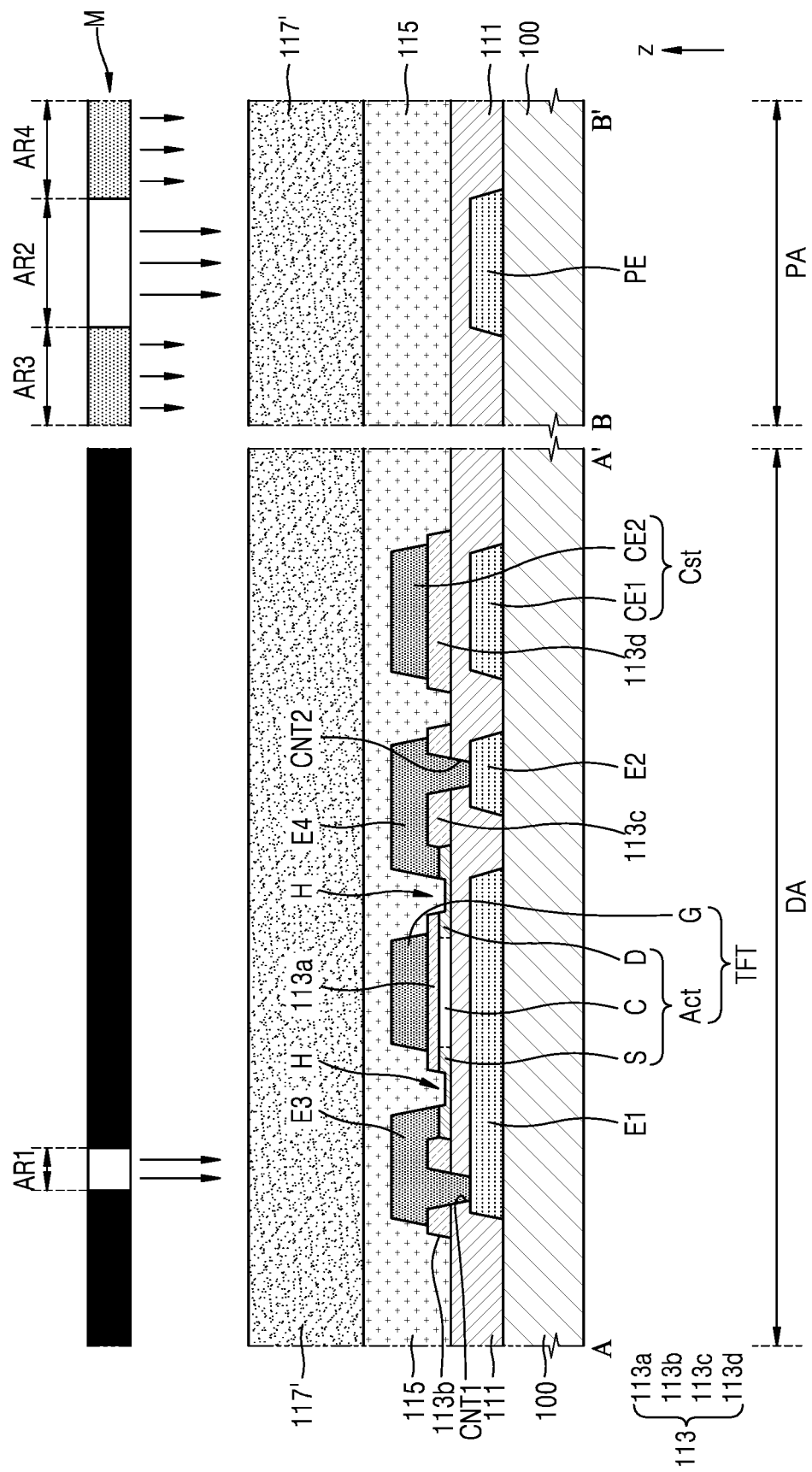
FIGS. 10A through 10D are schematic cross-sectional views schematically illustrating, based on FIG. 9, a method of manufacturing a display apparatus according to an embodiment.

Referring to FIG. 10A, the insulating material layer 117' may be formed on the second insulating layer 115. The insulating material layer 117' may include a positive photoresist, and may be formed by applying a positive photoresist solution (not shown) onto the second insulating layer 115 by using any of various methods such as spin coating, spraying, or dipping. Processes before the insulating material layer 117' may be located or disposed on the second insulating layer 115 may be the same as FIGS. 6A through 6H.

A mask M may be located or disposed on the insulating material layer 117'. The mask M may adjust the amount of light exposure of the insulating material layer 117' in each area. For example, the amount of light exposure of the insulating material layer 117' in a third area AR3 of the mask M may be adjusted to be less than that in the first area AR1 and the second area AR2 of the mask M. The amount of light exposure of the insulating material layer 117' in a fourth area AR4 of the mask M may be adjusted to be less than that in the first area AR1 and the second area AR2 of the mask M. For example, the mask M may be a halftone mask or a slit mask. According to an embodiment, a remaining area of the mask M except for the first area AR1, the second area AR2, the third area AR3, and the fourth area AR4 may be shielded so that the insulating material layer 117' is not exposed to light.

Figure 10B:
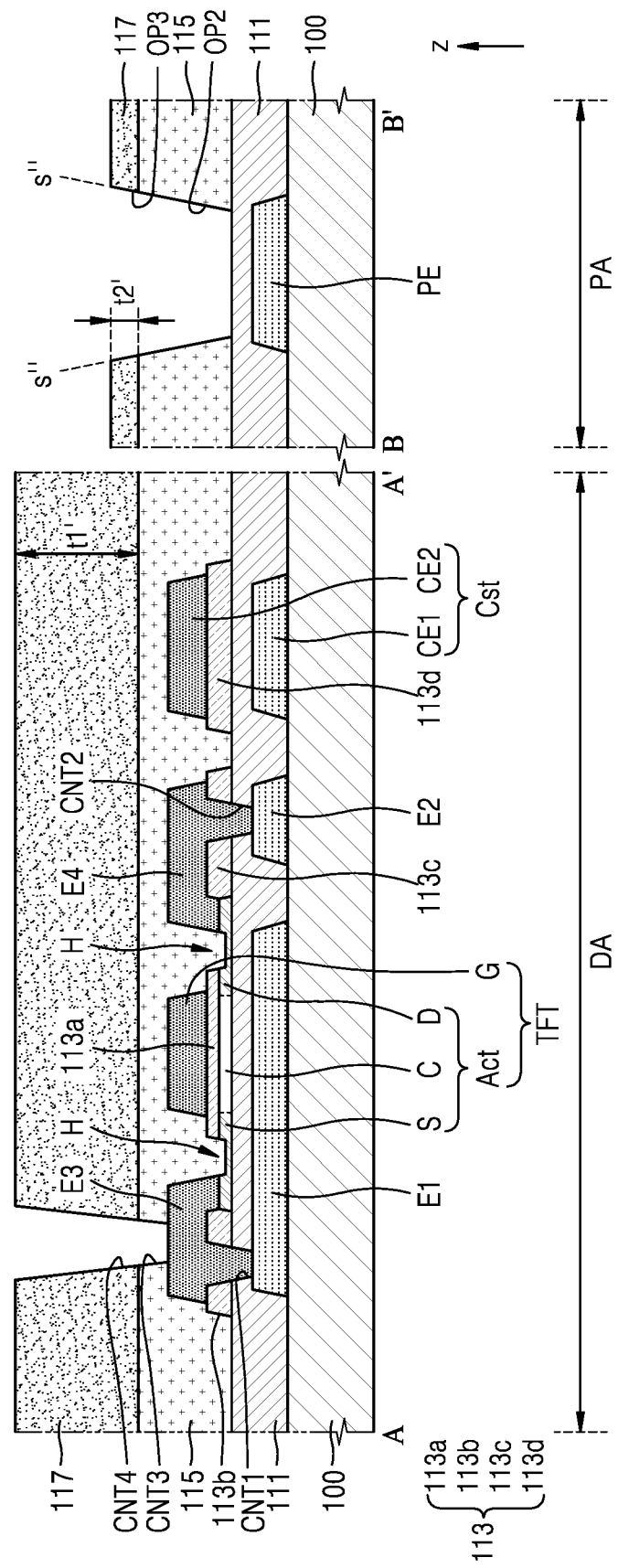

The insulating material layer 117' may be exposed to light at different amounts of light exposure through the mask M according to areas, and a portion of the insulating material layer 117' may be removed by using a developing process. Because the amount of the insulating material layer 117' that is removed varies according to the amount of light exposure, the third insulating layer 117 having different thicknesses according to areas may be formed at one time. In other words, as shown in FIG. 10B, a thickness t1' of the third insulating layer 117 corresponding to the display area DA may be greater than a thickness t2' of the third insulating layer 117 corresponding to the peripheral area PA. A degree of adhesion of the third insulating layer 117 to the second insulating layer 115 may be increased through a curing and drying process. The curing and drying process may include a heat treatment process.

Although the insulating material layer 117' may include a positive photoresist in FIG. 10A, the insulating material layer 117' may include a negative photoresist. In contrast to in case that the insulating material layer 117' may include a positive photoresist, a thickness of the third insulating layer 117 remaining after a developing process increases as the amount of light exposure of the insulating material layer 117' increases.

Referring to FIG. 10B, the third insulating layer 117 may have the fourth contact hole CNT4 in correspondence with a portion exposed by the first area AR1 of the mask M. The third insulating layer 117 may have the third opening OP3 in correspondence with a portion exposed by the second area AR2 of the mask M.

The third contact hole CNT3 exposing a portion of the third electrode E3 and the second opening OP2 corresponding to the third opening OP3 may be formed using the third insulating layer 117 as an etch mask. Because the second opening OP2 of the second insulating layer 115 is formed using the third insulating layer 117 as an etch mask, the substantially planar shape of the second opening OP2 may substantially correspond to that of the third opening OP3. The sidewall of the second insulating layer 115 may correspond to that of the third insulating layer 117. The lateral surface of the second insulating layer 115 exposed by the second opening OP2 and the lateral surface of the third insulating layer 117 exposed by the third opening OP3 may be located or disposed on the same etched surface s".

In FIG. 10B, only the second insulating layer 115 is etched. However, according to the time of an etch process, only a portion of the second insulating layer 115 may be etched or a portion of the first insulating layer 111 may also be etched.

Figure 10C:
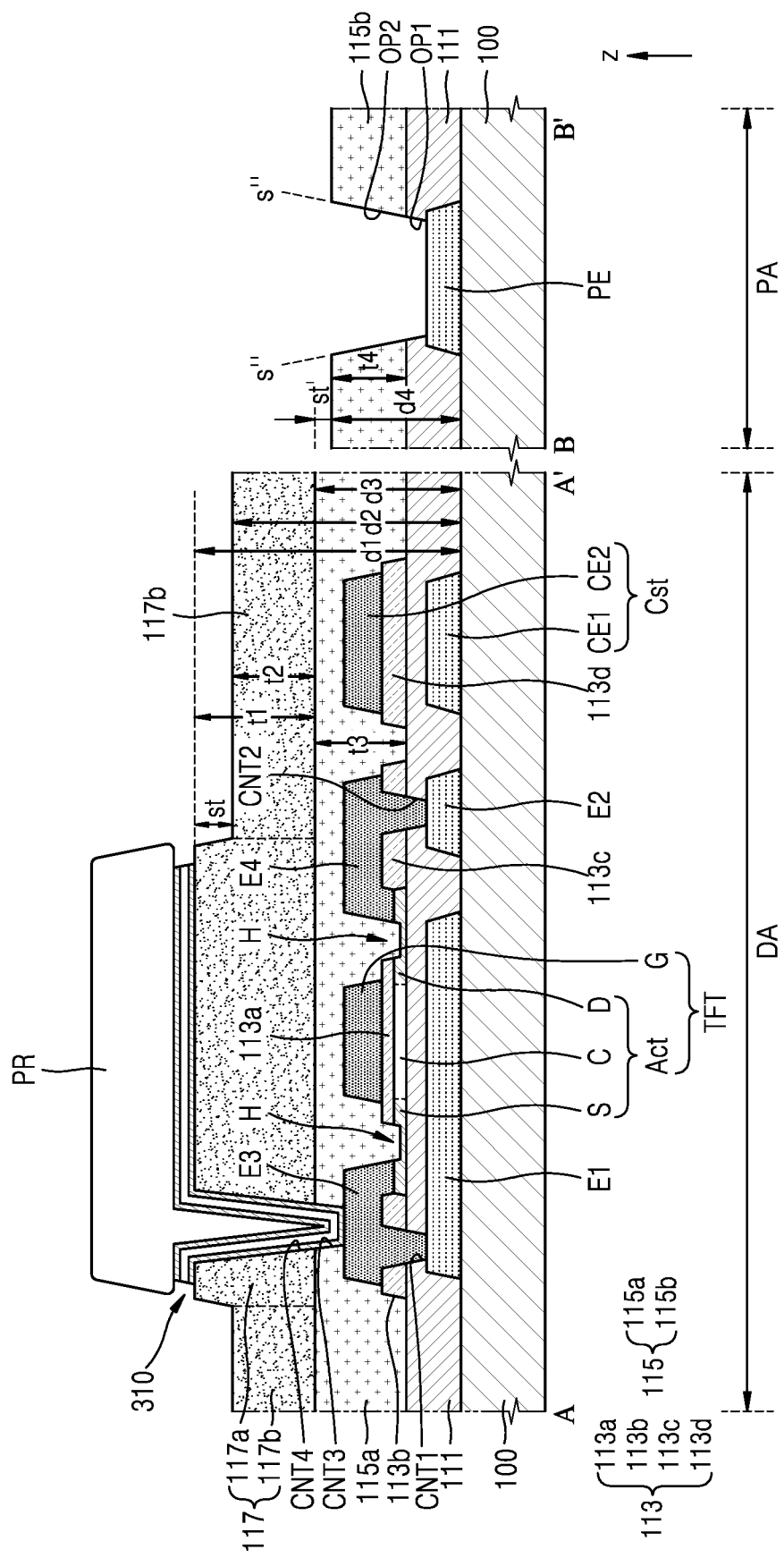

Referring to FIG. 10C, the pixel electrode 310 may be formed on the third insulating layer 117. The pixel electrode 310 may be formed by depositing a pixel electrode material layer on the entire upper surface of the third insulating layer 117 and performing a mask process and an etching process.

A photoresist pattern PR may be formed to substantially correspond to the pixel electrode 310 to be formed on the pixel electrode material layer. The pixel electrode 310 may be formed by etching a portion of the pixel electrode material layer where the photoresist pattern PR does not exist.

The photoresist pattern PR is not removed, and the first opening OP1 corresponding to the second opening OP2 and the third opening OP3 may be formed by varying an etchant. The first opening OP1 may be formed by etching a portion of the first insulating layer 111.

The first insulating layer 111 and the second insulating layer 115 may have the same etched surface s", and the second insulating layer 115 and the third insulating layer 117 may have the same etched surface s". The lateral surface of the first insulating layer 111 exposed by the first opening OP1 and the lateral surface of the second insulating layer 115 exposed by the second opening OP2 may be located or disposed on the same etched surface s". The lateral surface of the second insulating layer 115 exposed by the second opening OP2 and the lateral surface of the third insulating layer 117 exposed by the third opening OP3 may be located or disposed on the same etched surface s".

Because the first opening OP1 of the first insulating layer 111 is formed using the third insulating layer 117 as an etch mask, the substantially planar shape of the first opening OP1 may substantially correspond to that of the third opening OP3. Because the second opening OP2 of the second insulating layer 115 may be formed using the third insulating layer 117 as an etch mask, the substantially planar shape of the second opening OP2 may substantially correspond to that of the third opening OP3.

In case that the first opening OP1 of the first insulating layer 111 is etched, a portion of the photoresist pattern PR and a portion of the third insulating layer 117 may also be etched. Consequently, the third insulating layer 117 may include the first portion 117a having the first thickness t1, and the second portion 117b having the second thickness t2 smaller than the first thickness t1. The upper surface of the third insulating layer 117 may have the step st between the first portion 117a and the second portion 117b. The vertical distance d1 from the upper surface of the substrate 100 to the upper surface of the first portion 117a may be different from the vertical distance d2 from the upper surface of the substrate 100 to the upper surface of the second portion 117b. For example, as shown in FIG. 10C, the vertical distance d1 from the upper surface of the substrate 100 to the upper surface of the first portion 117a may be greater than the vertical distance d2 from the upper surface of the substrate 100 to the upper surface of the second portion 117b.

Because the third insulating layer 117 located or disposed in the peripheral area PA has a smaller thickness than the third insulating layer 117 located or disposed in the display area DA, in case that the first opening OP1 of the first insulating layer 111 is formed, the third insulating layer 117 located or disposed in the peripheral area PA may be entirely removed. As the third insulating layer 117 located or disposed in the peripheral area PA is removed, a portion of the upper surface of the second insulating layer 115 may be exposed to light, and may be etched out in case that the first opening OP1 of the first insulating layer 111 is formed. Consequently, the second insulating layer 115 may include the first portion 115a having the third thickness t3, and the second portion 115b having the fourth thickness t4 smaller than the third thickness t3. The upper surface of the second insulating layer 115 may have the step st' between the first portion 115a and the second portion 115b. The vertical distance d3 from the upper surface of the substrate 100 to the upper surface of the first portion 115a may be different from the vertical distance d4 from the upper surface of the substrate 100 to the upper surface of the second portion 115b. For example, as shown in FIG. 10C, the vertical distance d3 from the upper surface of the substrate 100 to the upper surface of the first portion 115a may be greater than the vertical distance d4 from the upper surface of the substrate 100 to the upper surface of the second portion 115b.

Because the pixel electrode 310 is formed using the photoresist pattern PR as an etch mask and the first portion 117a of the third insulating layer 117 is also formed using the photoresist pattern PR as an etch mask, both the substantially planar shape of the pixel electrode 310 and the substantially planar shape of the first portion 117a may substantially correspond to the substantially planar shape of the photoresist pattern PR. The edge of the pixel electrode 310 may correspond to the sidewall of the first portion 117a.

According to an embodiment, after the pixel electrode 310 may be formed, the photoresist pattern PR may not be removed, and an etching process for exposing a portion of the pad electrode PE may be performed. A surface of the third insulating layer 117 on which the pixel electrode 310 may be located or disposed may be protected by the photoresist pattern PR. Accordingly, a step due to a foreign material is not formed on the surface of the third insulating layer 117, and a surface roughness of the third insulating layer 117 is not increased. In other words, dark spots are not formed on a display panel, and a reflectance of external light is not reduced and thus luminous efficiency is not reduced. Because there is no third insulating layer 117 remaining in the peripheral area PA due to the etching process, an external moisture penetration path is blocked, thereby reducing the risk of a reliability problem such as degradation of the light-emitting device.

Because the second opening OP2 may be located or disposed in the second portion 115b of the second insulating layer 115 and there is no third insulating layer 117 remaining in the peripheral area PA, a total thickness of the insulating layer existing in the pad unit PAD may decrease. As the total thickness of the insulation layer existing in the pad unit PAD decreases, it may be relatively easier to make the pad electrode PE and the PCB or the driver IC chip electrically contact each other.

Figure 10D:
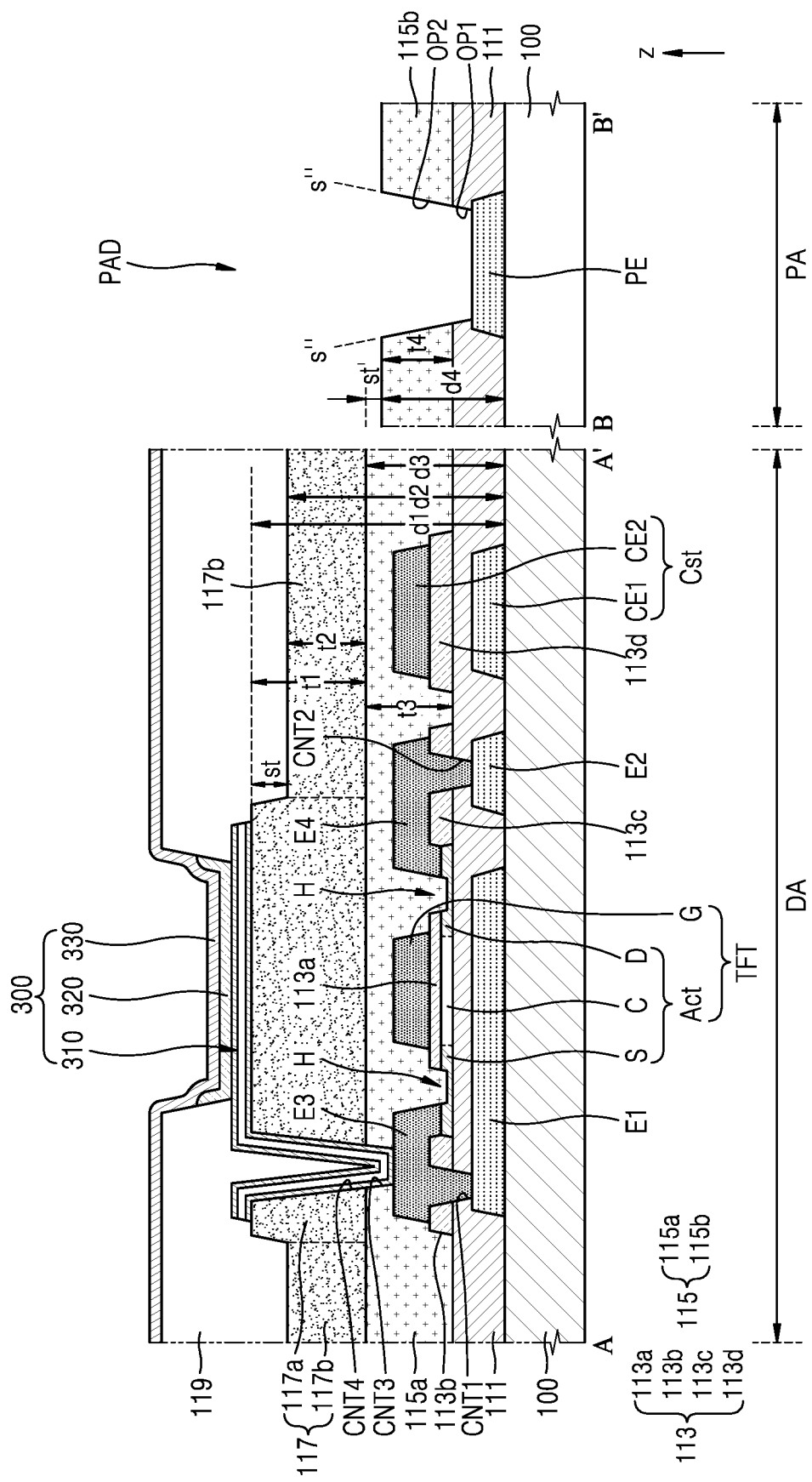

Referring to FIG. 10D, the pixel defining layer 119 covering or overlapping an edge of the pixel electrode 310 and including an opening that exposes a center portion of the pixel electrode 310 may be formed on the entire upper surface of the third insulating layer 117. The pixel defining layer 119 may be formed of at least one organic insulating material selected from the group consisting of polyimide, polyamide, acryl resin, benzocyclobutene, and a phenolic resin, by using a method such as spin coating.

The intermediate layer 320 may be formed on the pixel electrode 310, namely, within the opening of the pixel defining layer 119. The intermediate layer 320 may include a low-molecular weight or high-molecular weight material. The intermediate layer 320 may be formed via vacuum deposition, screen printing, inkjet printing, LITI, or the like within the spirit and the scope of the disclosure.

The opposite electrode 330 may be formed to substantially correspond to a plurality of light-emitting devices 300. The opposite electrode 330 may be formed to cover or overlap the display area DA of the substrate 100 through an open mask. The opposite electrode 330 may be formed by using a deposition method such as CVD, PECVD, LPCVD, PVD, sputtering, or ALD.

Figure 11A:
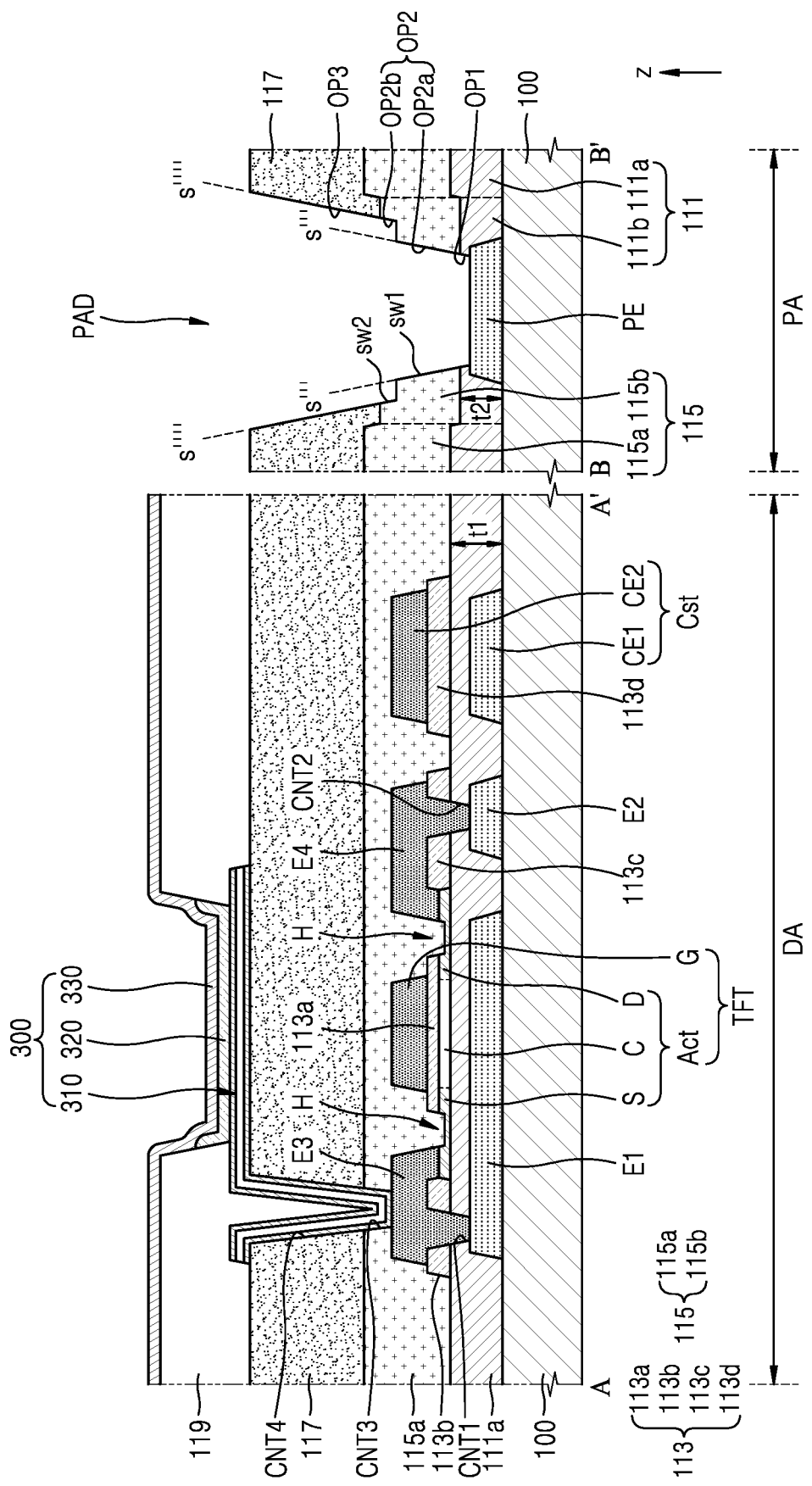
FIG. 11A is a schematic cross-sectional view of a display area and a pad unit of FIG. 1 taken along lines A-A' and B-B', respectively.

FIG. 11A is a schematic cross-sectional view of a display apparatus according to an embodiment. In detail, FIG. 11A is a schematic cross-sectional view of the display area DA and the pad unit PAD of FIG. 1 taken along lines A-A' and B-B', respectively. The same reference numerals in FIGS. 4 and 11A denote the same elements, and thus repeated descriptions thereof are omitted. FIG. 11A corresponds to a partial modification of FIG. 4, and thus will be described by focusing on differences from FIG. 4.

Referring to FIG. 11A, the first insulating layer 111 may include a first portion 111a, and a second portion 111b extending from the first portion 111a. The first portion 111a of the first insulating layer 111 may be located or disposed around the second portion 111b of the first insulating layer 111. The first insulating layer 111 may have the first opening OP1, and the first opening OP1 may be located or disposed in the second portion 111b of the first insulating layer 111.

According to an embodiment, the first portion 111a of the first insulating layer 111 may have a first thickness t1, and the second portion 111b of the first insulating layer 111 may have a second thickness t2. The first thickness t1 of the first portion 111a of the first insulating layer 111 may be different from the second thickness t2 of the second portion 111b of the first insulating layer 111. For example, as shown in FIG. 11A, the first thickness t1 of the first portion 111a of the first insulating layer 111 may be greater than the second thickness t2 of the second portion 111b of the first insulating layer 111.

As shown in FIG. 11A, the second insulating layer 115 may include a first portion 115a, and a second portion 115b extending from the first portion 115a. The first portion 115a of the second insulating layer 115 may correspond to or coincide with the first portion 111a of the first insulating layer 111, and the second portion 115b of the second insulating layer 115 may correspond to or coincide with the second portion 111b of the first insulating layer 111. The second insulating layer 115 may be formed along the upper surface of the first insulating layer 111 and may have a step between the first portion 115a and the second portion 115b.

According to an embodiment, as shown in FIG. 11A, the second insulating layer 115 may have a second opening OP2. The second opening OP2 may be located or disposed in the second portion 115b of the second insulating layer 115. The second opening OP2 may include a lower opening portion OP2a and an upper opening portion OP2b. The second insulating layer 115 may have the lower opening portion OP2a and the upper opening portion OP2b.

In a plan view, an opening area of the upper opening portion OP2b may be greater than that of the lower opening portion OP2a.

The second insulating layer 115 may have a lower sidewall sw1 defining the lower opening portion OP2a, and an upper sidewall sw2 defining the upper opening portion OP2b. In a plan view, the upper sidewall sw2 may be located or disposed around the lower sidewall sw1.

According to an embodiment, the first insulating layer 111 and the second insulating layer 115 may have the same etched surface s'''. The lateral surface of the first insulating layer 111 exposed by the first opening OP1 and the lateral surface of the second insulating layer 115 exposed by the lower opening portion OP2a may be located or disposed on the same etched surface s'''. The lower opening portion OP2a may correspond to the first opening OP1.

The second insulating layer 115 and the third insulating layer 117 may have the same etched surface s''''. The lateral surface of the second insulating layer 115 exposed by the upper opening portion OP2b and the lateral surface of the third insulating layer 117 exposed by the third opening OP3 may be located or disposed on the same etched surface s''''. The upper opening portion OP2b may correspond to the third opening OP3.

Figure 11B:
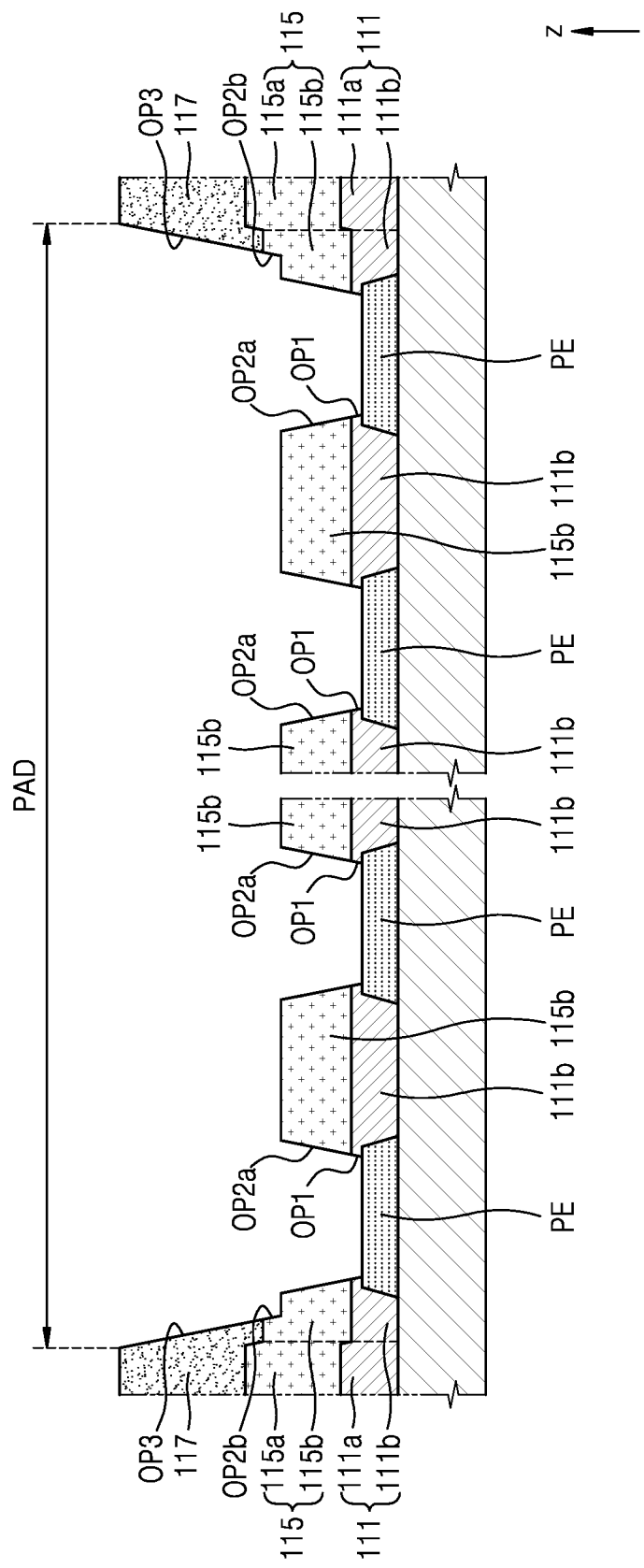
FIG. 11B is a schematic cross-sectional view of the pad unit of FIG. 1.

FIG. 11B is a schematic cross-sectional view of the pad unit PAD of FIG. 1. The same reference numerals in FIGS. 11A and 11B denote the same elements, and thus repeated descriptions thereof are omitted. FIG. 11A illustrates one pad electrode, and FIG. 11B illustrates a plurality of pad electrodes adjacent to each other.

Referring to FIG. 11B, a plurality of pad electrodes PE may be arranged or disposed in the pad unit PAD. The plurality of pad electrodes PE may be arranged or disposed adjacent to each other. Although four pad electrodes PE are illustrated in FIG. 11B, a plurality of not-shown pad electrodes PE may be located or disposed between dot-dashed lines.

As described above with reference to FIG. 11A, the second insulating layer 111 may include the first portion 111a and the second portion 111b. The second insulating layer 115 may include the first portion 115a corresponding to the first portion 111a of the first insulating layer 111, and the second portion 115b corresponding to the second portion 111b of the first insulating layer 111.

Respective edges of the plurality of pad electrodes PE may be surrounded by the first portion 111a of the first insulating layer 111. The first insulating layer 111 may have a plurality of first openings OP1 exposing at least respective portions of the plurality of pad electrodes PE.

The second insulating layer 115 may have a plurality of lower opening portions OP2a respectively corresponding to the plurality of first openings OP1. The second insulating layer 115 may have an upper opening portion OP2b overlapping the plurality of lower opening portions OP2a.

The third insulating layer 117 having the third opening OP3 may be located or disposed on the second insulating layer 115, and the third opening OP3 may correspond to the upper opening portion OP2b. The third insulating layer 117 may be located or disposed around the pad unit PAD, and the pad unit PAD may be defined by the third opening OP3. Consequently, there is no third insulating layer 117 remaining in the pad unit PAD, resulting in a decrease in the total thickness of an insulating layer existing in the pad unit PAD. As the total thickness of the insulation layer existing in the pad unit PAD decreases, it may be relatively easier to make the pad electrode PE and the PCB or the driver IC chip electrically contact each other.

FIGS. 12A through 12F are schematic cross-sectional views schematically illustrating a method of manufacturing a display apparatus according to an embodiment, based on FIG. 11A. FIGS. 12A through 12F correspond to a partial modification of FIGS. 6A through 6K, and thus will be described by focusing on differences from FIGS. 6A through 6K.

Figure 12A:
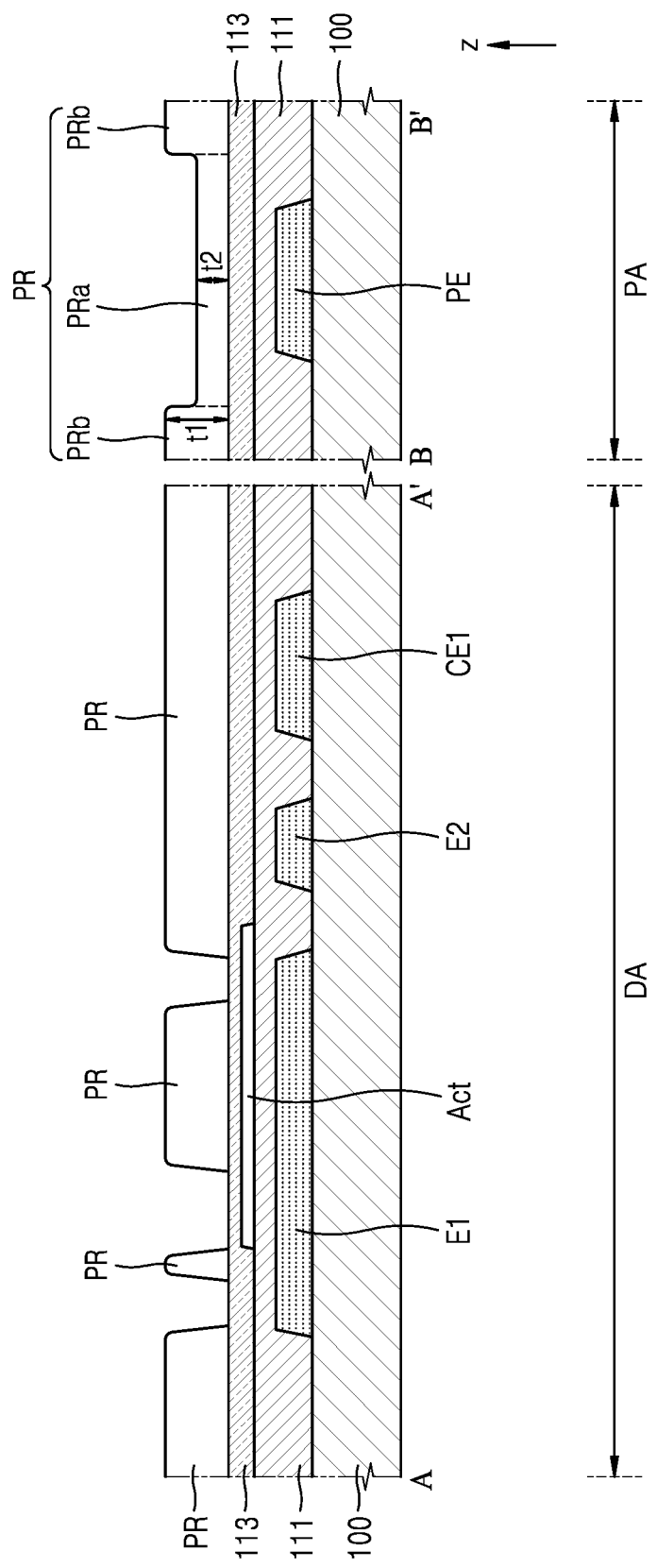
FIGS. 12A through 12F are schematic cross-sectional views schematically illustrating, based on FIG. 11A, a method of manufacturing a display apparatus according to an embodiment.

Referring to FIG. 12A, the gate insulating layer 113 may be formed on the semiconductor layer Act. Processes before the gate insulating layer 113 may be formed on the semiconductor layer Act may be the same as FIGS. 6A and 6B.

After the gate insulating layer 113 may be formed on the semiconductor layer Act, the photoresist pattern PR may be formed on the gate insulating layer 113 in order to form contact holes in the first insulating layer 111 and the gate insulating layer 113. A photoresist pattern PR located or disposed in the peripheral area PA and overlapping the pad electrode PE may include portions with different thicknesses. For example, as shown in FIG. 12A, the photoresist pattern PR overlapping the pad electrode PE may include a first photoresist pattern PRa having a first thickness t1, and a second photoresist pattern PRb having a second thickness t2 greater than the first thickness t1. In a plan view, the second photoresist pattern PRb may be located or disposed around the first photoresist pattern PRa.

Figure 12B:
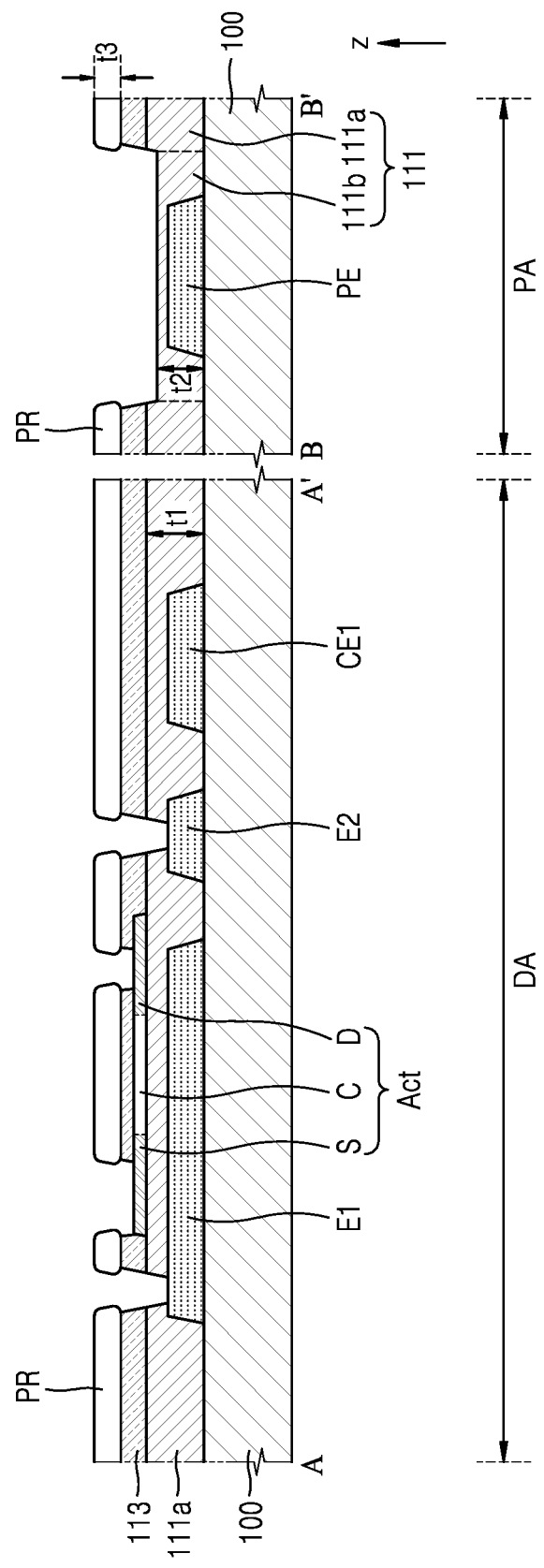

Referring to FIG. 12B, contact holes may be formed in the first insulating layer 111 and the gate insulating layer 113 by using the photoresist pattern PR. While each of the first insulating layer 111 and the gate insulating layer 113 are being partially etched, the photoresist pattern PR may also be etched, and thus a thickness of the photoresist pattern PR may be reduced. For example, as shown in FIG. 12B, the second photoresist pattern PRb may have a third thickness t3 that may be less than a previous thickness.

According to an embodiment, the first photoresist pattern PRa may be entirely etched, and a portion of the first insulating layer 111 overlapping the pad electrode PE may also be etched. Consequently, the first insulating layer 111 may include the first portion 111a, and the second portion 111b extending from the first portion 111a. The first portion 111a of the first insulating layer 111 may have the first thickness t1, and the second portion 111b of the first insulating layer 111 may have the second thickness t2. The first thickness t1 of the first portion 111a of the first insulating layer 111 may be greater than the second thickness t2 of the second portion 111b of the first insulating layer 111.

Figure 12C:
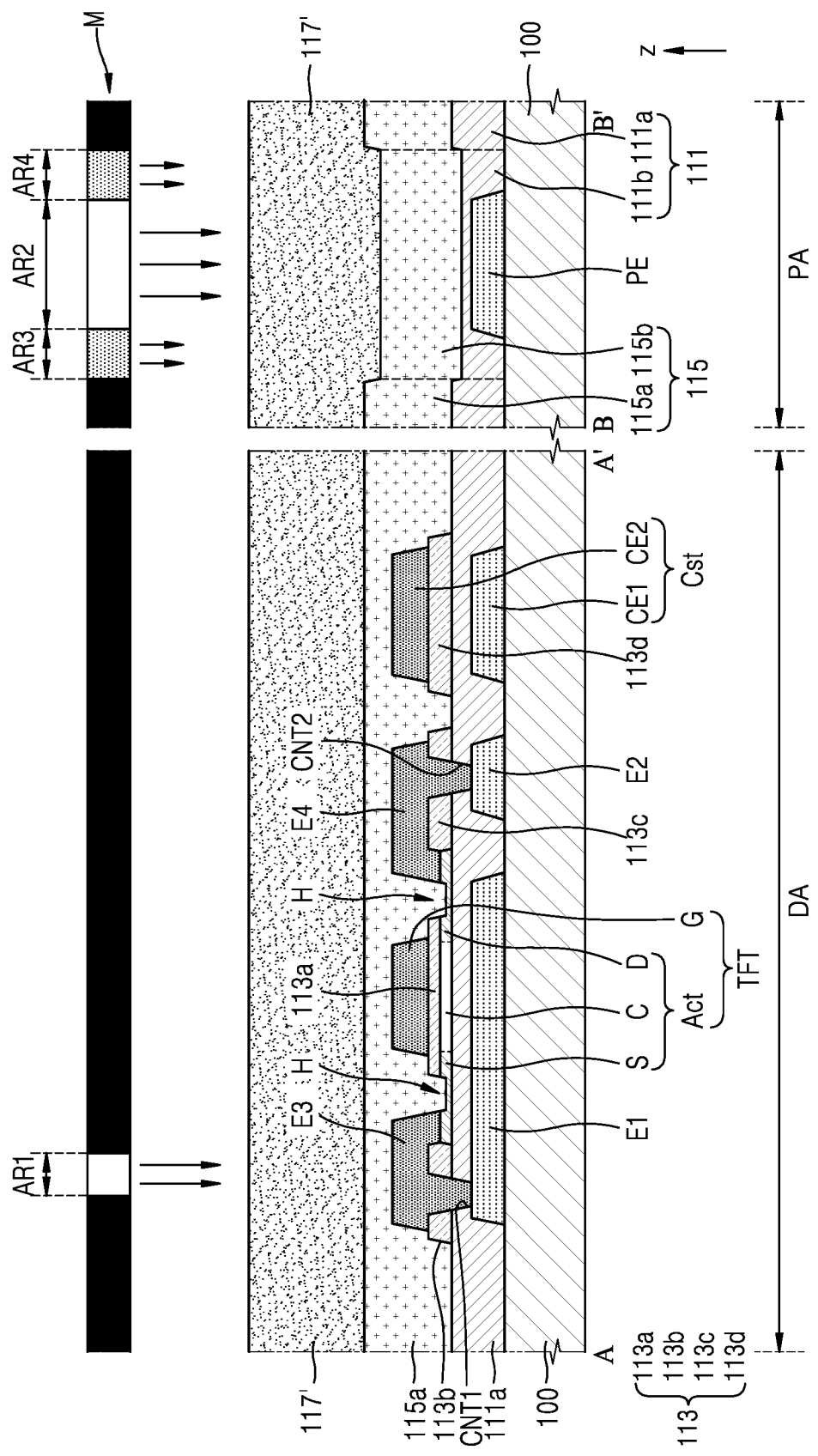

Referring to FIG. 12C, the second insulating layer 115 may be formed on the third insulating layer 111. Due to the first insulating layer 111 having portions with different thicknesses, the second insulating layer 115 may have a step. In other words, the second insulating layer 115 may include the first portion 115a, and the second portion 111b extending from the first portion 115a. The first portion 115a of the second insulating layer 115 may correspond to the first portion 111a of the first insulating layer 111, and the second portion 115b of the second insulating layer 115 may correspond to the second portion 111b of the first insulating layer 111. The second insulating layer 115 may be formed along the upper surface of the first insulating layer 111 and may have a step between the first portion 115a and the second portion 115b.

The insulating material layer 117' may be formed on the second insulating layer 115.

A mask M may be located or disposed on the insulating material layer 117'. The mask M may adjust the amount of light exposure of the insulating material layer 117' in each area. For example, the amount of light exposure of the insulating material layer 117' in a third area AR3 of the mask M may be adjusted to be less than that in the first area AR1 and the second area AR2 of the mask M. The amount of light exposure of the insulating material layer 117' in a fourth area AR4 of the mask M may be adjusted to be less than that in the first area AR1 and the second area AR2 of the mask M. For example, the mask M may be a halftone mask or a slit mask. According to an embodiment, a remaining area of the mask M except for the first area AR1, the second area AR2, the third area AR3, and the fourth area AR4 may be shielded so that the insulating material layer 117' is not exposed to light.

Figure 12D:
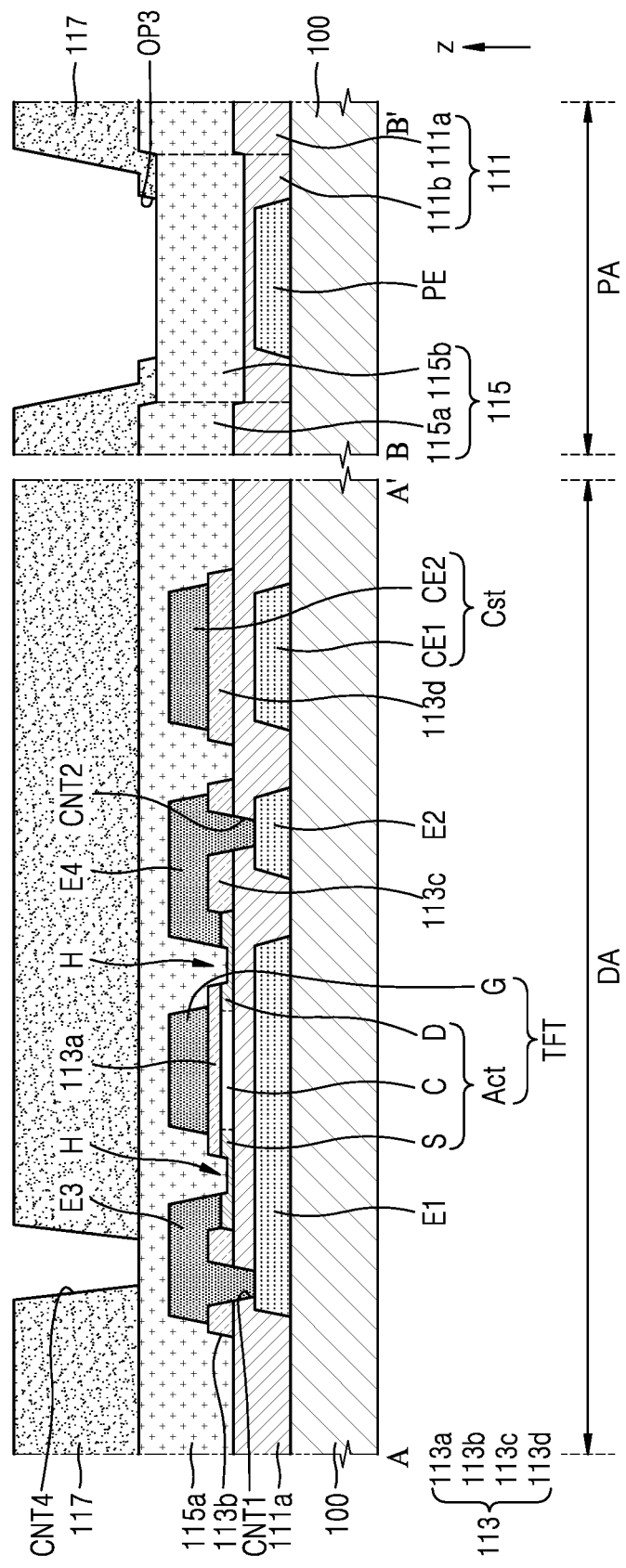

The insulating material layer 117' may be exposed to light at different amounts of light exposure through the mask M according to areas, and a portion of the insulating material layer 117' may be removed by using a developing process. Because the amount of the insulating material layer 117' that is removed varies according to the amount of light exposure, the third insulating layer 117 having different thicknesses according to areas may be formed at one time. In other words, as shown in FIG. 12D, a thickness of the third insulating layer 117 corresponding to the display area DA may be greater than a thickness of a portion of the third insulating layer 117 overlapping the pad electrode PE. A degree of adhesion of the third insulating layer 117 to the second insulating layer 115 may be increased through a curing and drying process. The curing and drying process may include a heat treatment process.

Although the insulating material layer 117' may include a positive photoresist in FIG. 12C, the insulating material layer 117' may include a negative photoresist. In contrast to in case that the insulating material layer 117' may include a positive photoresist, a thickness of the third insulating layer 117 remaining after a developing process increases as the amount of light exposure of the insulating material layer 117' increases.

Referring to FIG. 12D, the third insulating layer 117 may have the fourth contact hole CNT4 in correspondence with a portion exposed by the first area AR1 of the mask M. The third insulating layer 117 may have the third opening OP3 in correspondence with a portion exposed by the second area AR2 of the mask M.

Figure 12E:
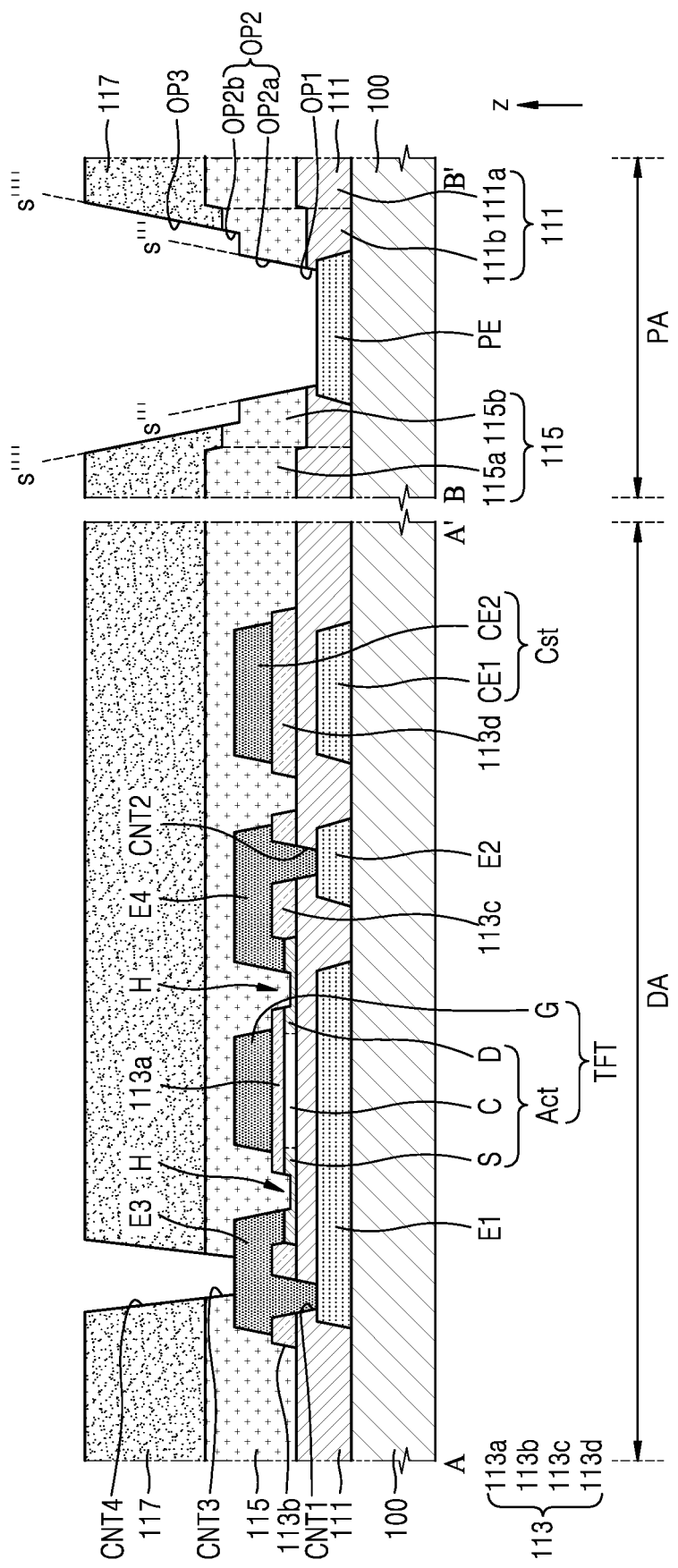

Referring to FIG. 12E, the third contact hole CNT3 exposing a portion of the third electrode E3 may be formed using the third insulating layer 117 as an etch mask. The second opening OP2 and the first opening OP1 corresponding to or coinciding with the third opening OP3 may also be formed using the third insulating layer 117 as an etch mask. Because the second opening OP2 of the second insulating layer 115 may be formed using the third insulating layer 117 as an etch mask, the substantially planar shape of the second opening OP2 may substantially correspond to or coincide with that of the third opening OP3. In more detail, a substantially planar shape of the upper opening portion OP2b of the second opening OP2 may substantially correspond to or coincide with that of the third opening OP3, because a portion of the third insulating layer 117 having a relative thickness may be entirely removed and thus a portion of the second insulating layer 115 may also be removed. Due to the etching of a portion of the second insulating layer 115, the upper surface of the second insulating layer 115 may have a step. Because the upper opening portion OP2b is formed due to the etching of a portion of the second insulating layer 115 with the removal of a portion of the third insulating layer 117, a substantially planar shape of the upper opening portion OP2b may substantially correspond to that of the third opening OP3. The lateral surface of the second insulating layer 115 exposed by the upper opening portion OP2b and the lateral surface of the third insulating layer 117 exposed by the third opening OP3 may be located or disposed on the same etched surface s".

The first opening OP1 may be formed by etching a portion of the first insulating layer 111. The first opening OP1 may be formed by etching a portion of the second portion 111b of the first insulating layer 111. The first insulating layer 111 and the second insulating layer 115 may have the same etched surface s'". In more detail, the lateral surface of the first insulating layer 111 exposed by the first opening OP1 and the lateral surface of the second insulating layer 115 exposed by the lower opening portion OP2a of the second opening OP2 may be located or disposed on the same etched surface s'".

Figure 12F:
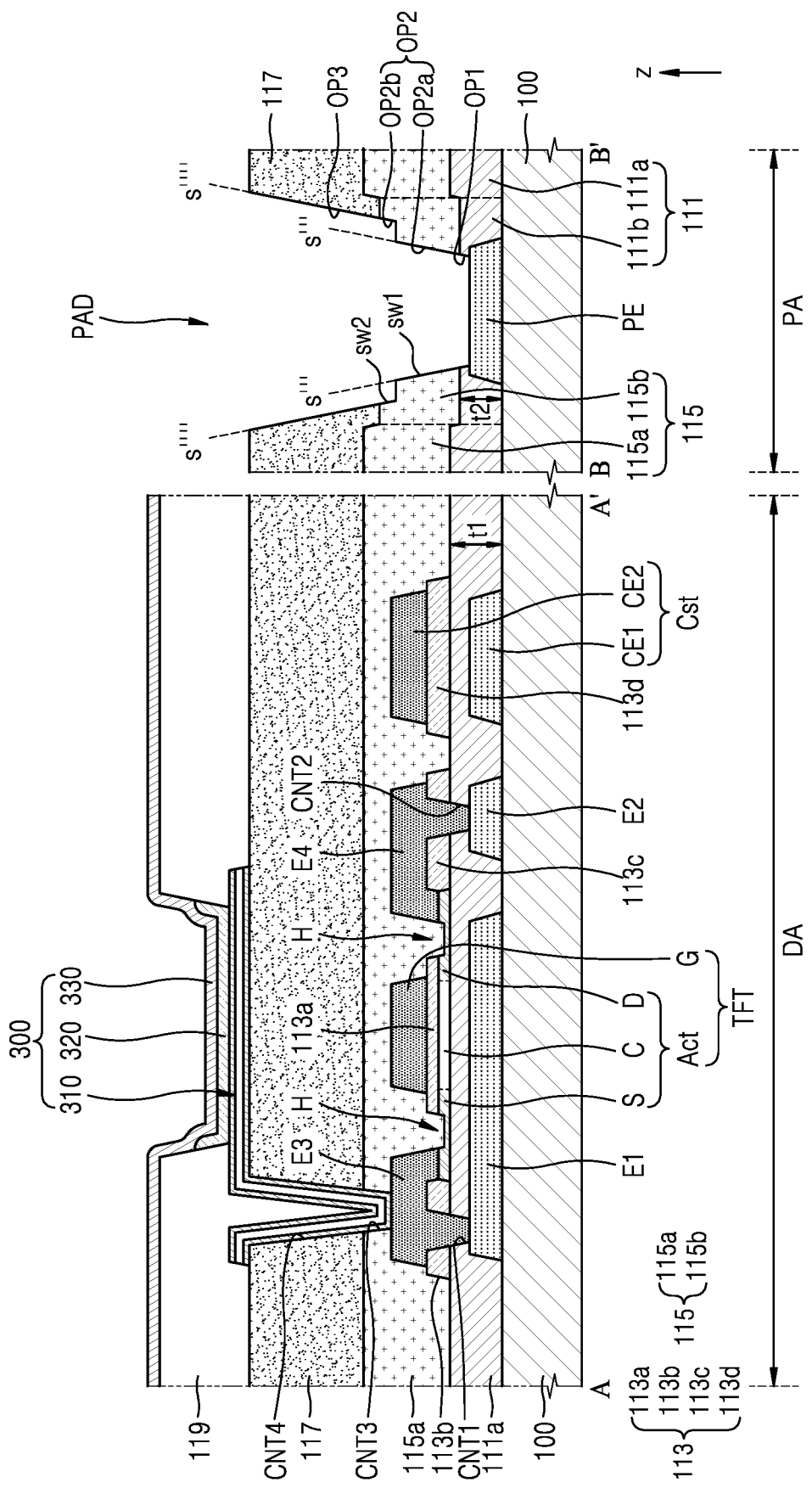

Referring to FIG. 12F, the pixel electrode 310 may be formed on the third insulating layer 117. The pixel electrode 310 may be formed by depositing a pixel electrode material layer on the entire upper surface of the third insulating layer 117 and performing a mask process and an etching process.

The pixel defining layer 119 covering or overlapping an edge of the pixel electrode 310 and including an opening that exposes a center portion of the pixel electrode 310 may be formed on the entire upper surface of the third insulating layer 117. The pixel defining layer 119 may be formed of at least one organic insulating material selected from the group consisting of polyimide, polyamide, acryl resin, benzocyclobutene, and a phenolic resin, by using a method such as spin coating.

The intermediate layer 320 may be formed on the pixel electrode 310, namely, within the opening of the pixel defining layer 119. The intermediate layer 320 may include a low-molecular weight or high-molecular weight material. The intermediate layer 320 may be formed via vacuum deposition, screen printing, inkjet printing, LITI, or the like within the spirit and the scope of the disclosure.

The opposite electrode 330 may be formed to correspond to a plurality of light-emitting devices 300. The opposite electrode 330 may be formed to cover or overlap the display area DA of the substrate 100 through an open mask. The opposite electrode 330 may be formed by using a deposition method such as CVD, PECVD, LPCVD, PVD, sputtering, or ALD.

Figure 13:
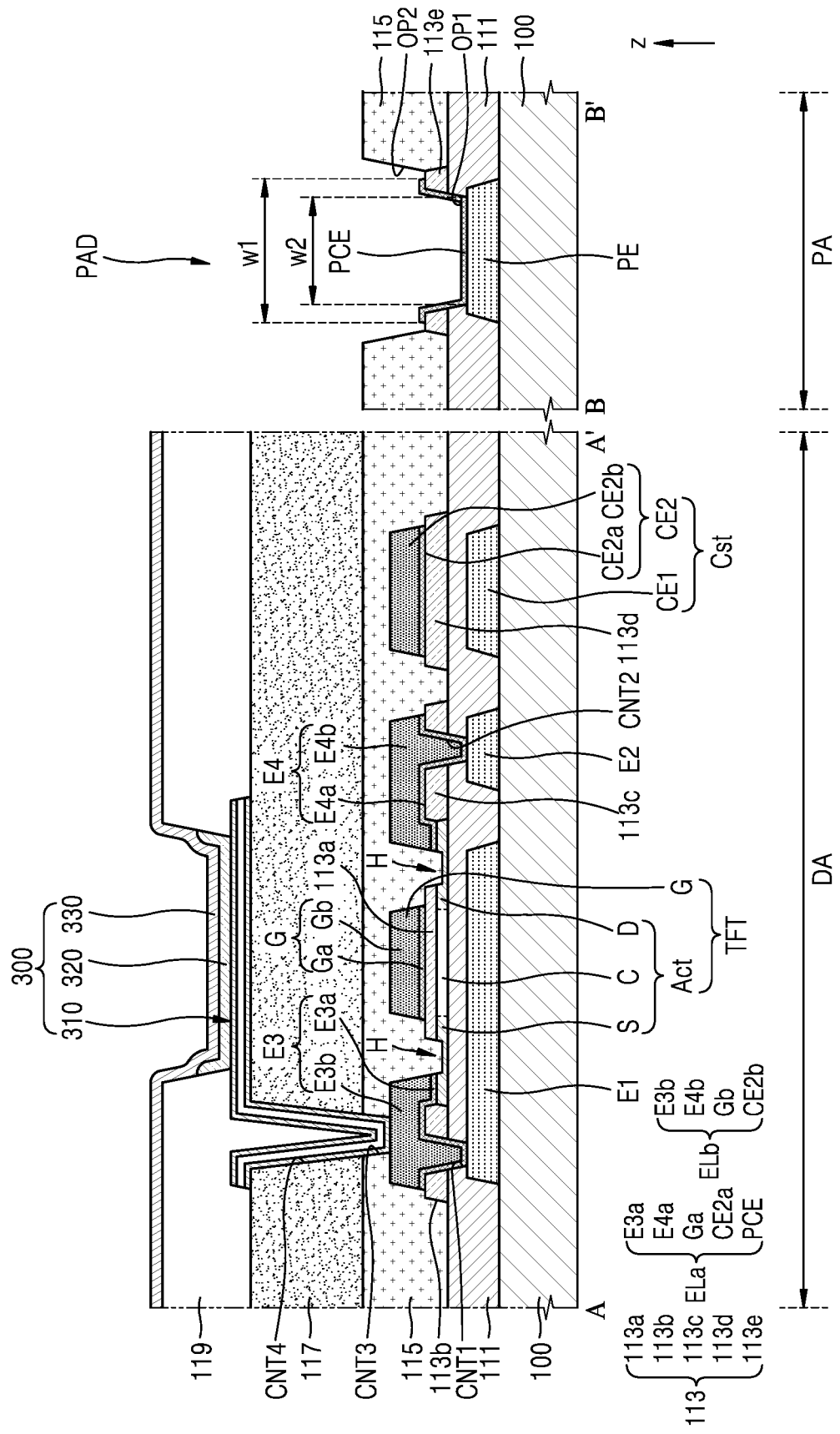
FIG. 13 is a schematic cross-sectional view of a display area and a pad unit of FIG. 1 taken along lines A-A' and B-B', respectively.

FIG. 13 is a schematic cross-sectional view of a display apparatus according to an embodiment. In detail, FIG. 13 is a schematic cross-sectional view of the display area DA and the pad unit PAD of FIG. 1 taken along lines A-A' and B-B', respectively. The same reference numerals in FIGS. 4 and 13 denote the same elements, and thus repeated descriptions thereof are omitted. FIG. 13 corresponds to a partial modification of FIG. 4, and thus will be described by focusing on differences from FIG. 4.

Referring to FIG. 13, a lower electrode layer ELa and an upper electrode layer ELb may be sequentially stacked each other on the gate insulating layer 113. Each of the lower electrode layer ELa and the upper electrode layer ELb may be formed of at least one metal selected from the group consisting of aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and copper (Cu). For example, the lower electrode layer ELa may be formed of titanium (Ti), and the upper electrode layer ELb may be formed of copper (Cu).

The lower electrode layer ELa may include a lower third electrode E3a, a lower gate electrode Ga, a lower fourth electrode E4a, a first upper electrode CE2a, and a pad connection electrode PCE. The upper electrode layer ELb may include an upper third electrode E3b, an upper gate electrode Gb, an upper fourth electrode E4b, and a second upper electrode CE2b.

The lower third electrode E3a and the upper third electrode E3b may be included in the third electrode E3, the lower gate electrode Ga and the upper gate electrode Gb may be included in the gate electrode G, the lower fourth electrode E4a and the upper fourth electrode E4b may be included in the fourth electrode E4, and the first upper electrode CE2a and the second upper electrode CE2b may be included in the upper electrode CE2 of the storage capacitor Cst.

According to an embodiment, the pad connection electrode PCE may at least partially electrically contact the pad electrode PE. The first opening OP1 exposing at least a portion of the pad electrode PE may be formed in the first insulating layer 111, and a portion of the pad connection electrode PCE may electrically contact the pad electrode PE within the first opening OP1.

According to an embodiment, as shown in FIG. 13, a width w1 of the pad connection electrode PCE in one direction may be greater than a width w2 of the pad electrode PE exposed through the first opening OP1. The width w1 of the pad connection electrode PCE in one direction may be a width of a portion of the pad connection electrode PCE exposed through the second opening OP2. As described with reference to FIG. 1, a PCB or a driver IC chip may be attached to the pad unit PAD. A contact width between the pad unit PAD and the PCB or the driver IC chip may increase from the width w2 of the pad electrode PE exposed through the first opening OP1 to the width w1 of the pad connection electrode PCE. In other words, a contact area between the pad unit PAD and the PCB or the driver IC chip may increase. Accordingly, poor contact between the pad unit PAD and the PCB or the driver IC chip may be reduced, and the risk of defects during operation of the display apparatus 1 may be reduced.

According to an embodiment, the gate insulating layer 113 may further include a fifth portion 113e. As shown in FIG. 13, the fifth portion 113e of the gate insulating layer 113 may be disposed between a portion of the pad connection electrode PCE and the first insulating layer 111.

FIGS. 14A through 14F are schematic cross-sectional views schematically illustrating a method of manufacturing a display apparatus according to an embodiment, based on FIG. 13. FIGS. 14A through 14F correspond to a partial modification of FIGS. 6A through 6K, and thus will be described by focusing on differences from FIGS. 6A through 6K.

Figure 14A:
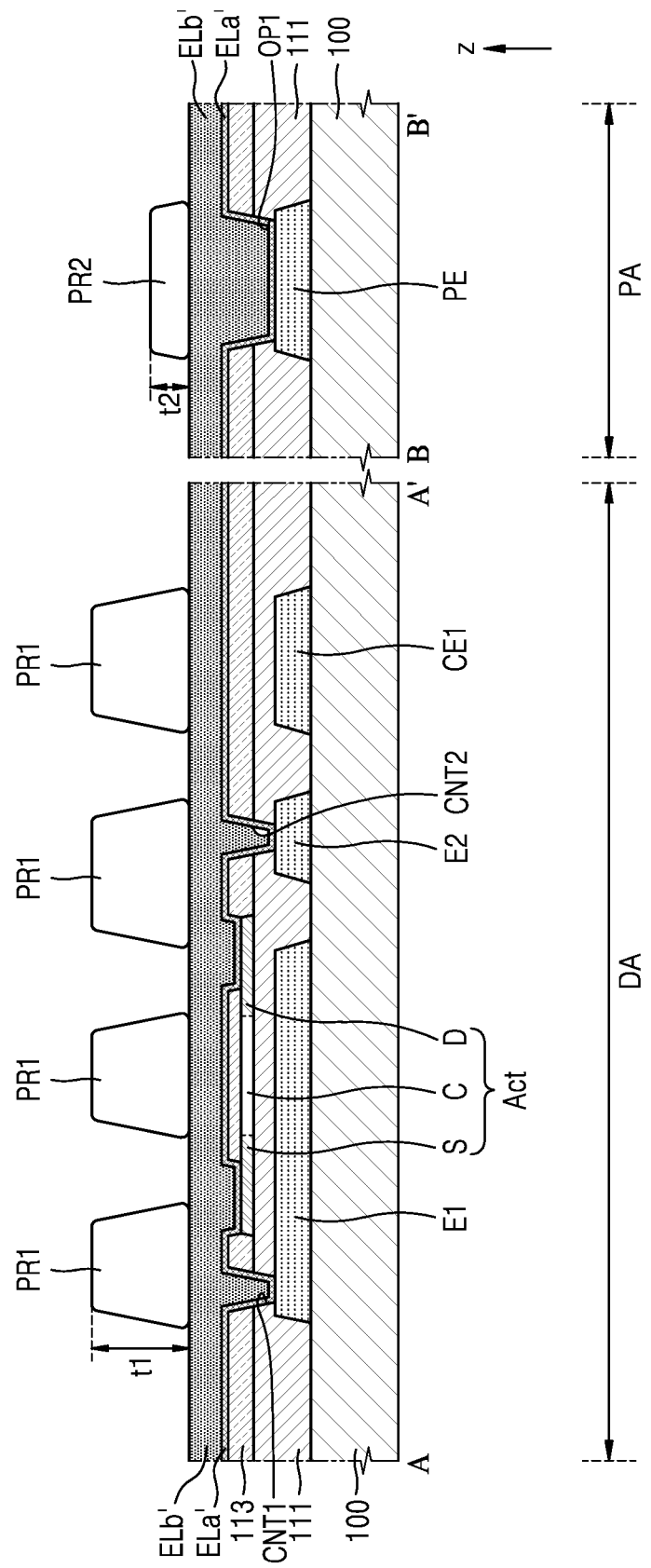
FIGS. 14A through 14F are schematic cross-sectional views schematically illustrating, based on FIG. 13, a method of manufacturing a display apparatus according to an embodiment.

Referring to FIG. 14A, the third electrode E3, the gate electrode G, the fourth electrode E4, the upper electrode CE2 of the storage capacitor Cst, and the pad connection electrode PCE may be formed by patterning a preliminary lower electrode layer ELa' and a preliminary upper electrode layer ELb'.

The preliminary lower electrode layer ELa' and the preliminary upper electrode layer ELb' are sequentially formed on the gate insulating layer 113. Processes before the preliminary lower electrode layer ELa' and the preliminary upper electrode layer ELb' are sequentially formed on the gate insulating layer 113 may be the same as FIGS. 6A through 6D.

Each of the preliminary lower electrode layer ELa' and the preliminary upper electrode layer ELb' may have a single or multi-layer structure including at least one metal selected from among aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and copper (Cu), and may be formed by using a deposition method such as, but not limited to, CVD, PECVD, LPCVD, PVD, sputtering, or ALD.

A first photoresist pattern PR1 and a second photoresist pattern PR2 may be formed on the preliminary upper electrode layer ELb'. The first photoresist pattern PR1 may be located or disposed in the display area DA, and the second photoresist pattern PR2 may be located or disposed in the peripheral area PA.

According to an embodiment, a thickness t1 of the first photoresist pattern PR1 may be greater than a thickness t2 of the second photoresist pattern PR2.

Figure 14B:
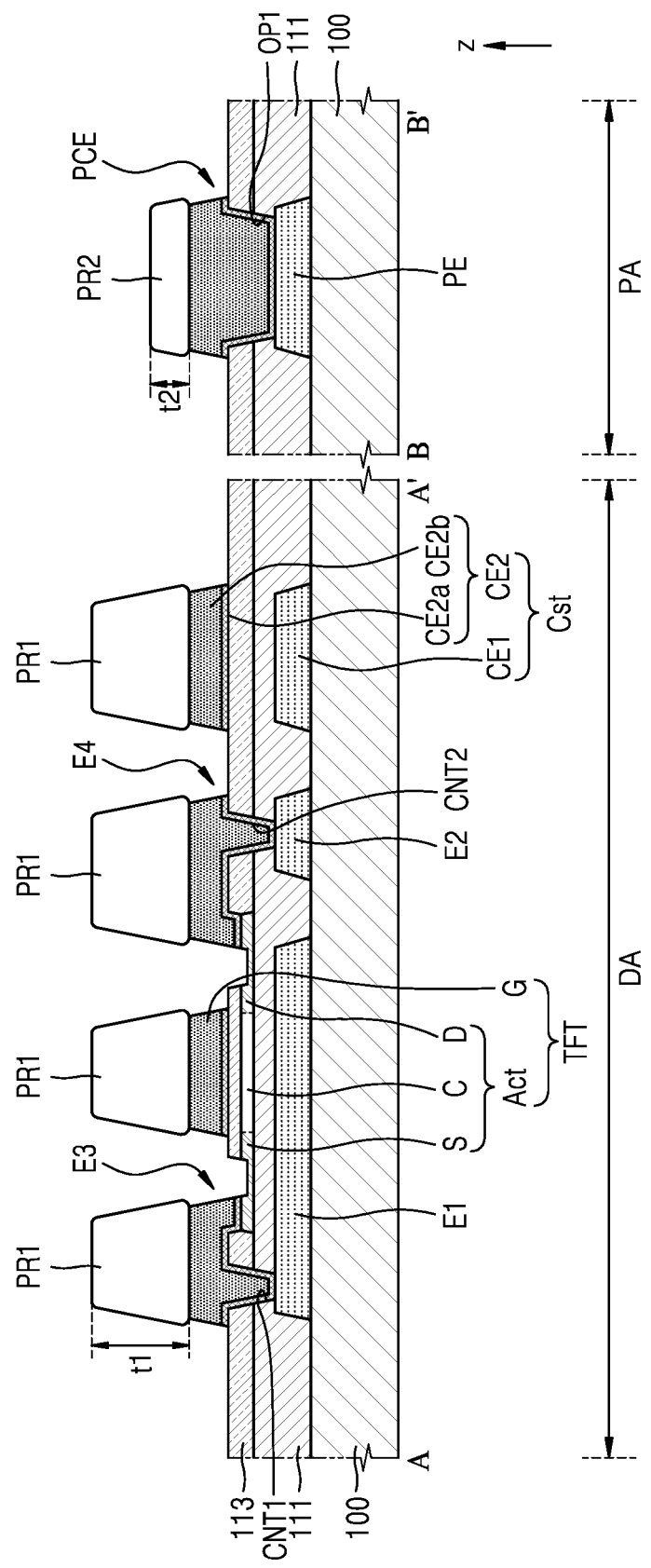

Referring to FIG. 14B, the third electrode E3, the gate electrode G, the fourth electrode E4, the upper electrode CE2 of the storage capacitor Cst, and the pad connection electrode PCE may be formed by etching the preliminary lower electrode layer ELa' and the preliminary upper electrode layer ELb' by using the first photoresist pattern PR1 and the second photoresist pattern PR2. In other words, the third electrode E3, the gate electrode G, the fourth electrode E4, the upper electrode CE2 of the storage capacitor Cst, and the pad connection electrode PCE may be formed by depositing the preliminary lower electrode layer ELa' and the preliminary upper electrode layer ELb' and performing a mask process and an etching process. For example, the etching process may be a wet etching process.

Figure 14C:
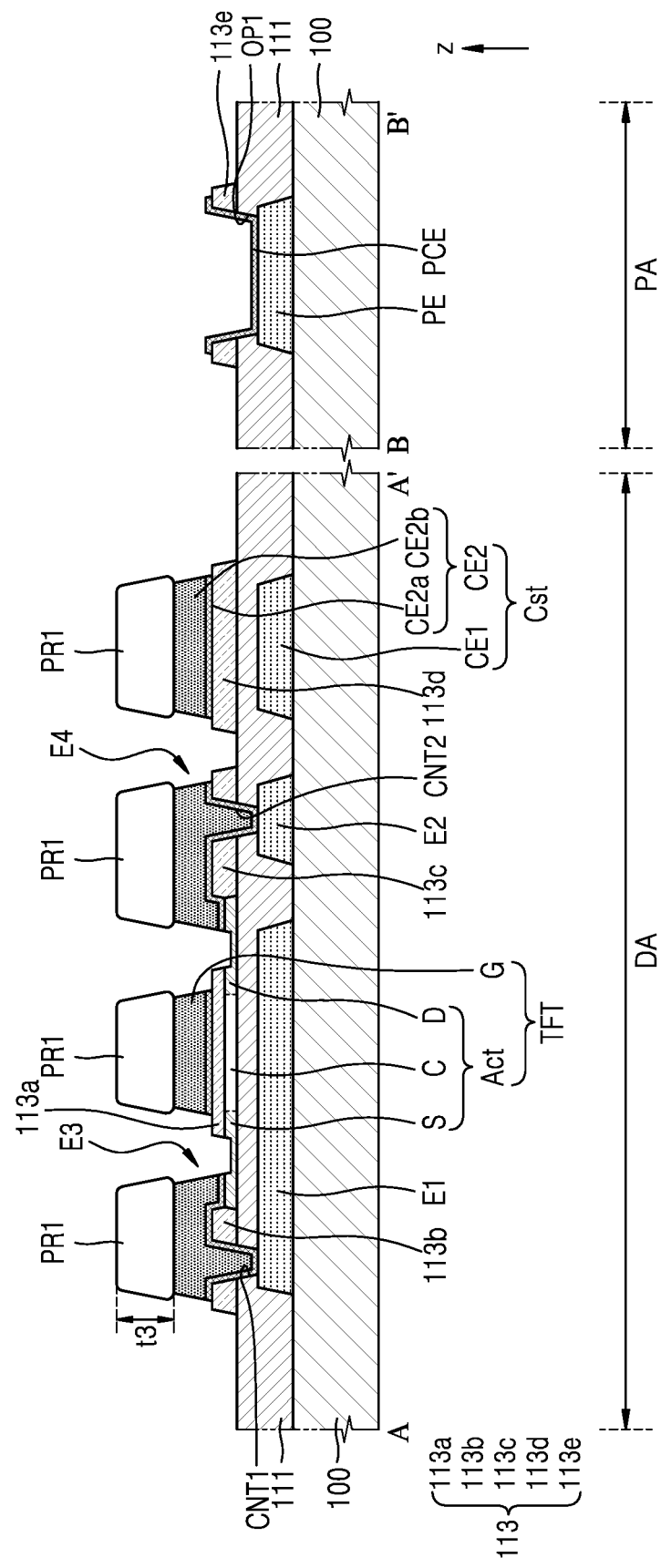

Referring to FIG. 14C, the gate insulating layer 113 may be patterned by performing an etching process in a state where the first photoresist pattern PR1 and the second photoresist pattern PR2 are not removed. Consequently, a portion of the gate insulating layer 113 may be disposed between a portion of the pad connection electrode PCE and the first insulating layer 111.

The second photoresist pattern PR2 may be removed. As the second photoresist pattern PR2 is removed, a thickness t3 of the first photoresist pattern PR1 may be obtained by reducing the thickness t1 of the first photoresist pattern PR1 by the thickness t2 of the second photoresist pattern PR2.

After the second photoresist pattern PR2 is removed, an etching process may be performed. Through the etching process, a layer other than a layer adjacent to the pad electrode PE from among the two layers of the pad connection electrode PCE may be removed. The pad connection electrode PCE may be a single layer.

Figure 14D:
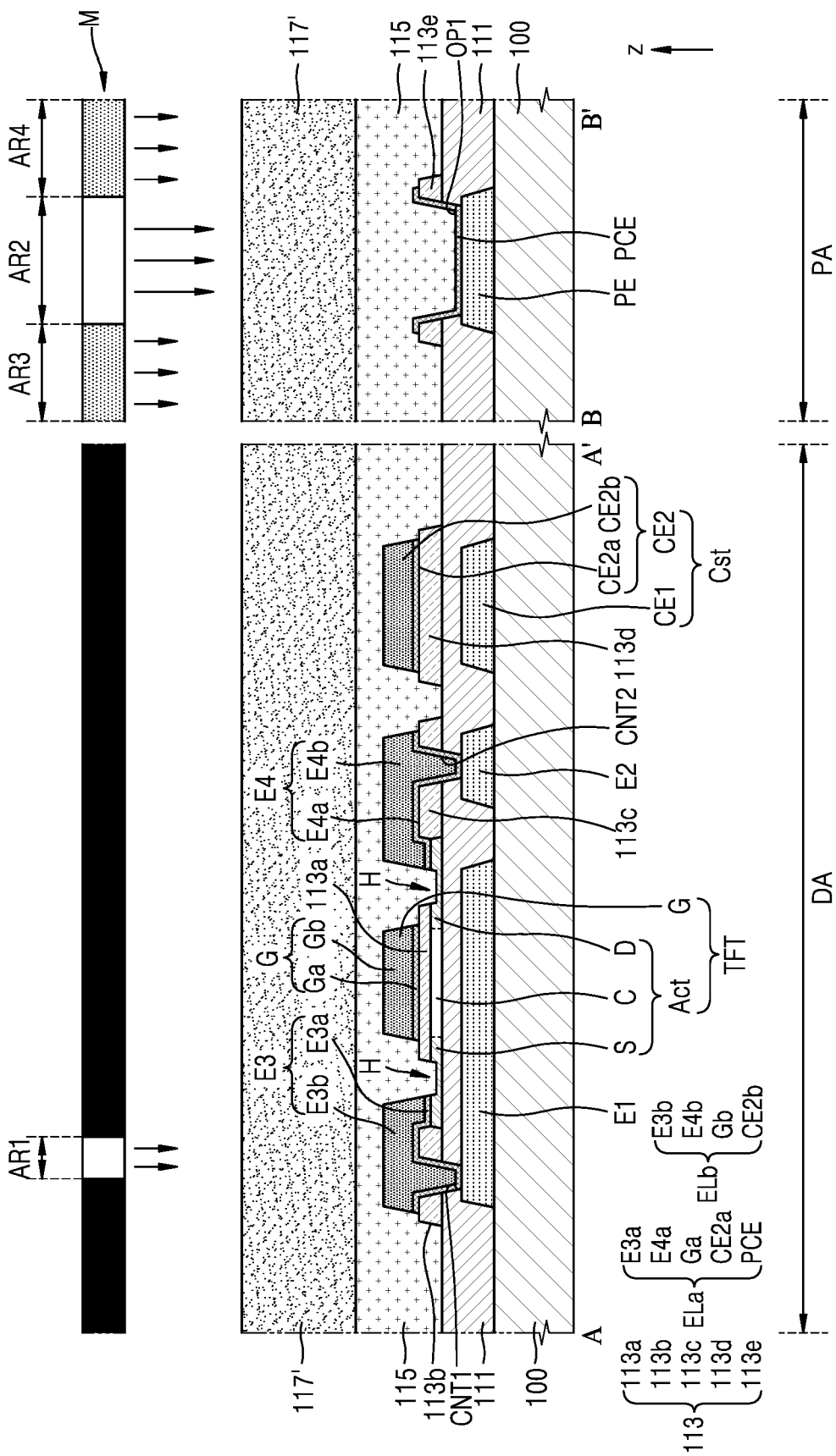

Referring to FIG. 14D, the second insulating layer 115 may be formed on the third electrode E3, the gate electrode G, the fourth electrode E4, the upper electrode CE2 of the storage capacitor Cst, and the pad connection electrode PCE. The insulating material layer 117' may be formed on the second insulating layer 115.

A mask M may be located or disposed on the insulating material layer 117'. The mask M may adjust the amount of light exposure of the insulating material layer 117' in each area. For example, the amount of light exposure of the insulating material layer 117' in a third area AR3 of the mask M may be adjusted to be less than that in the first area AR1 and the second area AR2 of the mask M. The amount of light exposure of the insulating material layer 117' in a fourth area AR4 of the mask M may be adjusted to be less than that in the first area AR1 and the second area AR2 of the mask M. For example, the mask M may be a halftone mask or a slit mask. According to an embodiment, a remaining area of the mask M except for the first area AR1, the second area AR2, the third area AR3, and the fourth area AR4 may be shielded so that the insulating material layer 117' is not exposed to light.

Figure 14E:
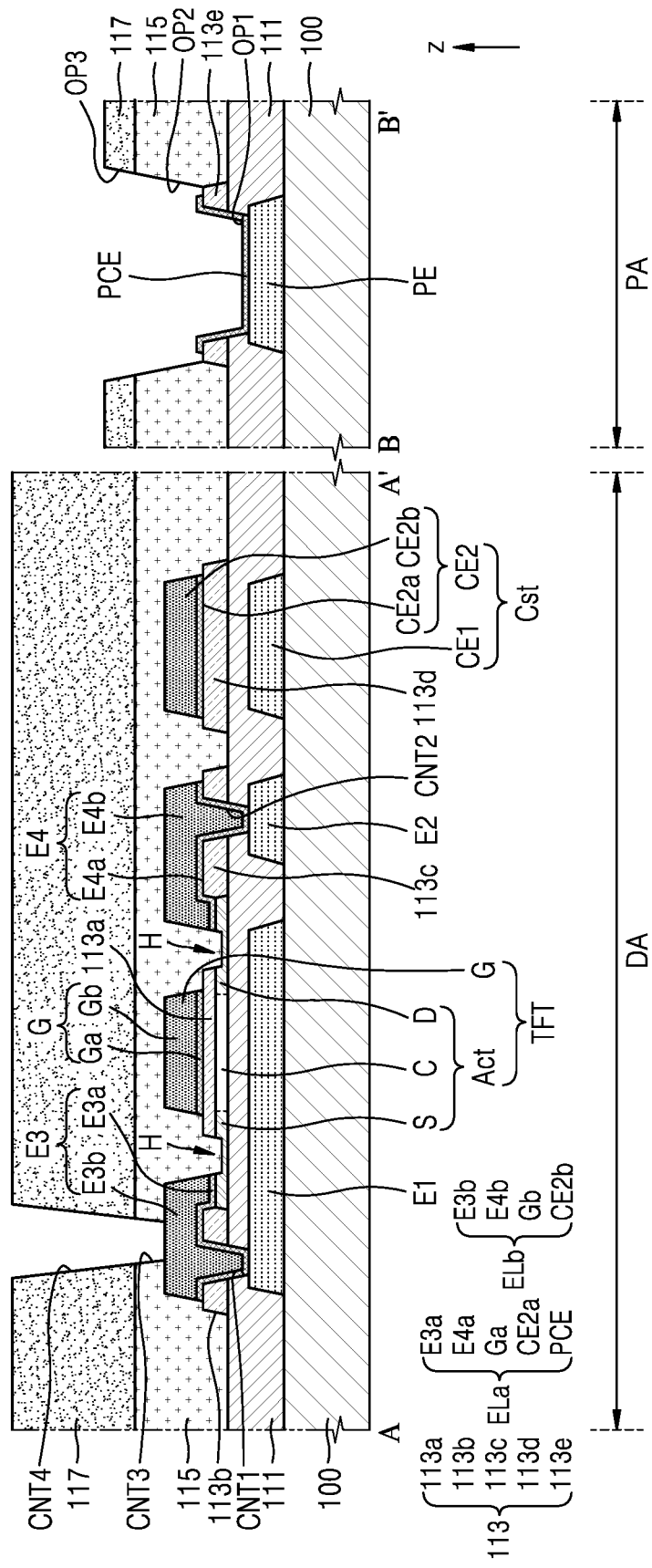

The insulating material layer 117' may be exposed to light at different amounts of light exposure through the mask M according to areas, and a portion of the insulating material layer 117' may be removed by using a developing process. Because the amount of the insulating material layer 117' that is removed varies according to the amount of light exposure, the third insulating layer 117 having different thicknesses according to areas may be formed at one time. In other words, as shown in FIG. 14E, a thickness of the third insulating layer 117 corresponding to the display area DA may be greater than a thickness of the third insulating layer 117 corresponding to the peripheral area PA. A degree of adhesion of the third insulating layer 117 to the second insulating layer 115 may be increased through a curing and drying process. The curing and drying process may include a heat treatment process.

Although the insulating material layer 117' may include a positive photoresist in FIG. 14D, the insulating material layer 117' may include a negative photoresist. In contrast to in case that the insulating material layer 117' may include a positive photoresist, a thickness of the third insulating layer 117 remaining after a developing process increases as the amount of light exposure of the insulating material layer 117' increases.

Referring to FIG. 14E, the third insulating layer 117 may have the fourth contact hole CNT4 in correspondence with a portion exposed by the first area AR1 of the mask M. The third insulating layer 117 may have the third opening OP3 in correspondence with a portion exposed by the second area AR2 of the mask M.

The third contact hole CNT3 exposing a portion of the third electrode E3 and the second opening OP2 corresponding to the third opening OP3 may be formed using the third insulating layer 117 as an etch mask. Because the second opening OP2 of the second insulating layer 115 is formed using the third insulating layer 117 as an etch mask, the substantially planar shape of the second opening OP2 may substantially correspond to that of the third opening OP3. The sidewall of the second insulating layer 115 may correspond to that of the third insulating layer 117.

Figure 14F:
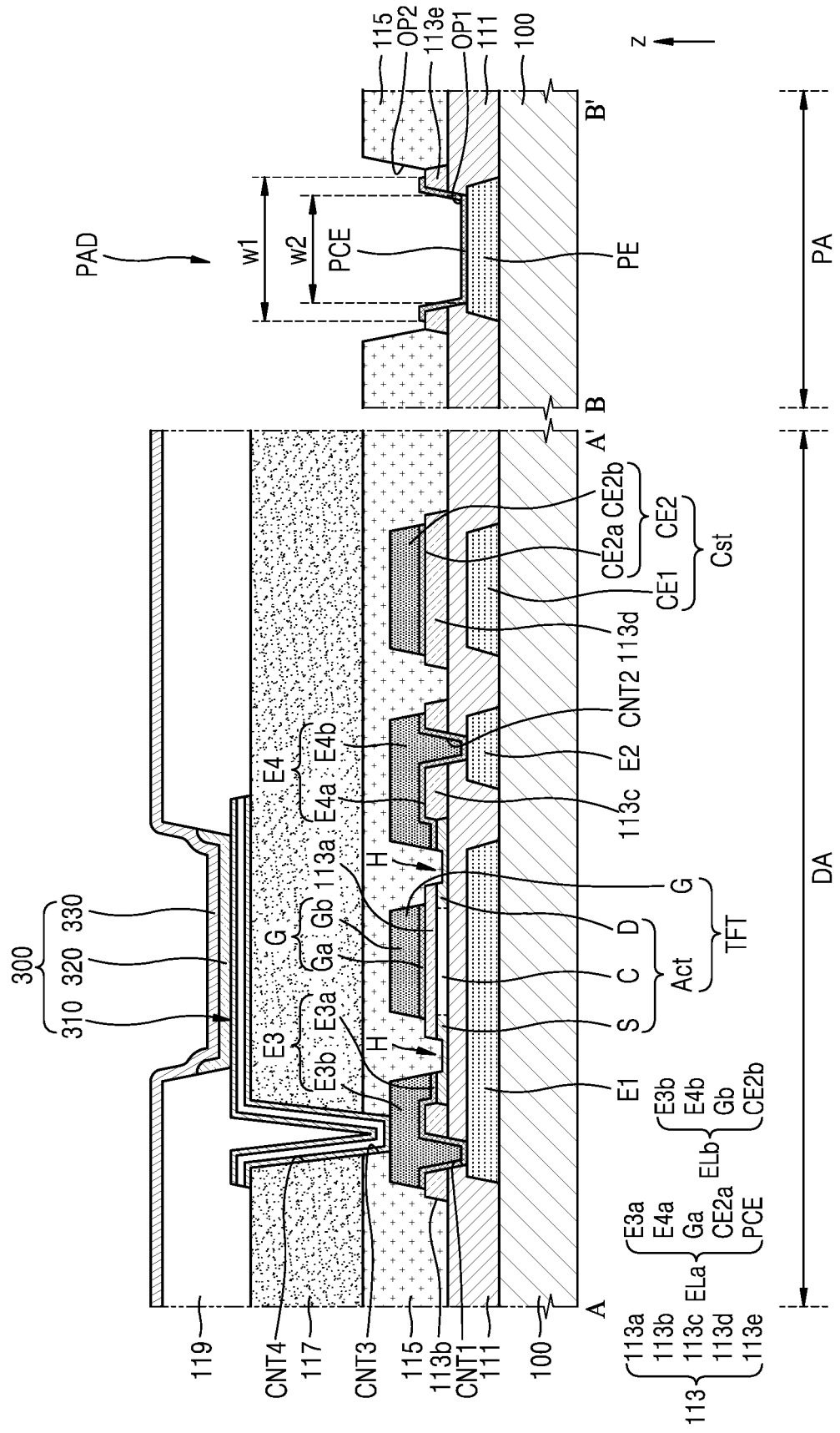

Referring to FIG. 14F, the pixel electrode 310 may be formed on the third insulating layer 117. The pixel electrode 310 may be formed by depositing a pixel electrode material layer on the entire upper surface of the third insulating layer 117 and performing a mask process and an etching process.

The pixel defining layer 119 covering or overlapping an edge of the pixel electrode 310 and including an opening that exposes a center portion of the pixel electrode 310 may be formed on the entire upper surface of the third insulating layer 117. The pixel defining layer 119 may be formed of at least one organic insulating material selected from the group consisting of polyimide, polyamide, acryl resin, benzocyclobutene, and a phenolic resin, by using a method such as spin coating.

The intermediate layer 320 may be formed on the pixel electrode 310, namely, within the opening of the pixel defining layer 119. The intermediate layer 320 may include a low-molecular weight or high-molecular weight material. The intermediate layer 320 may be formed via vacuum deposition, screen printing, inkjet printing, LITI, or the like within the spirit and the scope of the disclosure.

The opposite electrode 330 may be formed to substantially correspond to a plurality of light-emitting devices 300. The opposite electrode 330 may be formed to cover or overlap the display area DA of the substrate 100 through an open mask. The opposite electrode 330 may be formed by using a deposition method such as CVD, PECVD, LPCVD, PVD, sputtering, or ALD.

Figure 15:
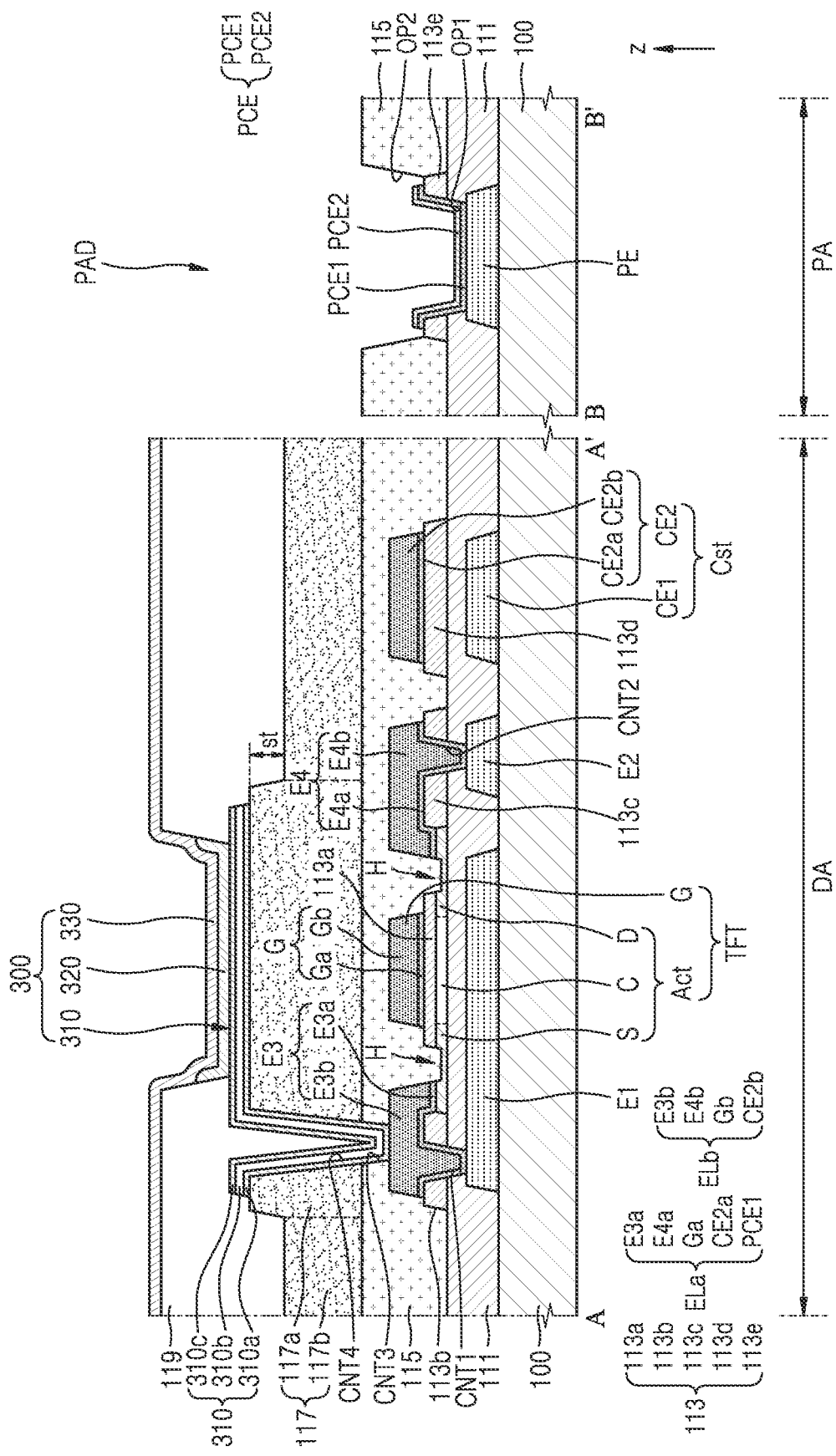
FIG. 15 is a schematic cross-sectional view of a display area and a pad unit of FIG. 1 taken along lines A-A' and B-B', respectively.

FIG. 15 is a schematic cross-sectional view of a display apparatus according to an embodiment. In detail, FIG. 15 is a schematic cross-sectional view of the display area DA and the pad unit PAD of FIG. 1 taken along lines A-A' and B-B', respectively. The same reference numerals in FIGS. 13 and 15 denote the same elements, and thus repeated descriptions thereof are omitted. FIG. 15 corresponds to a partial modification of FIG. 13, and thus will be described by focusing on differences from FIG. 13.

Referring to FIG. 15, the pad connection electrode PCE may include a first pad connection electrode PCE1 and a second pad connection electrode PCE2. The second pad connection electrode PCE2 may be located or disposed on the first pad connection electrode PCE1. Because the first pad connection electrode PCE1 corresponds to the pad connection electrode PCE of FIG. 13, the second pad connection electrode PCE2 will be focused on and described.

As described above with reference to FIG. 4, the pixel electrode 310 may have three layers. For example, the three layers of the pixel electrode 310 may be ITO/Ag/ITO. The pixel electrode 310 may include a lower pixel electrode 310a, a middle pixel electrode 310b, and an upper pixel electrode 310c. The middle pixel electrode 310b may be disposed between the lower pixel electrode 310a and the upper pixel electrode 310c.

According to an embodiment, the second pad connection electrode PCE2 may include the same material or similar material as the lower pixel electrode 310a. The second pad connection electrode PCE2 may be formed simultaneously with the lower pixel electrode 310a. The second pad connection electrode PCE2 and the lower pixel electrode 310a may be formed simultaneously by patterning a preliminary pixel electrode layer. In other words, the second pad connection electrode PCE2 and the lower pixel electrode 310a may be defined as the same pixel electrode.

Although the second pad connection electrode PCE2 may include a single layer in FIG. 15, the second pad connection electrode PCE2 may have multiple layers. For example, the second pad connection electrode PCE2 may have three layers, and may be formed simultaneously with the pixel electrode 310.

According to an embodiment, the third insulating layer 117 may include the first portion 117a, and the second portion 117b extending from the first portion 117a.

According to an embodiment, a thickness of the first portion 117a of the third insulating layer 117 may be greater than that of the second portion 117b of the third insulating layer 117. The upper surface of the third insulating layer 117 may have the step st between the first portion 117a and the second portion 117b. A vertical distance from the upper surface of the substrate 100 to the upper surface of the first portion 117a may be different from a vertical distance from the upper surface of the substrate 100 to the upper surface of the second portion 117b. For example, as shown in FIG. 15, the vertical distance from the upper surface of the substrate 100 to the upper surface of the first portion 117a may be greater than the vertical distance from the upper surface of the substrate 100 to the upper surface of the second portion 117b.

FIGS. 16A through 16E are schematic cross-sectional views schematically illustrating a method of manufacturing a display apparatus according to an embodiment, based on FIG. 15. FIGS. 16A through 16E correspond to a partial modification of FIGS. 14A through 14F, and thus will be described by focusing on differences from FIGS. 14A through 14F.

Figure 16A:
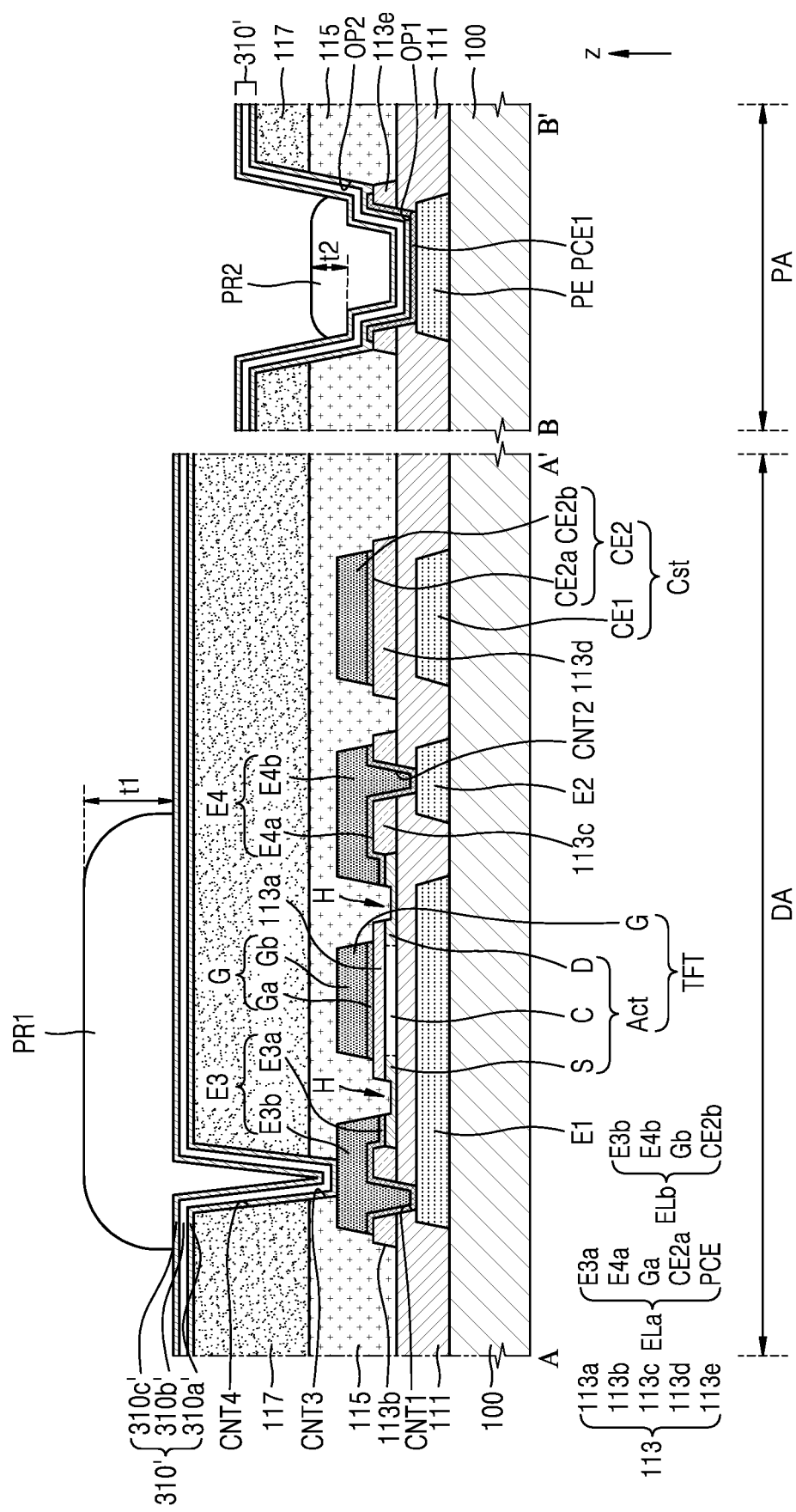
FIGS. 16A through 16E are schematic cross-sectional views schematically illustrating, based on FIG. 15, a method of manufacturing a display apparatus according to an embodiment.

Referring to FIG. 16A, the pixel electrode 310' and the second pad connection electrode PCE2 may be formed on the third insulating layer 117. The pixel electrode 310' and the second pad connection electrode PCE2 may be formed by patterning a preliminary first pixel electrode layer 310a', a preliminary second pixel electrode layer 310b', and a preliminary third pixel electrode layer 310c'.

The preliminary first pixel electrode layer 310a', the preliminary second pixel electrode layer 310b', and the preliminary third pixel electrode layer 310c' may be sequentially formed on the third insulating layer 117. Processes before the preliminary first pixel electrode layer 310a', the preliminary second pixel electrode layer 310b', and the preliminary third pixel electrode layer 310c' may be sequentially formed on the third insulating layer 117 may be the same as FIGS. 14A through 14E.

Each of the preliminary first pixel electrode layer 310a', the preliminary second pixel electrode layer 310b', and the preliminary third pixel electrode layer 310c' may include a reflection layer formed of silver (Ag), magnesium (Mg), aluminum (Al), platinum (Pt), palladium (Pd), gold (Au), nickel (Ni), neodymium (Nd), iridium (Ir), chromium (Cr), or a compound thereof, and a transparent or semi-transparent electrode layer formed on the reflection layer. The transparent or semi-transparent electrode layer may include at least one selected from the group consisting of indium tin oxide (ITO), indium zinc oxide (IZO), zinc oxide (ZnO), indium oxide ($In_2O_3$), indium gallium oxide (IGO), and aluminum zinc oxide (AZO). The preliminary first pixel electrode layer 310a', the preliminary second pixel electrode layer 310b', and the preliminary third pixel electrode layer 310c' may be formed by using a deposition method such as CVD, PECVD, LPCVD, PVD, sputtering, or ALD.

A first photoresist pattern PR1 and a second photoresist pattern PR2 may be formed on the preliminary third pixel electrode layer 310c'. The first photoresist pattern PR1 may be located or disposed in the display area DA, and the second photoresist pattern PR2 may be located or disposed in the peripheral area PA.

According to an embodiment, the thickness t1 of the first photoresist pattern PR1 may be greater than the thickness t2 of the second photoresist pattern PR2.

Figure 16B:
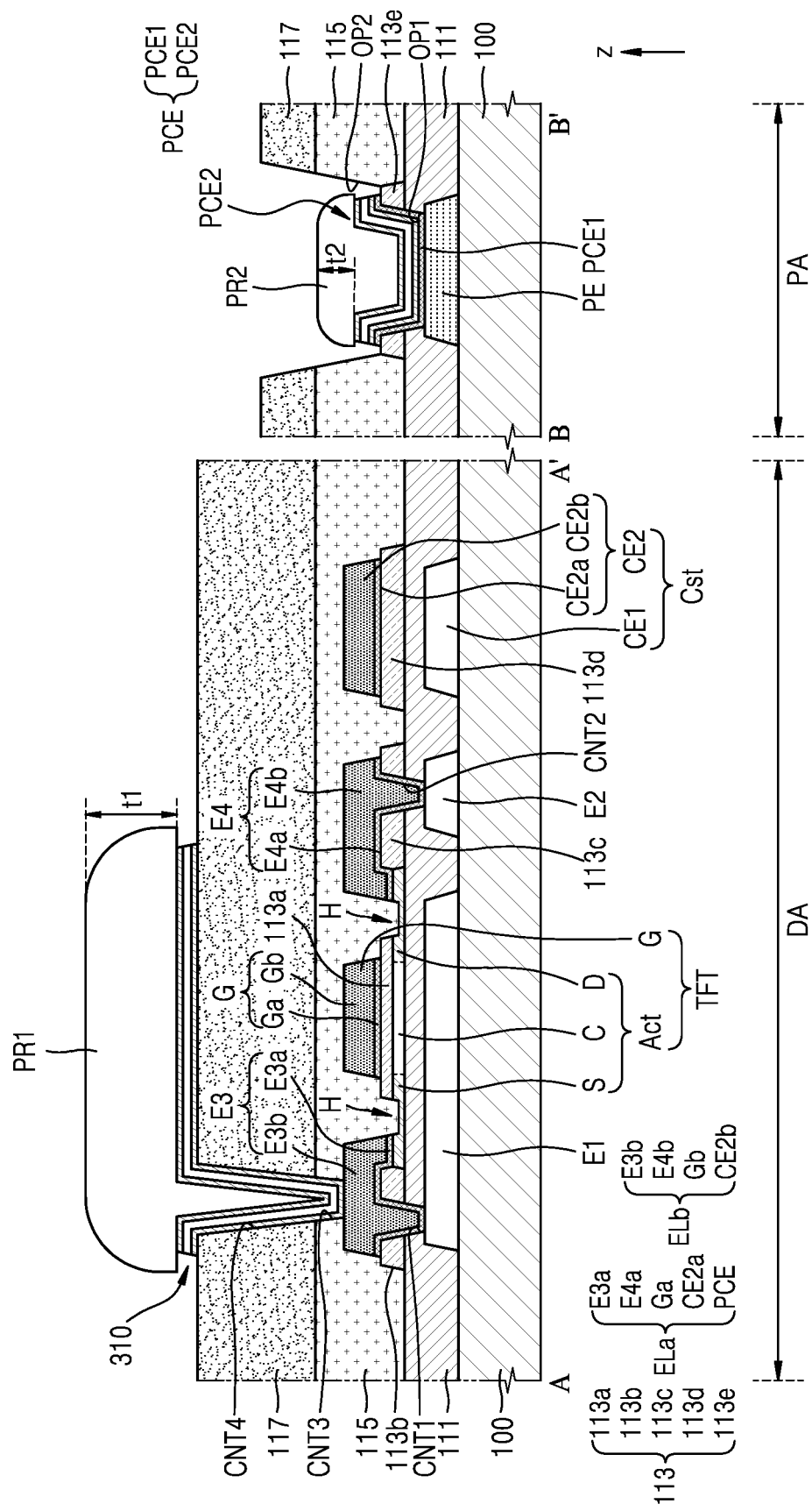

Referring to FIG. 16B, the pixel electrode 310 and the second pad connection electrode PCE2 may be formed by etching the preliminary first pixel electrode layer 310a', the preliminary second pixel electrode layer 310b', and the preliminary third pixel electrode layer 310c' by using the first photoresist pattern PR1 and the second photoresist pattern PR2. In other words, the pixel electrode 310 and the second pad connection electrode PCE2 may be formed by depositing the preliminary first pixel electrode layer 310a', the preliminary second pixel electrode layer 310b', and the preliminary third pixel electrode layer 310c' and performing a mask process and an etching process. For example, the etching process may be a wet etching process.

Figure 16C:
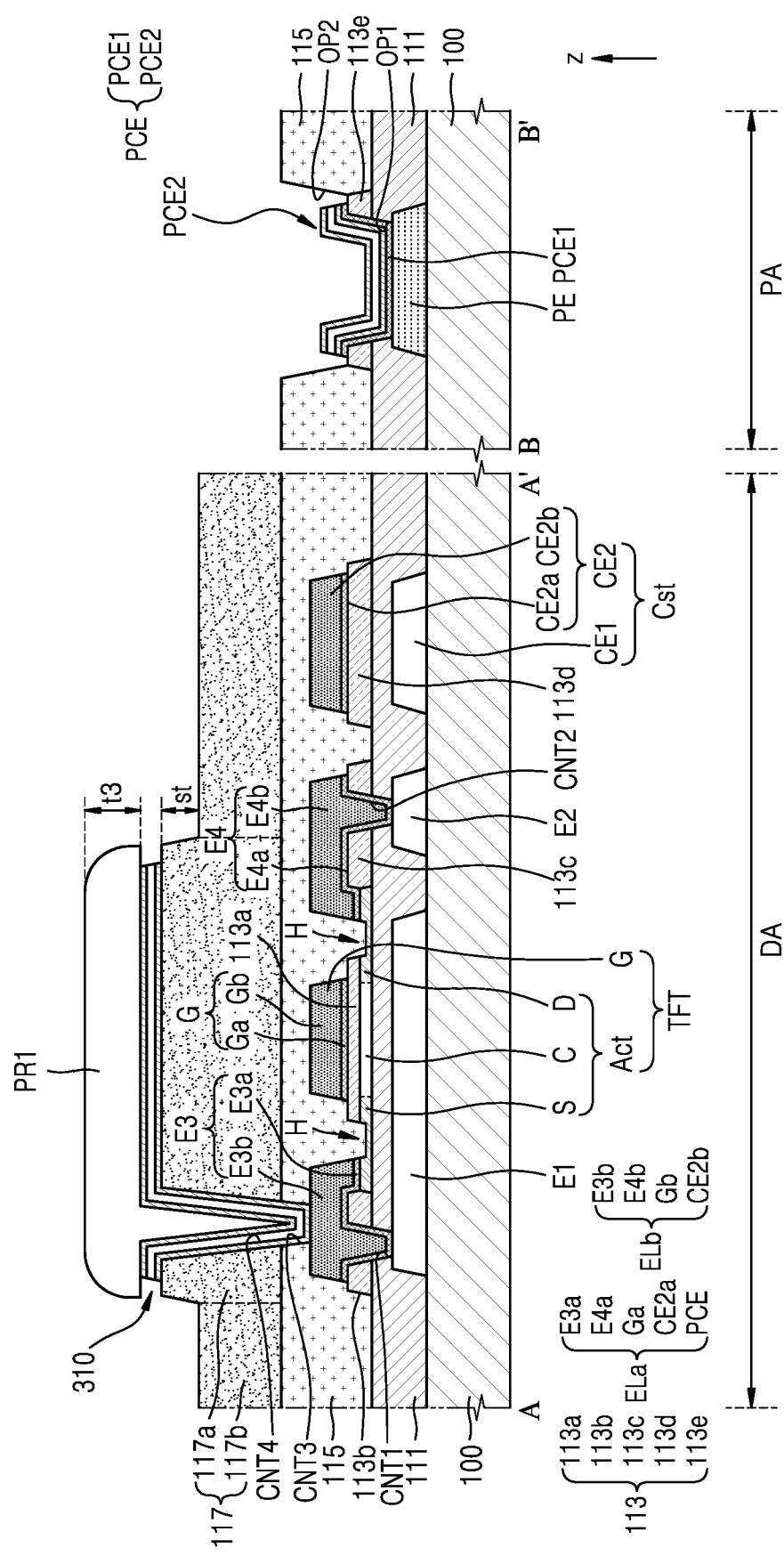

Referring to FIG. 16C, the second photoresist pattern PR2 may be removed. As the second photoresist pattern PR2 is removed, a thickness t3 of the first photoresist pattern PR1 may be obtained by reducing the thickness t1 of the first photoresist pattern PR1 by the thickness t2 of the second photoresist pattern PR2. A portion of the third insulating layer 117 is etched during the removal of the second photoresist pattern PR2, and thus the third insulating layer 117 may have the step st. The first portion 117a of the third insulating layer 117 may correspond to a portion protected by the first photoresist pattern PR1 during the etching process, and the second portion 117b of the third insulating layer 117 may correspond to a portion not protected by the first photoresist pattern PR1 or the second photoresist pattern PR2 during the etching process. The upper surface of the third insulating layer 117 may have the step st between the first portion 117a and the second portion 117b due to the first photoresist pattern PR1.

Figure 16D:
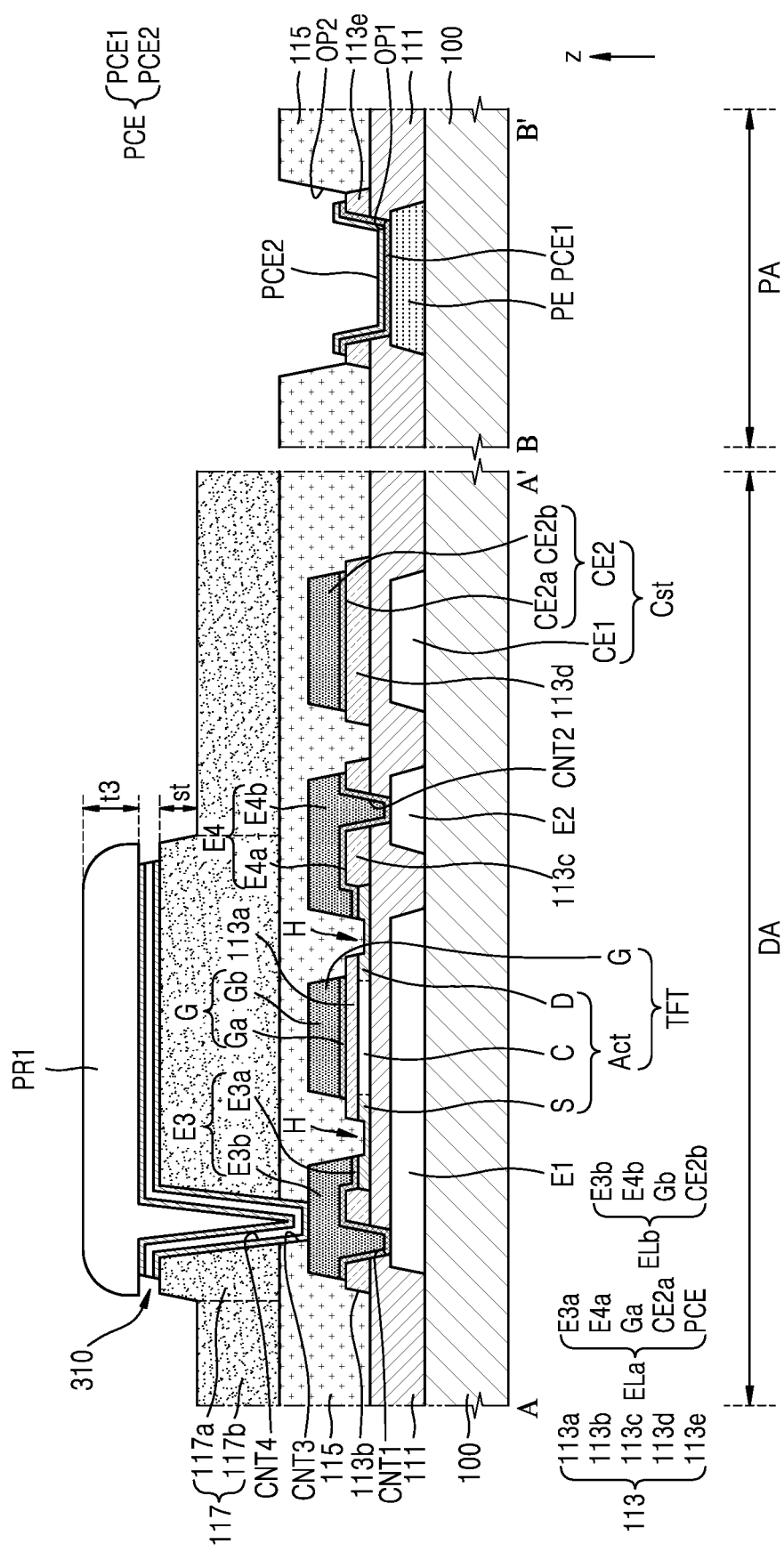

Referring to FIG. 16D, after the second photoresist pattern PR2 is removed, an etching process may be performed. Through the etching process, two layers other than a layer adjacent to the pad electrode PE from among three layers of the second pad connection electrode PCE2 may be removed. The second pad connection electrode PCE2 may be a single layer.

As a comparative example, a pad connection electrode may be maintained as three layers. In case that the pad connection electrode may include three layers, the pad connection electrode may be formed of ITO/Ag/ITO. The pad connection electrode may be exposed without being covered or overlapped by an insulating layer. Silver (Ag) having a high reaction rate may be exposed and there is a risk of a short-circuit with a neighboring or adjacent electrode.

However, according to an embodiment, in case that two of the three layers of the second pad connection electrode PCE2 are removed, only ITO exists in the exposed second pad connection electrode PCE2 and the risk of a short-circuit with a neighboring electrode is prevented.

Figure 16E:
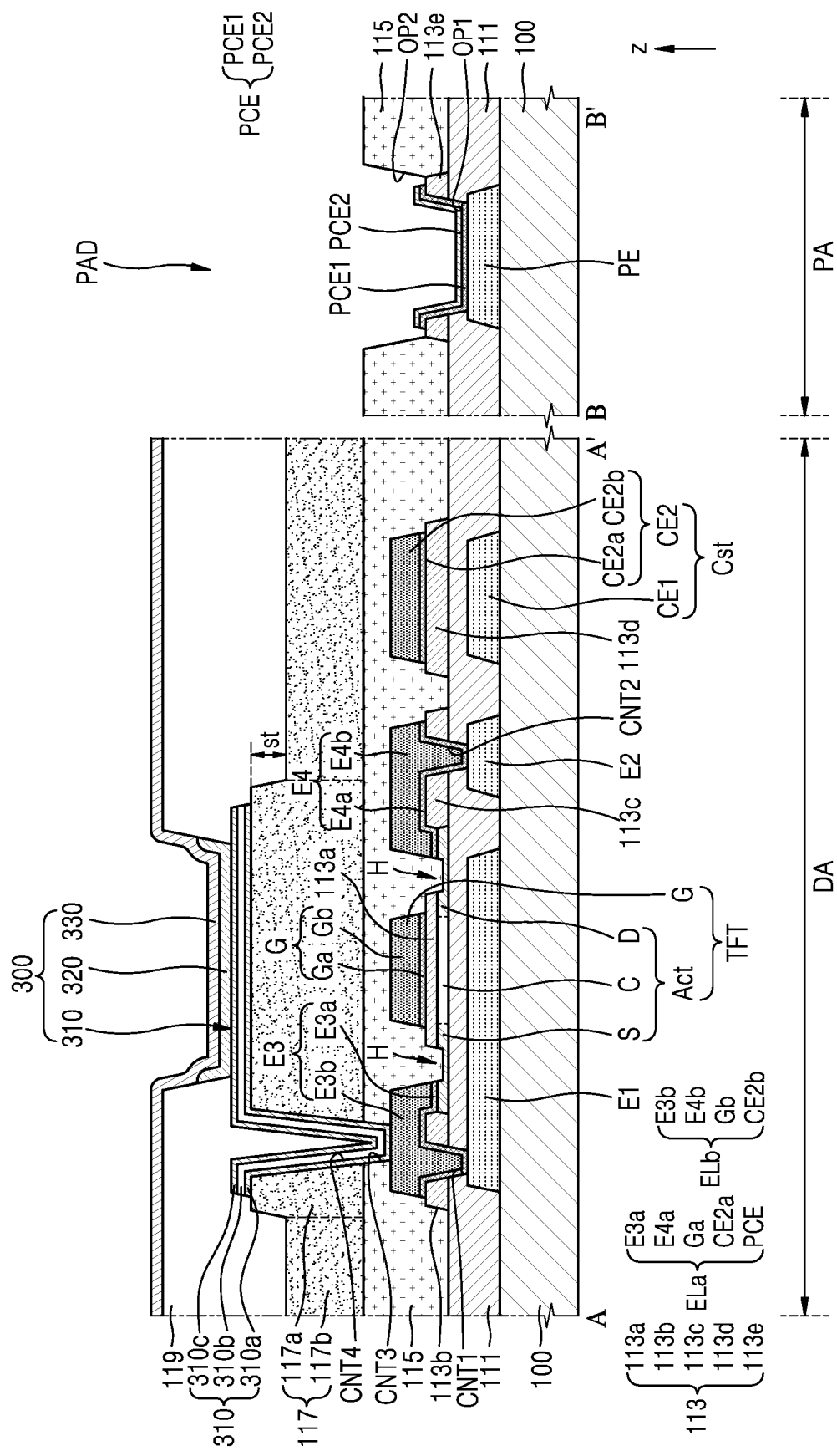

Referring to FIG. 16E, the pixel electrode 310 may be formed on the third insulating layer 117. The pixel electrode 310 may be formed by depositing a pixel electrode material layer on the entire upper surface of the third insulating layer 117 and performing a mask process and an etching process.

The pixel defining layer 119 covering or overlapping an edge of the pixel electrode 310 and including an opening that exposes a center portion of the pixel electrode 310 may be formed on the entire upper surface of the third insulating layer 117. The pixel defining layer 119 may be formed of at least one organic insulating material selected from the group consisting of polyimide, polyamide, acryl resin, benzocyclobutene, and a phenolic resin, by using a method such as spin coating.

The intermediate layer 320 may be formed on the pixel electrode 310, namely, within the opening of the pixel defining layer 119. The intermediate layer 320 may include a low-molecular weight or high-molecular weight material. The intermediate layer 320 may be formed via vacuum deposition, screen printing, inkjet printing, LITI, or the like within the spirit and the scope of the disclosure.

The opposite electrode 330 may be formed to correspond to a plurality of light-emitting devices 300. The opposite electrode 330 may be formed to cover or overlap the display area DA of the substrate 100 through an open mask. The opposite electrode 330 may be formed by using a deposition method such as CVD, PECVD, LPCVD, PVD, sputtering, or ALD.

Figure 17:
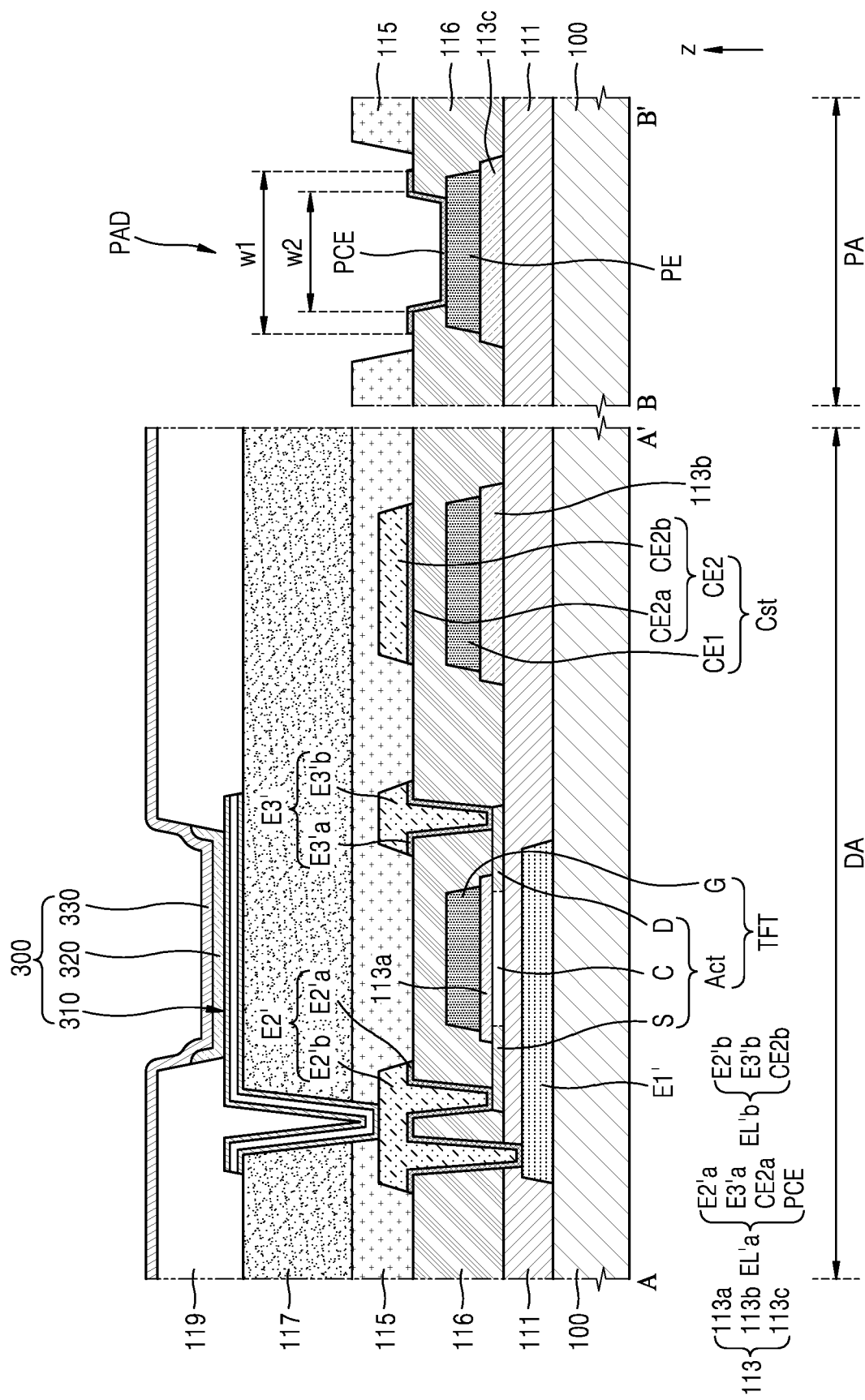
FIG. 17 is a schematic cross-sectional view of a display area and a pad unit of FIG. 1 taken along lines A-N and B-B', respectively.

FIG. 17 is a schematic cross-sectional view of a display apparatus according to an embodiment. In detail, FIG. 17 is a schematic cross-sectional view of the display area DA and the pad unit PAD of FIG. 1 taken along lines A-A' and B-B', respectively.

Referring to FIG. 17, the display apparatus 1 (see FIG. 1) may include a thin-film transistor TFT located or disposed on the substrate 100 corresponding to the display area DA and the pad unit PAD located or disposed on the substrate 100 corresponding to the peripheral area PA.

The thin-film transistor TFT may include the semiconductor layer Act, and the gate electrode G at least partially overlapping the semiconductor layer Act. The pad electrode PE may be located or disposed in the pad unit PAD, and the pad electrode PE may include the same material or similar material as the gate electrode G. The pad electrode PE may be located or disposed on the same layer as the layer on which the gate electrodes G may be located or disposed.

The pad connection electrode PCE may be located or disposed on the pad electrode PE. The pad connection electrode PCE may at least partially overlap the upper surface of the pad electrode PE, and may at least partially overlap the upper surface of the pad electrode PE.

Elements included in the display apparatus 1 will now be described in more detail according to a stacked structure with reference to FIG. 17.

The substrate 100 may include a glass material, a metal material, or a material having flexible or bendable characteristics. The substrate 100 may have a single or multi-layer structure, and, in case that the substrate 100 has a multi-layer structure, the substrate 100 may further include an inorganic layer. In an embodiment, the substrate 100 may have a structure of organic material/inorganic material/organic material.

The first insulating layer 111 may reduce or prevent infiltration of a foreign material, moisture, or ambient air from below the substrate 100 and may provide a flat surface to the substrate 100. The first insulating layer 111 may include an inorganic material (such as oxide or nitride), an organic material, or an organic and inorganic compound, and may be a single layer or multiple layers of an inorganic material and an organic material.

The semiconductor layer Act may be located or disposed on the first insulating layer 111. The semiconductor layer Act may include an oxide semiconductor material. The semiconductor layer Act may include oxide of at least one selected from the group consisting of, for example, indium (In), gallium (Ga), tin (Sn), zirconium (Zr), vanadium (V), hafnium (Hf), cadmium (Cd), germanium (Ge), chromium (Cr), titanium (Ti), aluminum (Al), cesium (Cs), cerium (Ce), and zinc (Zn).

For example, the semiconductor layer Act may be an InSnZnO (ITZO) semiconductor layer, an InGaZnO (IGZO) semiconductor layer, or the like within the spirit and the scope of the disclosure. Because an oxide semiconductor has a wide band gap (of about 3.1 eV), a high carrier mobility, and a low leakage current, a voltage drop is not large even in case that a driving time is long. Accordingly, a luminance change due to a voltage drop is not large even during low-frequency operation.

The semiconductor layer Act may include the channel region C, and the source region S and the drain region D respectively located or disposed on both sides of the channel region C. The semiconductor layer Act may have a single-layer or multi-layer structure.

The first electrode E1 may be disposed between the substrate 100 and the first insulating layer 111. The first electrode E1 may be located or disposed to be overlapped by the channel region C of the semiconductor layer Act. The first electrode E1 may include a conductive material including molybdenum (Mo), aluminum (Al), copper (Cu), and titanium (Ti), and may be a multi-layer or single layer including the aforementioned materials. For example, the first electrode E1 may have a multi-layer structure including Ti/Al/Ti.

The first electrode E1 may be located or disposed to be overlapped by the semiconductor layer Act including an oxide semiconductor material. Because the semiconductor layer Act including an oxide semiconductor material is weak to light, external light incident upon the substrate 100 through the first electrode E1 may induce a photocurrent in the semiconductor layer Act, thereby preventing a change in the element characteristics of the thin-film transistor TFT including an oxide semiconductor material. The first electrode E1 may be electrically connected to the source region S. Although the first electrode E1 may be electrically connected to the source region S in FIG. 17, the first electrode E1 may be electrically connected to the drain region D.

The first insulating layer 113 may be located or disposed on the semiconductor layer Act. The gate insulating layer 113 may include silicon oxide ($SiO_x$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), zinc oxide ($ZnO_2$), or the like within the spirit and the scope of the disclosure.

As shown in FIG. 17, the gate insulating layer 113 may be patterned to overlap a portion of the semiconductor layer Act. In other words, the gate insulating layer 113 may be patterned to expose the source region S and the drain region D.

A portion of the semiconductor layer Act overlapping the gate insulating layer 113 may be understood as the channel region C. The source region S and the drain region D may be subjected to a conductivity increasing process such as plasma treatment, and a portion of the semiconductor layer Act overlapping the gate insulating layer 113 (for example, the channel region C) is not exposed to the plasma treatment and thus has properties different from those of the source region S and the drain region D. In other words, by using the gate electrode G located or disposed on the gate insulating layer 113 as a self-alignment mask during the plasma treatment of the semiconductor layer Act, the channel region C that is not subjected to the plasma treatment may be formed at a position overlapping the gate insulating layer 113 and the source region S and the drain region D that are subjected to the plasma treatment may be respectively formed on both sides of the channel region C.

According to an embodiment, the gate insulating layer 113 may not be patterned to overlap a portion of the semiconductor layer Act, and may be located or disposed on an entire surface of the substrate 100 to cover or overlap the semiconductor layer Act.

The gate electrode G may be located or disposed on the gate insulating layer 113 to at least partially overlap the semiconductor layer Act. The lower electrode CE1 of the storage capacitor Cst and the pad electrode PE may also be located or disposed on the gate insulating layer 113. For example, the gate electrode G, the lower electrode CE1 of the storage capacitor Cst, and the pad electrode PE may each be formed of at least one selected from the group consisting of aluminum (Al), platinum (Pt), palladium (Pd), silver (Ag), magnesium (Mg), gold (Au), nickel (Ni), neodymium (Nd), iridium (Ir), chrome (Cr), calcium (Ca), molybdenum (Mo), titanium (Ti), tungsten (W), and copper (Cu) in a single- or multi-layered structure.

According to an embodiment, the storage capacitor Cst may include the lower electrode CE1 and the upper electrode CE2, and may not overlap the thin-film transistor TFT and may be separately located or disposed as shown in FIG. 17. For example, the storage capacitor Cst may overlap the thin-film transistor TFT. For example, the gate electrode G of the thin-film transistor TFT may function as the lower electrode CE1 of the storage capacitor Cst.

The interlayer insulating layer 116 may cover or overlap the semiconductor layer Act, the gate electrode G, the lower electrode CE1 of the storage capacitor Cst, and the pad electrode PE. The interlayer insulating layer 116 may include silicon oxide ($SiO_x$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), zinc oxide ($ZnO_2$), or the like within the spirit and the scope of the disclosure. The interlayer insulating layer 116 may have an opening that at least partially exposes the upper surface of the pad electrode PE.

A lower electrode layer EL'a and an upper electrode layer EL'b may be sequentially stacked each other on the interlayer insulating layer 116. Each of the lower electrode layer EL'a and the upper electrode layer EL'b may be formed of at least one metal selected from the group consisting of aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and copper (Cu). For example, the lower electrode layer EL'a may be formed of titanium (Ti), and the upper electrode layer EL'b may be formed of copper (Cu).

The lower electrode layer EL'a may include a lower second electrode E2'a, a lower third electrode E3'a, a first upper electrode CE2a, and the pad connection electrode PCE. The upper electrode layer EL'b may include an upper second electrode E2'b, an upper third electrode E3'b, and a second upper electrode CE2b.

The lower second electrode E2'a and the upper second electrode E2'b may be included in the second electrode E2, the lower third electrode E3'*a* and the upper third electrode E3'*b* may be included in the third electrode E3, and the first upper electrode CE2*a* and the second upper electrode CE2*b* may be included in the upper electrode CE2 of the storage capacitor Cst.

According to an embodiment, the pad connection electrode PCE may at least partially electrically contact the pad electrode PE. An opening exposing at least a portion of the pad electrode PE may be formed in the interlayer insulating layer 116, and a portion of the pad connection electrode PCE may electrically contact the pad electrode PE within the opening.

According to an embodiment, as shown in FIG. 17, a width w1 of the pad connection electrode PCE in one direction may be greater than a width w2 of the pad electrode PE exposed through the opening. As described with reference to FIG. 1, a PCB or a driver IC chip may be attached to the pad unit PAD. A contact width between the pad unit PAD and the PCB or the driver IC chip may increase from the width w2 of the pad electrode PE exposed through the opening to the width w1 of the pad connection electrode PCE. In other words, a contact area between the pad unit PAD and the PCB or the driver IC chip may increase. Accordingly, poor contact between the pad unit PAD and the PCB or the driver IC chip may be reduced, and the risk of defects during operation of the display apparatus 1 may be reduced.

The second electrode ET and the third electrode E3' may be electrically connected to the source region S or the drain region D of the semiconductor layer Act through contact holes. The first electrode E1 may be electrically connected to the source region S or the drain region D of the semiconductor layer Act through contact holes formed in the first insulating layer 111 and the interlayer insulating layer 116.

The upper electrode CE2 of the storage capacitor Cst overlaps the lower electrode CE1 with the interlayer insulating layer therebetween, and forms a capacitance. The interlayer insulating layer 116 may function as a dielectric layer of the storage capacitor Cst.

The second electrode E2', the third electrode E3', and the upper electrode CE2 of the storage capacitor Cst may be covered with or overlapped by the second insulating layer 115. The second insulating layer 115 may be an inorganic insulating layer including an inorganic material. Polysiloxane, silicon nitride, silicon oxide, silicon oxynitride, or the like may be used as the inorganic material. The second insulating layer 115 may be a single layer or multiple layers including the aforementioned materials. For example, the second insulating layer 115 may be a single layer or multilayer of silicon nitride ($SiN_x$) and silicon oxide ($SiO_x$). The second insulating layer 115 may be employed to cover or overlap and protect some or a number of wires located or disposed on the interlayer insulating layer 116.

According to an embodiment, the second insulating layer 115 may have an opening that exposes the upper surface of the pad connection electrode PCE. The second insulating layer 115 may have an opening that exposes the upper surface and the lateral surface of the pad connection electrode PCE.

The third insulating layer 117 may be located or disposed on the second insulating layer 115 and may include a contact hole for electrically connecting the thin-film transistor TFT to the pixel electrode 310.

The third insulating layer 117 may have a single or multi-layer structure including an organic material, and provides a flat upper surface. The third insulating layer 117 may include a commercial polymer such as benzocyclobutene (BCB), polyimide, hexamethyldisiloxane (HMDSO), polymethyl methacrylate (PMMA) or polystyrene (PS), a polymer derivative having a phenol-based group, an acryl-based polymer, an imide-based polymer, an acryl ether-based polymer, an amide-based polymer, a fluorine-based polymer, a p-xylene-based polymer, a vinyl alcohol-based polymer, a blend thereof, or the like within the spirit and the scope of the disclosure.

The third insulating layer 117 may be located or disposed to expose the pad unit PAD. In other words, the third insulating layer 117 may be located or disposed to expose the peripheral area PA, and may not overlap the pad unit PAD.

As a comparative example, a planarization layer may remain on an outer portion of a display panel. The planarization layer remaining on the outer portion of the display panel may act as an external moisture penetration path, thereby causing a reliability problem such as degradation of a light-emitting device.

A light-emitting device 300 may be located or disposed on the third insulating layer 117. The light-emitting device 300 may include a pixel electrode 310, an intermediate layer 320 including an organic emission layer, and an opposite electrode 330.

The pixel electrode 310 may be a (semi) light-transmissive electrode or a reflective electrode. According to an embodiment, the pixel electrode 310 may include a reflection layer formed of silver (Ag), magnesium (Mg), aluminum (Al), platinum (Pt), palladium (Pd), gold (Au), nickel (Ni), neodymium (Nd), iridium (Ir), chromium (Cr), or a compound thereof, and a transparent or semi-transparent electrode layer formed on the reflection layer. The transparent or semi-transparent electrode layer may include at least one selected from the group consisting of indium tin oxide (ITO), indium zinc oxide (IZO), zinc oxide (ZnO), indium oxide ($In_2O_3$), indium gallium oxide (IGO), and aluminum zinc oxide (AZO). According to an embodiment, as shown in FIG. 17, the pixel electrode 310 may have three layers. For example, the three layers of the pixel electrode 310 may be ITO/Ag/ITO.

A pixel defining layer 119 may be located or disposed on the third insulating layer 117. The pixel defining layer 119 may expose an edge of the pixel electrode 310 and may have an opening that exposes a portion of the pixel electrode 310. The pixel defining layer 119 may prevent an electric arc or the like from occurring on the edge of the pixel electrode 310 by increasing a distance between the edge of the pixel electrode 310 and the opposite electrode 330 that is on the pixel electrode 310.

The pixel defining layer 119 may be formed of at least one organic insulating material selected from the group consisting of polyimide, polyamide, acryl resin, benzocyclobutene, and a phenolic resin, by using a method such as spin coating.

The intermediate layer 320 may be located or disposed in an opening defined in the pixel defining layer 119 and may include an organic emission layer. The organic emission layer may include an organic material including a fluorescent or phosphorescent material that emits red, green, blue, or white light. The organic emission layer may include a low molecular organic material or a high molecular organic material, and one or more functional layers, such as a hole transport layer (HTL), a hole injection layer (HIL), an electron transport layer (ETL), and an electron injection layer (EIL), may be further located or disposed below and above the organic emission layer.

The opposite electrode 330 may be a light-transmissive electrode or a reflective electrode. According to an embodiment, the opposite electrode 330 may be a transparent or semi-transparent electrode, and may include a metal thin film having a small work function, including lithium (Li), calcium (Ca), lithium fluoride/calcium (LiF/Ca), lithium fluoride/aluminum (LiF/Al), aluminum (Al), silver (Ag), magnesium (Mg), or a compound thereof. A transparent conductive oxide (TCO) layer including, for example, ITO, IZO, ZnO, or $In_2O_3$, may be further located or disposed on the metal thin film. The opposite electrode 330 may extend over the display region DA, and may be located or disposed on the intermediate layer 320 and the pixel defining layer 119. The opposite electrode 330 may be formed as a single body that constitutes a plurality of light-emitting devices 300, and thus may correspond to a plurality of pixel electrodes 310.

FIGS. 18A through 18G are schematic cross-sectional views schematically illustrating a method of manufacturing a display apparatus according to an embodiment, based on FIG. 17.

Figure 18A:
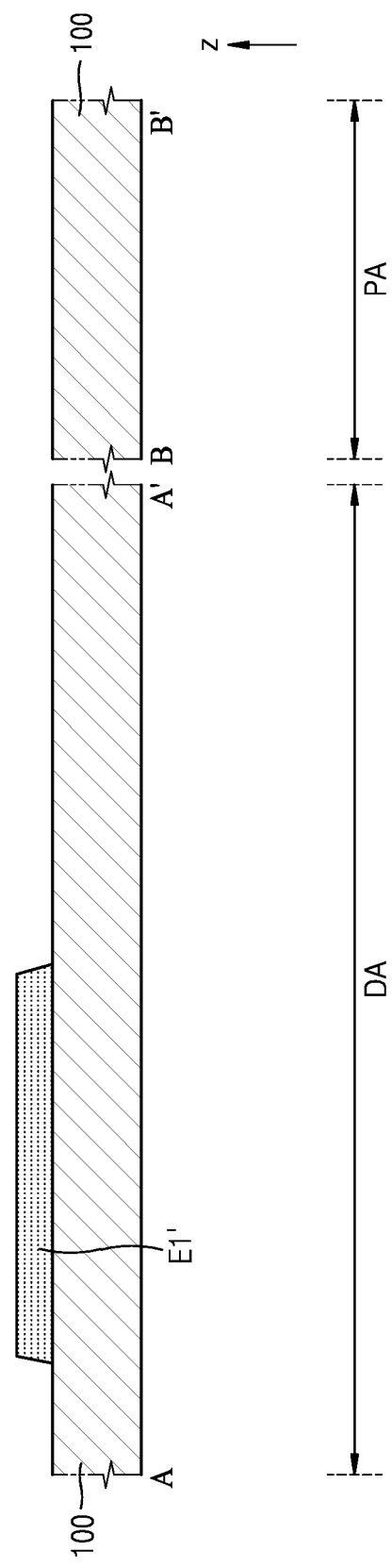
FIGS. 18A through 18G are schematic cross-sectional views schematically illustrating, based on FIG. 17, a method of manufacturing a display apparatus according to an embodiment.

Referring to FIG. 18A, first, the first electrode E1' may be formed on the substrate 100. The first electrode E1' may be formed by patterning the preliminary conductive layer (not shown). The preliminary conductive layer may include a conductive material including molybdenum (Mo), aluminum (Al), copper (Cu), and titanium (Ti), and may have a multi-layer or single-layer structure including the aforementioned materials.

Figure 18B:
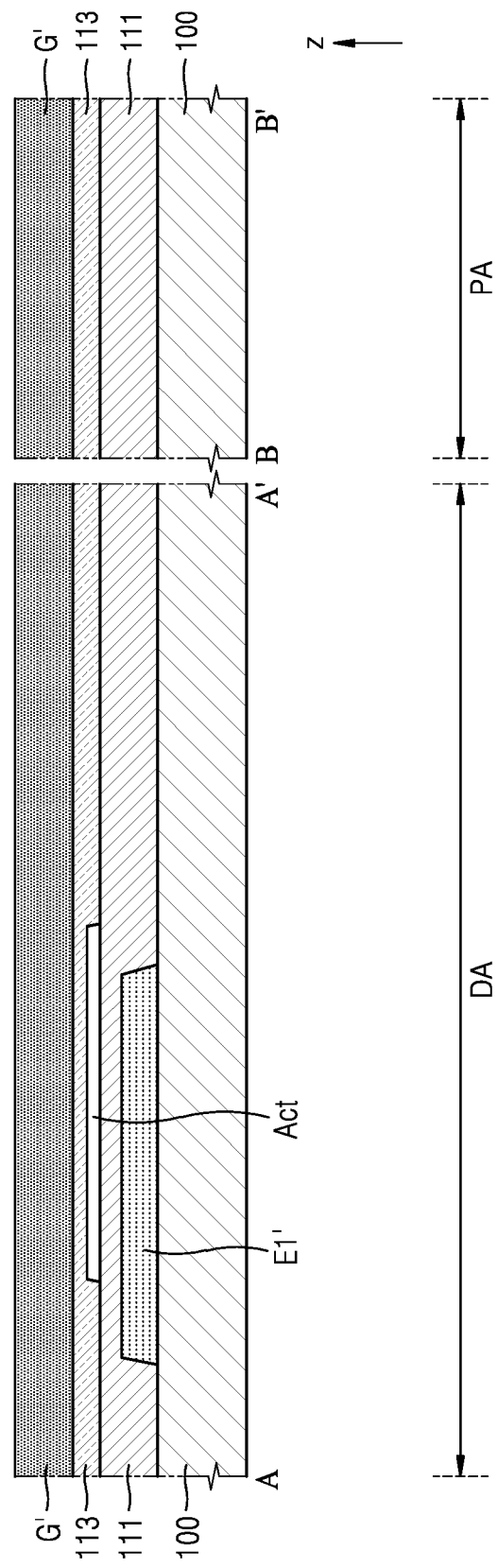

Referring to FIG. 18B, the first insulating layer 111, the semiconductor layer Act, the gate insulating layer 113, and the gate electrode G are sequentially formed on the first electrode E1'.

The first insulating layer 111 may include silicon oxide ($SiO_x$) or silicon nitride ($SiN_x$), and may be formed using a deposition method such as CVD or sputtering.

The semiconductor layer Act may be located or disposed on the first insulating layer 111. The semiconductor layer Act may be formed by patterning the preliminary semiconductor layer (not shown). The preliminary semiconductor layer may include amorphous silicon, polysilicon, or an oxide semiconductor material. The preliminary semiconductor layer may be formed by CVD.

The gate insulating layer 113 may be formed on the semiconductor layer Act. The gate insulating layer 113 may include silicon oxide ($SiO_x$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), zinc oxide ($ZnO_2$), or the like, and may be formed using a deposition method such as CVD or sputtering, but embodiments are not limited thereto.

Figure 18C:
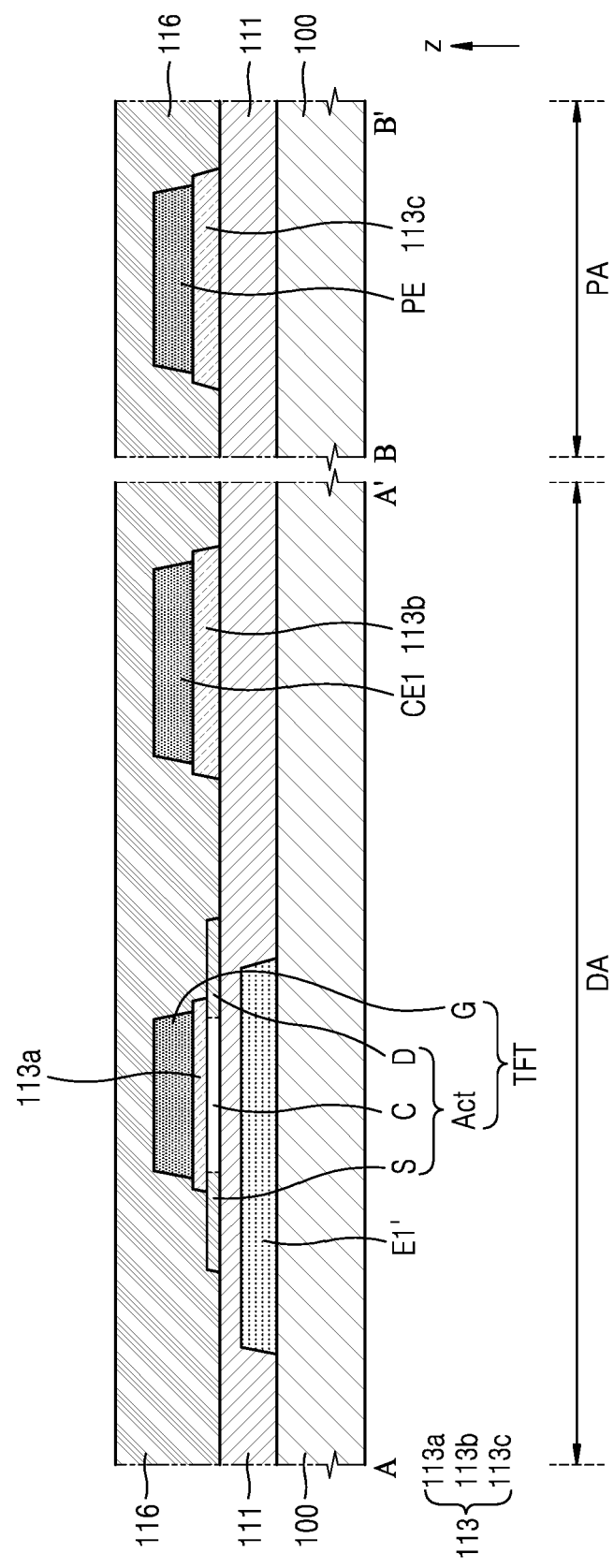

The gate electrode G, the lower electrode CE1 of the storage capacitor Cst, and the pad electrode PE may be formed on the gate insulating layer 113. As shown in FIG. 18C, the gate electrode G, the lower electrode CE1 of the storage capacitor Cst, and the pad electrode PE may be formed by patterning a preliminary gate electrode layer G'. The preliminary gate electrode layer G' may have a single or multi-layer structure including at least one metal selected from among aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and copper (Cu), and may be formed by using a deposition method such as, but not limited to, CVD, PECVD, LPCVD, PVD, sputtering, or ALD.

Referring to FIG. 18C, the interlayer insulating layer 116 may be formed on the gate electrode G, the lower electrode CE1 of the storage capacitor Cst, and the pad electrode PE.

Figure 18D:
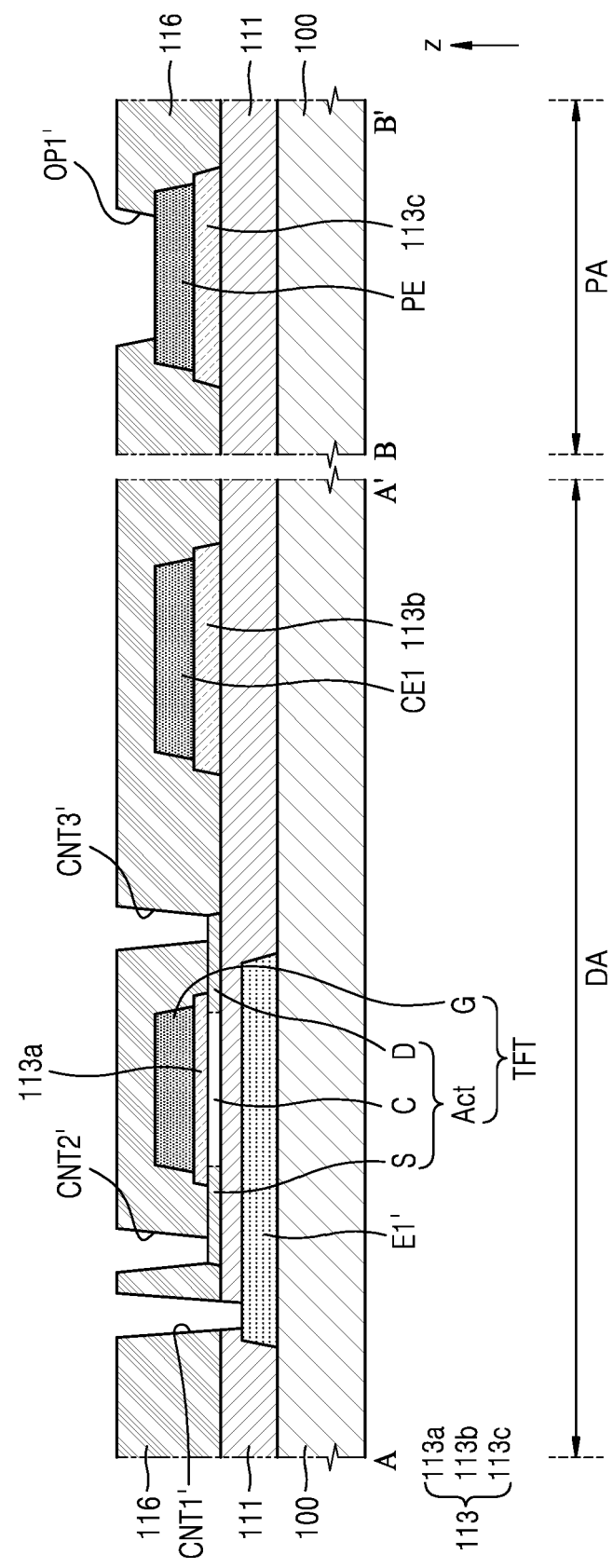

Referring to FIG. 18D, after the interlayer insulating layer 116 may be formed, a first contact hole CNT1', a second contact hole CNT2', a third contact hole CNT3', and a first opening OP1' penetrating the first insulating layer 111 and the interlayer insulating layer 116 and at least partially exposing the first electrode E1', the semiconductor layer Act, and the pad electrode PE may be formed.

Figure 18E:
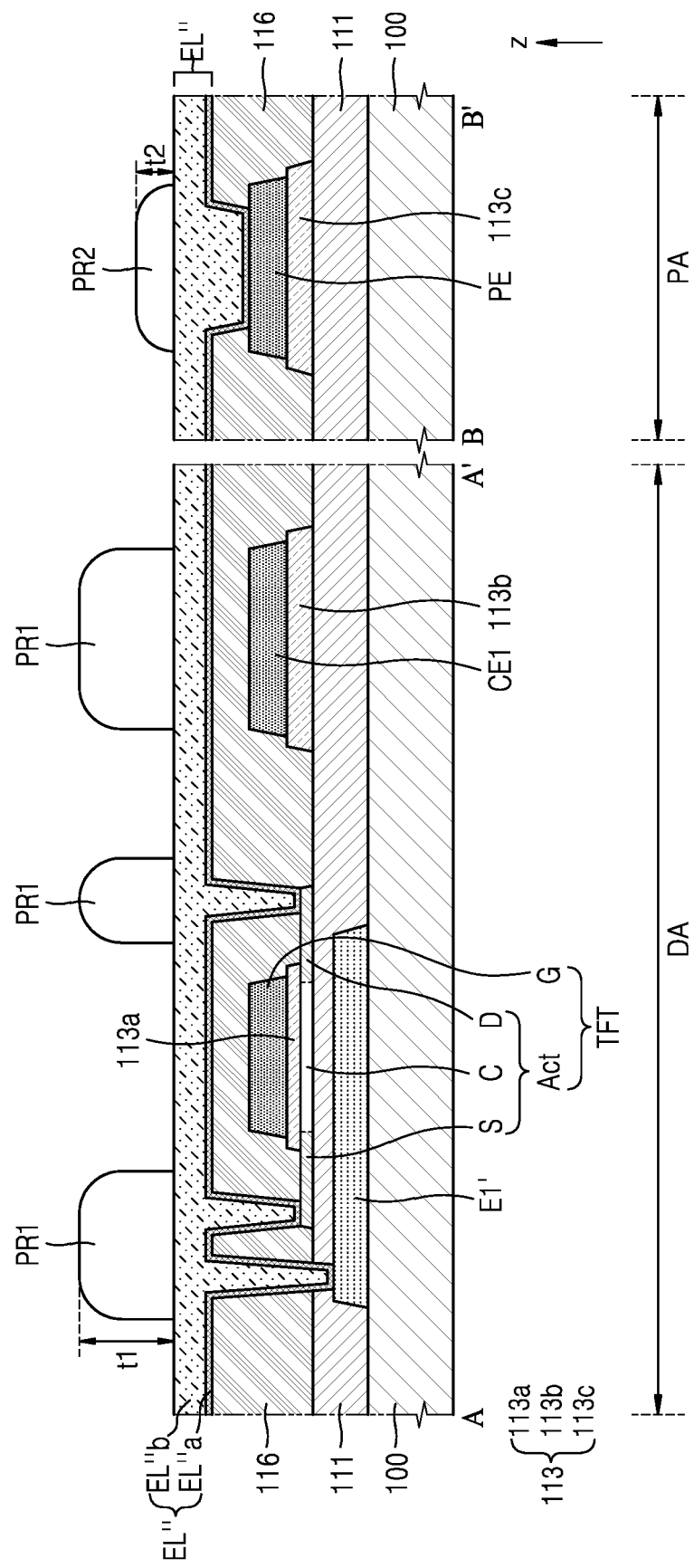

Referring to FIG. 18E, the second electrode E2', the third electrode E3', the upper electrode CE2 of the storage capacitor Cst, and the pad connection electrode PCE may be formed by patterning a preliminary lower electrode layer EL"a and a preliminary upper electrode layer EL"b.

Each of the preliminary lower electrode layer EL"a and the preliminary upper electrode layer EL"b may have a single or multi-layer structure including at least one metal selected from among aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and copper (Cu), and may be formed by using a deposition method such as, but not limited to, CVD, PECVD, LPCVD, PVD, sputtering, or ALD.

A first photoresist pattern PR1 and a second photoresist pattern PR2 may be formed on the preliminary upper electrode layer EL"b. The first photoresist pattern PR1 may be located or disposed in the display area DA, and the second photoresist pattern PR2 may be located or disposed in the peripheral area PA.

According to an embodiment, the thickness t1 of the first photoresist pattern PR1 may be greater than the thickness t2 of the second photoresist pattern PR2.

Figure 18F:
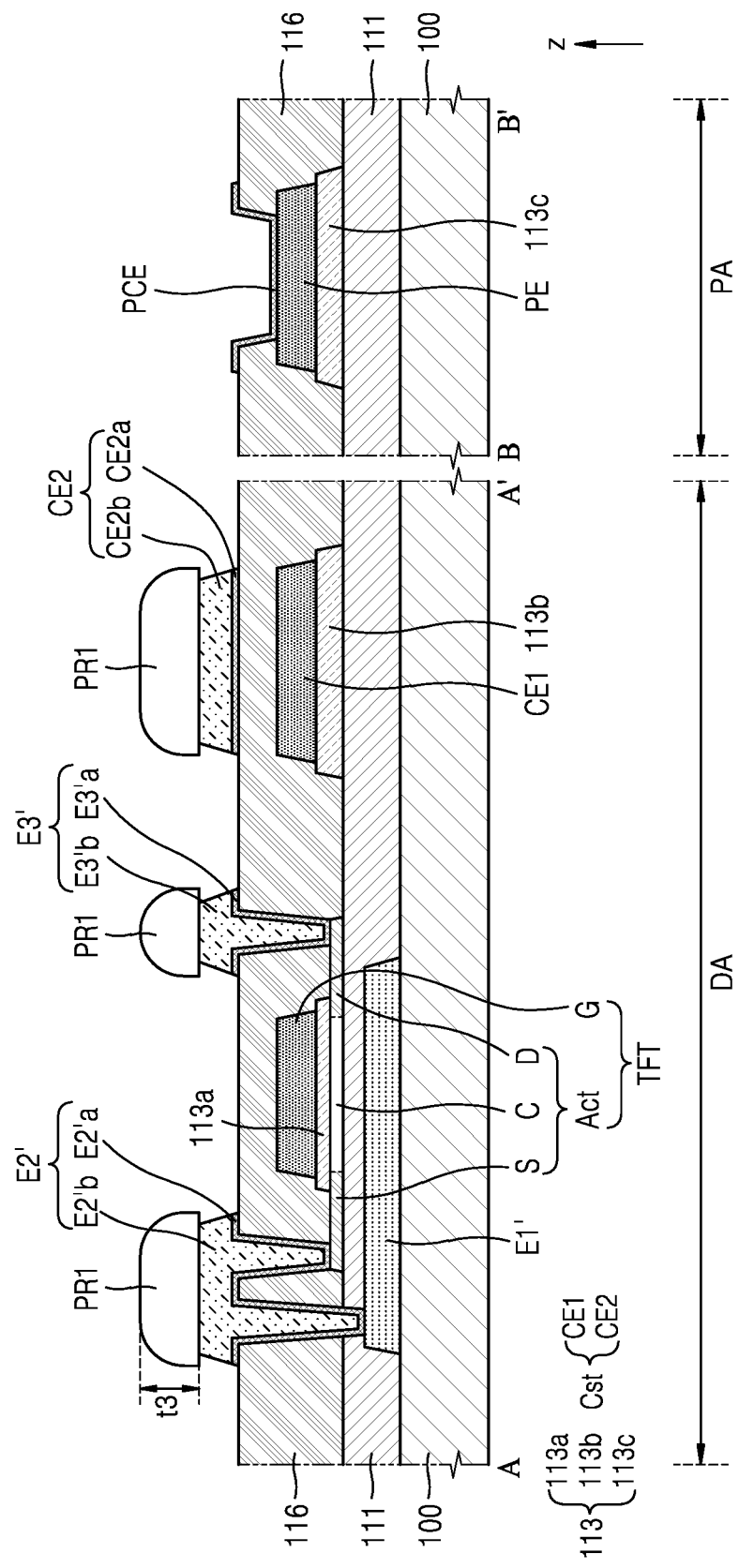

Referring to FIG. 18F, the second electrode E2', the third electrode E3', the upper electrode CE2 of the storage capacitor Cst, and the pad connection electrode PCE may be formed by etching the preliminary lower electrode layer EL"a and the preliminary upper electrode layer EL"b by using the first photoresist pattern PR1 and the second photoresist pattern PR2. In other words, the second electrode E2', the third electrode E3', the upper electrode CE2 of the storage capacitor Cst, and the pad connection electrode PCE may be formed by depositing the preliminary lower electrode layer EL"a and the preliminary upper electrode layer EL"b and performing a mask process and an etching process. For example, the etching process may be a wet etching process.

The second photoresist pattern PR2 may be removed. As the second photoresist pattern PR2 is removed, the thickness t3 of the first photoresist pattern PR1 may be obtained by reducing the thickness t1 of the first photoresist pattern PR1 by the thickness t2 of the second photoresist pattern PR2.

After the second photoresist pattern PR2 is removed, an etching process may be performed. Through the etching process, a layer other than a layer adjacent to the pad electrode PE from among the two layers of the pad connection electrode PCE may be removed. The pad connection electrode PCE may be a single layer.

Figure 18G:
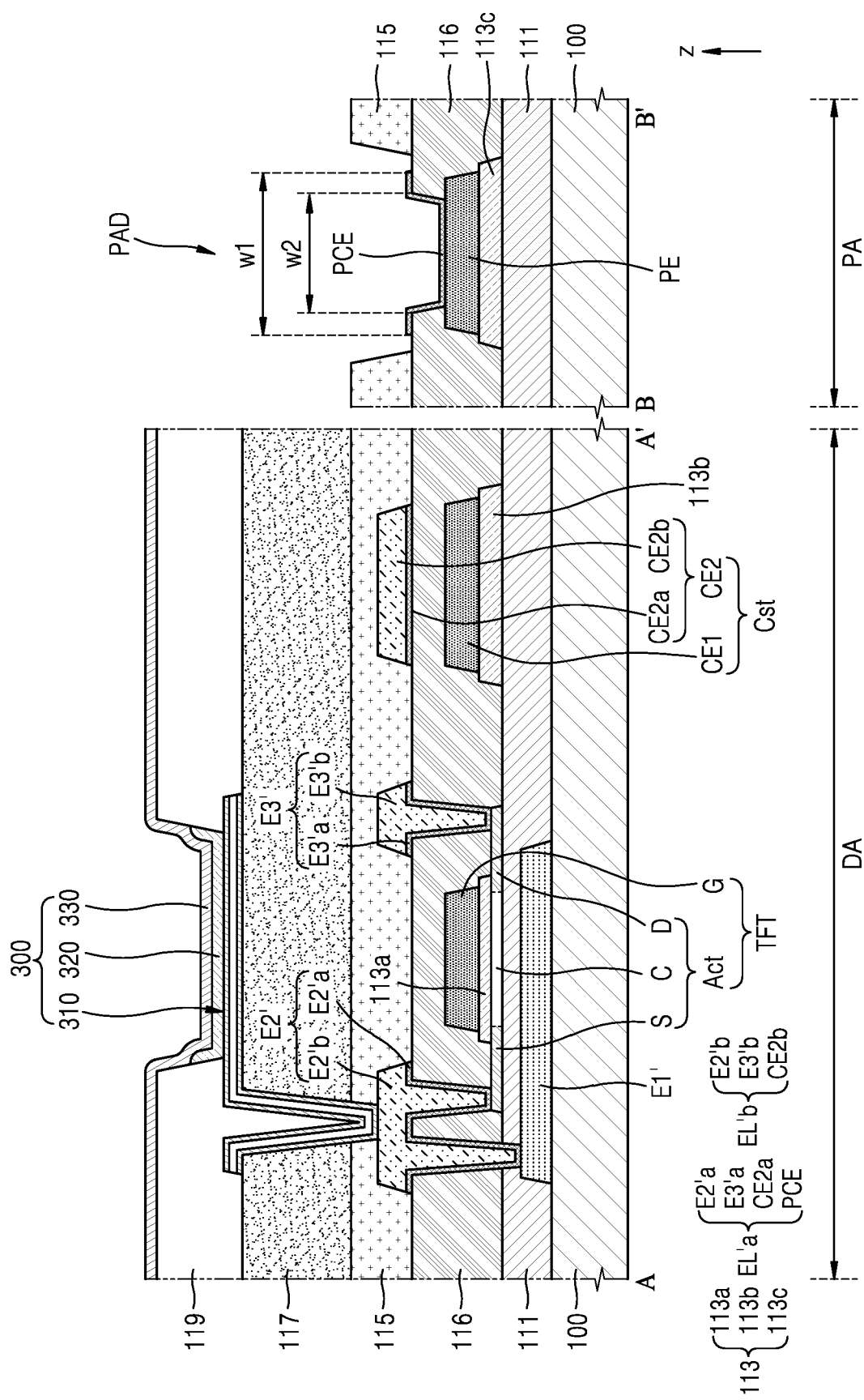

Referring to FIG. 18G, the second insulating layer 115, the third insulating layer 117, the pixel defining layer 119, and the light-emitting device 300 are sequentially formed. A process of sequentially forming the second insulating layer 115, the third insulating layer 117, the pixel defining layer 119, and the light-emitting device 300 may be the same as FIGS. 14D through 14F.

Figure 19:
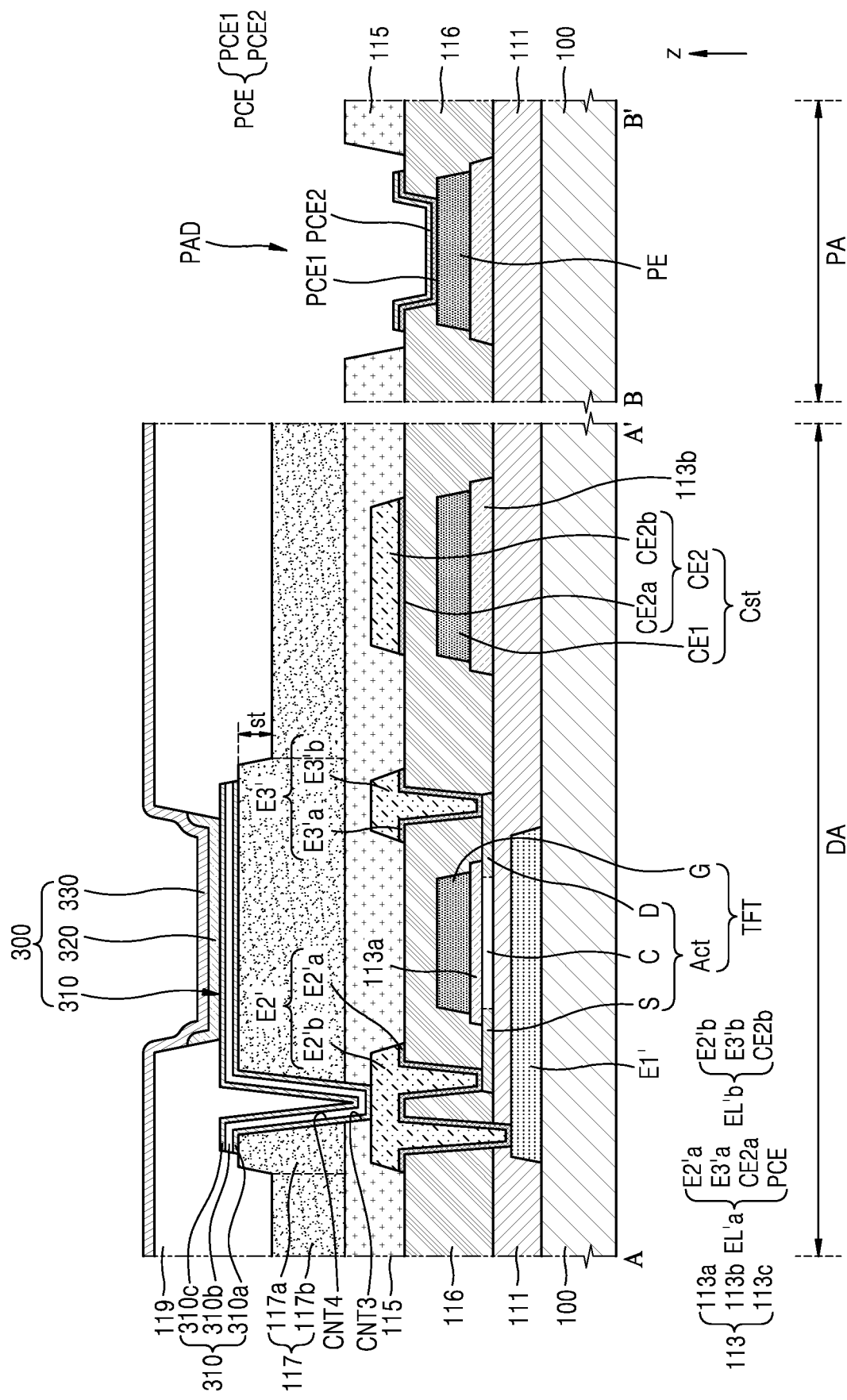
FIG. 19 is a schematic cross-sectional view of a display area and a pad unit of FIG. 1 taken along lines A-A' and B-B', respectively.

FIG. 19 is a schematic cross-sectional view of a display apparatus according to an embodiment. In detail, FIG. 19 is a schematic cross-sectional view of the display area DA and the pad unit PAD of FIG. 1 taken along lines A-A' and B-B', respectively. The same reference numerals in FIGS. 17 and 19 denote the same elements, and thus repeated descriptions thereof are omitted. FIG. 19 corresponds to a partial modification of FIG. 17, and thus will be described by focusing on differences from FIG. 17.

Referring to FIG. 19, the pad connection electrode PCE may include the first pad connection electrode PCE1 and the second pad connection electrode PCE2. The second pad connection electrode PCE2 may be located or disposed on the first pad connection electrode PCE1. Because the first pad connection electrode PCE1 corresponds to the pad connection electrode PCE of FIG. 13, the second pad connection electrode PCE2 will be focused on and described.

As described above with reference to FIG. 17, the pixel electrode 310 may have three layers. For example, the three layers of the pixel electrode 310 may be ITO/Ag/ITO. The pixel electrode 310 may include the lower pixel electrode 310a, the middle pixel electrode 310b, and the upper pixel electrode 310c. The middle pixel electrode 310b may be disposed between the lower pixel electrode 310a and the upper pixel electrode 310c.

According to an embodiment, the second pad connection electrode PCE2 may include the same material or similar material as the lower pixel electrode 310a. The second pad connection electrode PCE2 may be formed simultaneously with the lower pixel electrode 310a. The second pad connection electrode PCE2 and the lower pixel electrode 310a may be formed simultaneously by patterning a preliminary pixel electrode layer. In other words, the second pad connection electrode PCE2 and the lower pixel electrode 310a may be defined as the same pixel electrode.

Although the second pad connection electrode PCE2 may include a single layer in FIG. 19, the second pad connection electrode PCE2 may have multiple layers. For example, the second pad connection electrode PCE2 may have three layers, and may be formed simultaneously with the pixel electrode 310.

According to an embodiment, the third insulating layer 117 may include the first portion 117a, and the second portion 117b extending from the first portion 117a.

According to an embodiment, the thickness of the first portion 117a of the third insulating layer 117 may be greater than that of the second portion 117b of the third insulating layer 117. The upper surface of the third insulating layer 117 may have the step st between the first portion 117a and the second portion 117b. The vertical distance from the upper surface of the substrate 100 to the upper surface of the first portion 117a may be different from the vertical distance from the upper surface of the substrate 100 to the upper surface of the second portion 117b. For example, as shown in FIG. 19, the vertical distance from the upper surface of the substrate 100 to the upper surface of the first portion 117a may be greater than the vertical distance from the upper surface of the substrate 100 to the upper surface of the second portion 117b.

The display apparatus of FIG. 19 may be implemented through the process of FIGS. 14D through 14F and FIGS. 18A through 18G.

FIG. 20 is a schematic cross-sectional view of a display apparatus according to an embodiment. The same reference numerals in FIGS. 4 and 20 denote the same elements, and thus repeated descriptions thereof are omitted.

Referring to FIG. 20, at least one thin-film transistor TFT and a display device electrically connected to the at least one thin-film transistor TFT may be located or disposed in the display area DA of the display apparatus 1 (see FIG. 1) according to an embodiment.

The display apparatus 1 according to an embodiment may include first through third pixels PX1, PX2, and PX3 in the display area DA. However, this is merely an example, and the display apparatus 1 may include more pixels. Although the first through third pixels PX1, PX2, and PX3 are adjacent to one another in FIG. 20, embodiments are not limited thereto. In other words, elements such as other wirings may be located or disposed between the first through third pixels PX1, PX2, and PX3. Accordingly, for example, the first pixel PX1 and the second pixel PX2 may not be adjacent to each other. In FIG. 20, cross-sections of the first through third pixels PX1, PX2, and PX3 may not be cross-sections in the same direction.

Each of the first through third pixels PX1, PX2, and PX3 may include an emission area EA. The emission region EA may be an area where light is generated and is emitted to the outside. A non-emission area NEA may be located or disposed between the emission areas EA, and the emission areas EA may be divided by the non-emission area NEA.

The first through third pixels PX1, PX2, and PX3 may emit light of different colors. For example, the first pixel PX1 may emit red light, the second pixel PX2 may emit green light, and the third pixel PX3 may emit blue light. In a plan view, the emission areas EA may have any of various substantially polygonal shapes or a substantially circular shape, and may be arranged or disposed in any of various patterns such as a stripe pattern or a PenTile® pattern.

The display apparatus 1 may include the first quantum dot layer 220a, the second quantum dot layer 220b, and the transmitting layer 220c to respectively correspond to the emission areas EA. The first quantum dot layer 220a, the second quantum dot layer 220b, and the transmitting layer 220c may include quantum dots and metal nano-particles.

For example, the first pixel P1 may include the first quantum dot layer 220a, the second pixel PX2 may include the second quantum dot layer 220b, and the third pixel PX3 may include the transmitting layer 220c.

According to an embodiment, average sizes of quantum dots included in the first quantum dot layer 220a and the second quantum dot layer 220b may be different from each other.

The display apparatus 1 according to an embodiment will be described in detail according to a stacking order of FIG. 20.

The substrate 100 (hereinafter, referred to as a lower substrate) may include a glass material, a metal material, or a material having flexible or bendable characteristics. A barrier layer (not shown) may be further included disposed between the lower substrate 100 and the first insulating layer 111.

The first electrode E1, the second electrode E2, the thin-film transistor TFT, and the storage capacitor Cst may be located or disposed on the lower substrate 100.

The second insulating layer 115 may be located or disposed on the thin-film transistor TFT. The third insulating layer 117 may be located or disposed on the second insulating layer 115, and first through third light-emitting devices 300a, 300b, and 300c may be located or disposed on the third insulating layer 117. Each of the first through third light-emitting devices 300a, 300b, and 300c commonly may include a pixel electrode, an intermediate layer including an organic emission layer, and an opposite electrode. The pixel defining layer 119 may be located or disposed on the third insulating layer 117.

Although the thin-film transistor TFT of FIG. 4 is illustrated in FIG. 20, thin-film transistors TFTs electrically connected to the first through third light-emitting devices 300a, 300b, and 300c, respectively, may be replaced by the thin-film transistors TFT of FIG. 13 or the thin-film transistors TFT of FIG. 17.

Because the first through third light-emitting devices 300a, 300b, and 300c may be easily damaged by external moisture, external oxygen, or the like, the first through third light-emitting devices 300a, 300b, and 300c may be covered or overlapped and protected by a thin-film encapsulation layer 400. The thin-film encapsulation layer 400 may cover or overlap the display area DA and extend beyond the display area DA. The thin-film encapsulation layer 400 may include at least one organic encapsulation layer and at least one inorganic encapsulation layer. For example, the thin-film encapsulation layer 400 may include a first inorganic encapsulation layer 410, an organic encapsulation layer 420, and a second inorganic encapsulation layer 430.

The first inorganic encapsulation layer 410 may cover or overlap the opposite electrode and may include silicon oxide, silicon nitride, and/or silicon oxynitride. Although not shown in FIG. 20, other layers, such as a capping layer, may be disposed between the first inorganic encapsulation layer 410 and the opposite electrode when necessary. Because the first inorganic encapsulation layer 410 is formed along a structure below the first inorganic encapsulation layer 410, the upper surface thereof is not flat. The organic encapsulation layer 420 covers or overlaps the first inorganic encapsulation layer 410, and unlike the first inorganic encapsulation layer 410, the organic encapsulation layer 420 may have a substantially flat top surface.

Even in case that cracks occur in the thin-film encapsulation layer 400 due to the multi-layer structure, the cracks may not be connected between the first inorganic encapsulation layer 410 and the organic encapsulation layer 420 or between the organic encapsulation layer 420 and the second inorganic encapsulation layer 430. Accordingly, formation of a path via which external moisture, oxygen, or the like permeates into the display area DA may be prevented or minimized.

The upper substrate 200 may be located or disposed over the lower substrate 100, and the opposite electrode may be located or disposed between the upper substrate 200 and the lower substrate 100. The upper substrate 200 may include glass, metal, or polymer resin. In case that the upper substrate 200 is flexible or bendable, the upper substrate 200 may include polymer resin such as polyethersulphone, polyacrylate, polyetherimide, polyethylene naphthalate, polyethylene terephthalate, polyphenylene sulfide, polyarylate, polyimide, polycarbonate, or cellulose acetate propionate. The upper substrate 200 may have a multi-layered structure including two layers each including a polymer resin and a barrier layer including an inorganic material (silicon oxide, silicon nitride, silicon oxynitride, or the like) disposed between the two layers. In this way, various modifications may be made.

A light-shielding layer 230 may be located or disposed on a lower surface of the upper substrate 200 facing the lower substrate 100. The light-shielding layer 230 has openings respectively corresponding to the first through third light-emitting devices 300a, 300b, and 300c, and the first through third filter layers 210a, 210b, and 210c are respectively located or disposed in the openings. The light-shielding layer 230 that is a black matrix may be a layer for improving color sharpness and contrast. The light-shielding layer 230 may include at least one of a black pigment, a black dye, and black particles. According to an embodiment, the light-shielding layer 230 may include a material such as Cr or $CrO_X$, $Cr/CrO_X$, $Cr/CrO_X/CrN_Y$, resin (for example, a carbon pigment or an RGB mixed pigment), graphite, a non-Cr-based material, or the like within the spirit and the scope of the disclosure.

The first filter layer 210a may transmit only light having a wavelength ranging from about 630 nm to about 780 nm, the second filter layer 210b may transmit only light having a wavelength ranging from about 495 nm to about 570 nm, and the third filter layer 210c may transmit only light having a wavelength ranging from about 450 nm to about 495 nm. The first through third filter layer 210a, 210b, and 210c may reduce reflection of external light in the display apparatus 1.

A first upper insulating layer 240 may be located or disposed on the light-shielding layer 230. The first upper insulating layer 240 has a $1\text{-}1^{th}$ opening 241a corresponding to the first light-emitting device 300a, a $1\text{-}2^{th}$ opening 241b corresponding to the second light-emitting device 300b, and a $1\text{-}3^{th}$ opening 241c corresponding to the third light-emitting device 300c. The first quantum dot layer 220a may be located or disposed in the $1\text{-}1^{th}$ opening 241a, the second quantum dot layer 220b may be located or disposed in the $1\text{-}2^{th}$ opening 241b, and the transmitting layer 220c may be located or disposed in the $1\text{-}3^{th}$ opening 241c. The first quantum dot layer 220a and the second quantum dot layer 220b may be formed by inkjet printing.

The first upper insulating layer 240 may include, for example, an organic material. When necessary, the first upper insulating layer 240 may include a light-shielding material to function as a light-shielding layer. The light-shielding material may include at least one of, for example, a black pigment, a black dye, black particles, and metal particles. According to an embodiment, the first upper insulating layer 240 may have a blue color.

The first quantum dot layer 220a may convert light of a first wavelength band generated by the intermediate layer on the pixel electrode into light of a second wavelength band. For example, in case that light having a wavelength ranging from about 450 nm to about 495 nm is generated by the intermediate layer on the pixel electrode, the first quantum dot layer 220a may convert the light into light having a wavelength ranging from about 630 nm to about 780 nm. Accordingly, in the first pixel PX1, the light having the wavelength ranging from about 630 nm to about 780 nm is emitted through the upper substrate 200 to the outside.

The second quantum dot layer 220b may convert the light of the first wavelength band generated by the intermediate layer on the pixel electrode into light of a third wavelength band. For example, in case that the light having a wavelength ranging from about 450 nm to about 495 nm is generated by the intermediate layer on the pixel electrode, the second quantum dot layer 220b may convert the light into light having a wavelength ranging from about 495 nm to about 570 nm. Accordingly, in the second pixel PX2, the light having the wavelength ranging from about 495 nm to about 570 nm is emitted through the upper substrate 200 to the outside.

Each of the first quantum dot layer 220a and the second quantum dot layer 220b may be formed by dispersing quantum dots in a resin. The quantum dots include a semiconductor material such as cadmium sulfide (CdS), cadmium telluride (CdTe), zinc sulfide (ZnS), or indium phosphide (InP). The quantum dots may have a size of several nanometers, and a wavelength of light after conversion varies according to the size of the quantum dots. Any light-transmitting material may be used as the resin of the first quantum dot layer 220a and the second quantum dot layer 220b. For example, a polymer resin such as acryl, benzocyclobutene (BCB), or hexamethyldisiloxane (HMDSO) may be used as a material for forming the first quantum dot layer 220a and the second quantum dot layer 220b.

In the third pixel PX3, light having a first wavelength generated by the intermediate layer may be emitted to the outside without wavelength conversion. Accordingly, the third pixel PX3 may not include a quantum dot layer. Because a quantum dot layer is not required in the 1-3$^{th}$ opening 241c, the transmitting layer 220c formed of a light-transmitting resin may be located or disposed in the 1-3$^{th}$ opening 241c. The transmitting layer 220c may include acryl, BCB, or HMDSO. When necessary, unlike in FIG. 20, the transmitting layer 220c may not be located or disposed in the 1-3$^{th}$ opening 241c.

In the display apparatus according to an embodiment, light of the second wavelength band is emitted to the outside in the first pixel PX1, light of the third wavelength band is emitted to the outside in the second pixel PX2, and light of the first wavelength band is emitted to the outside in the third pixel PX3. Accordingly, the display apparatus 1 according to an embodiment may display a full-color image.

A second upper insulating layer 250 may be located or disposed on the first upper insulating layer 240. The second upper insulating layer 250 has a 2-1$^{th}$ opening 251a corresponding to the 1-1$^{th}$ opening 241a, a 2-2$^{th}$ opening 251b corresponding to the 1-2$^{th}$ opening 241b, and a 2-3$^{th}$ opening 251c corresponding to the 1-3$^{th}$ opening 241c.

The first quantum dot layer 220a and the second quantum dot layer 220b respectively located or disposed in the 1-1$^{th}$ opening 241a and the 1-2$^{th}$ opening 241b may be formed by inkjet printing, and the 2-1th opening 251a and the 2-2th opening 251b may be paths through which ink sprayed via a nozzle falls and moves during the inkjet printing. The ink moving through the second upper insulating layer 250 including the 2-1th opening 251a and the 2-2th opening 251b may reach the 1-1th opening 241a and the 1-2th opening 241b, to form the first quantum dot layer 220a and the second quantum dot layer 220b.

The second upper insulating layer 250 may include a light-shielding material. For example, the light-shielding material may include at least one of a black pigment, a black dye, black particles, and metal particles. According to an embodiment, the second upper insulating layer 250 may have a blue color. Although the first upper insulating layer 240 may also include a light-shielding material as described above, in order to form the first quantum dot layer 220a and the second quantum dot layer 220b by using inkjet printing, materials of the first upper insulating layer 240 and the second upper insulating layer 250 may be different from each other.

For example, the second upper insulating layer 250, which is a path through which ink sprayed via a nozzle moves during inkjet printing, may include a material having no affinity for the ink. Also, the first upper insulating layer 240 in which the first quantum dot layer 220a and the second quantum dot layer 220b may be formed by accumulating ink may include a material having affinity for the ink.

Although both the first upper insulating layer 240 and the second upper insulating layer 250 are illustrated in FIG. 20, the second upper insulating layer 250 may be omitted and only the first upper insulating layer 240 may be located or disposed on the upper substrate 200.

A filler 600 may be further located or disposed between the lower substrate 100 and the upper substrate 200. The filler 600 may function as a buffer against external pressure, or the like within the spirit and the scope of the disclosure. The filler 600 may include an organic material such as methyl silicone, phenyl silicone, or polyimide. However, embodiments are not limited thereto, and the filler 600 may include an organic sealant such as a urethane-based resin, an epoxy-based resin, or an acrylic resin, or an inorganic sealant such as silicon.

Figure 21A:
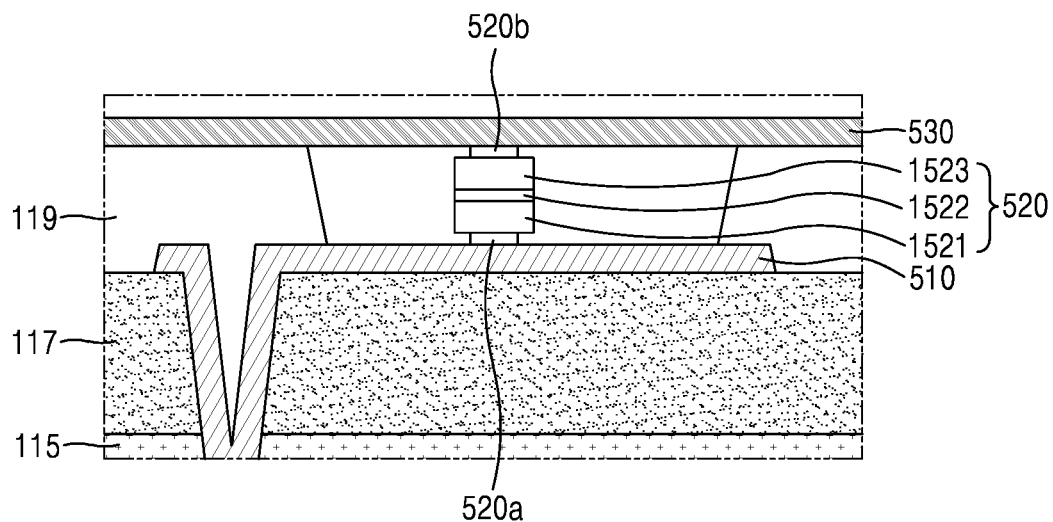
FIG. 21A is a schematic cross-sectional view of an inorganic light-emitting diode according to an embodiment.
Figure 21B:
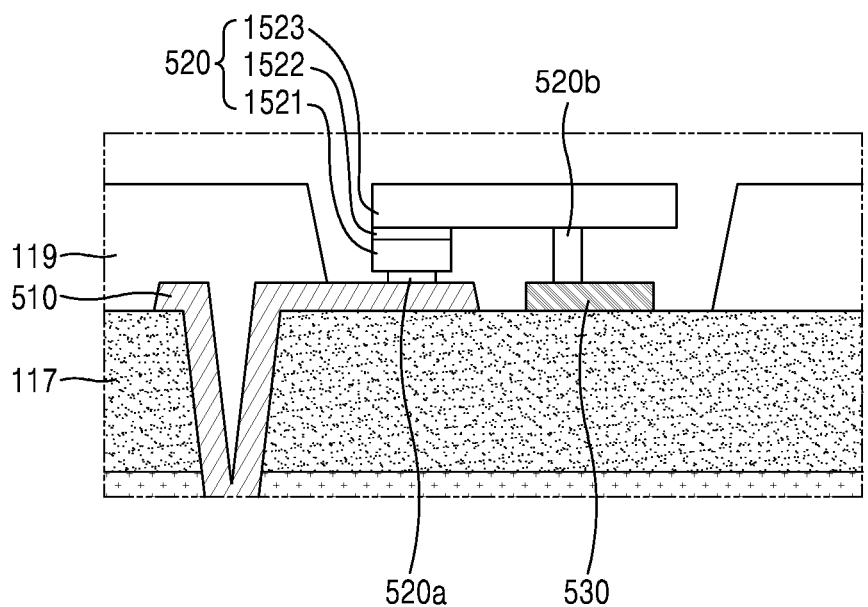
FIG. 21B is a schematic cross-sectional view of an inorganic light-emitting diode according to an embodiment.

FIG. 21A is a schematic cross-sectional view of an inorganic light-emitting diode according to an embodiment, and FIG. 21B is a schematic cross-sectional view of an inorganic light-emitting diode according to an embodiment.

The display apparatus 1 (see FIG. 1) may include an inorganic light-emitting diode (or a micro LED (m-LED) as a light-emitting device. Each inorganic light-emitting diode (m-LED) may emit blue light, and the emitted blue light may pass through the color filter unit or color filter CU of FIG. 20. The display apparatus 1 may display an image by using light transmitted by the color filter unit or color filter CU, for example, red light, green light, and blue light.

A pixel electrode 510 of FIGS. 21A and 21B may be electrically connected to a pixel circuit including the thin-film transistor TFT of FIG. 20 and the storage capacitor Cst of FIG. 20.

Referring to FIG. 21A, an emission layer 520 may be located or disposed on the pixel electrode 510 (or a first electrode), and an opposite electrode 530 (or a second electrode) may be located or disposed on the emission layer 520.

The emission layer 520 may include a first semiconductor layer 1521, a second semiconductor layer 1523, and an intermediate layer 1522 disposed between the first semiconductor layer 1521 and the second semiconductor layer 1523.

The first semiconductor layer 1521 may be implemented as, for example, a p-type semiconductor layer. The p-type semiconductor layer may be selected from semiconductor materials having a composition formula of $In_xAl_yGa_{1-x-y}N$ ($0 \leq x \leq 1$, $0 \leq y \leq 1$, $0 \leq x+y \leq 1$), for example, GaN, AlN, AlGaN, InGaN, InN, InAlGaN, and AlInN, and may be doped with a p-type dopant such as Mg, Zn, Ca, Sr, or Ba. The first semiconductor layer 1521 may be electrically connected to the pixel electrode 510 via a first conductive pad electrode 520a.

The second semiconductor layer 1523 may be implemented as, for example, an n-type semiconductor layer. The n-type semiconductor layer may be selected from semiconductor materials having a composition formula of $In_xAl_yGa_{1-x-y}N$ ($0 \leq x \leq 1$, $0 \leq y \leq 1$, $0 \leq x+y \leq 1$), for example, GaN, AlN, AlGaN, InGaN, InN, InAlGaN, and AlInN, and may be doped with an n-type dopant such as Si, Ge, or Sn. The second semiconductor layer 1523 may be electrically connected to the opposite electrode 530 via a second conductive pad electrode 520b. Embodiments are not limited thereto. According to an embodiment, the first semiconductor layer 1521 may include an n-type semiconductor layer, and the second semiconductor layer 1523 may include a p-type semiconductor layer.

The intermediate layer 1522, which is an area where electrons and holes are recombined, may transit to a low energy level, and may emit light (for example, blue light) having a wavelength corresponding to the low energy level. The intermediate layer 1522 may be formed by including a semiconductor material having a composition formula of $In_xAl_yGa_{1-x-y}N$ ($0 \leq x \leq 1$, $0 \leq y \leq 1$, $0 \leq x+y \leq 1$), and may have a single quantum well structure or a multi-quantum well (MQW) structure. For example, the intermediate layer 1522 may have a quantum wire structure or a quantum dot structure.

Although the first conductive pad electrode 520*a* and the second conductive pad electrode 520*b* are located or disposed on two sides of the emission layer 520 that are opposite to each other, but embodiments are not limited thereto.

Referring to FIG. 21B, the first conductive pad electrode 520*a* and the second conductive pad electrode 520*b* may be arranged or disposed on one or a side of the emission layer 520, for example, below the emission layer 520. The pixel electrode 510, and the opposite electrode 530 having an opposite polarity to the pixel electrode 510 may be located or disposed on the same layer.

Also, in a horizontal or flip-type light-emitting diode of FIG. 21B, the emission layer 520 may include the first semiconductor layer 1521, the second semiconductor layer 1523, and the intermediate layer 1522, and detailed characteristics thereof are the same as the above description.

According to an embodiment as described above, a display apparatus that prevents surface damage to an insulating layer on which pixel electrodes are located or disposed, and a method of manufacturing the same are provided. Of course, the scope of the disclosure is not limited thereto.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A display apparatus comprising:
   a substrate comprising a display area and a peripheral area adjacent to the display area;
   a thin-film transistor located in the display area of the substrate, and comprising:
   a semiconductor layer; and
   a gate electrode overlapping a channel region of the semiconductor layer;
   a conductive layer disposed between the substrate and the semiconductor layer, and comprising:
   a first electrode located in the display area of the substrate; and
   a pad electrode located in the peripheral area of the substrate,
   a first insulating layer disposed between the conductive layer and the semiconductor layer and having a first opening that exposes at least a portion of an upper surface of the pad electrode;
   a second insulating layer disposed on the gate electrode of the thin-film transistor and having a second opening coinciding with the first opening of the first insulating layer, the gate electrode being disposed between the second insulating layer and the substrate; and
   a pixel electrode disposed over the second insulting layer and electrically connected to the thin-film transistor.

2. The display apparatus of claim 1, further comprising a third insulating layer disposed on the second insulating layer and having a third opening coinciding with the first opening of the first insulating layer and the second opening of the second insulating layer, the third opening exposing the at least a portion of the upper surface of the pad electrode.

3. The display apparatus of claim 2, wherein the third insulating layer comprises:
   a first portion having a first thickness; and
   a second portion having a second thickness less than the first thickness of the first portion.

4. The display apparatus of claim 3, wherein the third opening is located in the second portion of the third insulating layer.

5. The display apparatus of claim 3, further comprising:
   a pixel defining layer disposed on the third insulating layer and exposing at least a portion of the pixel electrode, the pixel electrode being disposed on the first portion of the third insulating layer;
   an intermediate layer located on the at least a portion of the pixel electrode; and
   an opposite electrode disposed on the intermediate layer.

6. The display apparatus of claim 3, wherein the second insulating layer comprises:
   a first portion having a third thickness; and
   a second portion having a fourth thickness less than the third thickness of the first portion.

7. The display apparatus of claim 1 wherein
   the second opening of the second insulating layer comprises a lower opening portion and an upper opening portion, and
   an opening area of the upper opening portion is greater than an opening area of the lower opening portion in a plan view.

8. The display apparatus of claim 7, wherein
   the second insulating layer comprises:
   a lower sidewall that defines the lower opening portion; and
   an upper sidewall that defines the upper opening portion, and,
   the upper sidewall is disposed around the lower sidewall in a plan view.

9. The display apparatus of claim 7, further comprising a third insulating layer disposed on the second insulating layer and having a third opening that exposes the at least a portion of the upper surface of the pad electrode, wherein
   the lower opening portion of the second opening of the second insulating layer coincides with the first opening of the first insulating layer, and
   the upper opening portion of the second opening of the second insulating layer coincides with the third opening of the third insulating layer.

10. The display apparatus of claim 1, further comprising a third insulating layer disposed on the second insulating layer and having a third opening that defines a pad unit including a plurality of pad electrodes.

11. The display apparatus of claim 1, wherein the conductive layer further comprises a second electrode that at least partially overlaps the channel region of the semiconductor layer.

12. The display apparatus of claim 1, wherein
   the pad electrode includes:
   a first layer; and
   a second layer disposed on the first layer, and the first opening of the first insulating layer partially exposes the second layer of the pad electrode in a plan view.

13. The display apparatus of claim 1, wherein
   the gate electrode comprises:
   a lower gate electrode; and
   an upper gate electrode disposed on the lower gate electrode, the display apparatus further comprises a lower electrode layer including the lower gate electrode and a first pad connection electrode, and the first pad connection electrode is disposed over the first insulating layer and electrically contacts the pad electrode through the first opening of the first insulating layer.

14. The display apparatus of claim 13, wherein a width of the first pad connection electrode is greater than a width of the at least a portion of the pad electrode exposed by the first opening of the first insulating layer.

15. The display apparatus of claim 13, further comprising a gate insulating layer disposed between the semiconductor layer and the gate electrode,
wherein a portion of the gate insulating layer is located between a portion of the first pad connection electrode and the first insulating layer.

16. The display apparatus of claim 15, further comprising a second insulating layer disposed on the thin-film transistor and having a second opening that exposes an upper surface of the first pad connection electrode and a portion of the gate insulating layer.

17. The display apparatus of claim 13, further comprising a second pad connection electrode disposed on the first pad connection electrode.

18. The display apparatus of claim 17, further comprising:
a third insulating layer disposed to overlap the thin-film transistor in a plan view; and
a pixel electrode layer including:
the pixel electrode disposed on the third insulating layer; and
the second pad connection electrode.

19. The display apparatus of claim 17, further comprising a third insulating layer disposed on the thin-film transistor, wherein
the pixel electrode is disposed on the third insulating layer, the pixel electrode comprising an upper pixel electrode disposed on a lower pixel electrode,
a first pixel electrode layer includes the lower pixel electrode and the second pad connection electrode, and
a second pixel electrode layer includes the upper pixel electrode.

20. A display apparatus comprising:
a substrate comprising a display area and a peripheral area adjacent to the display area;
a thin-film transistor located in the display area of the substrate, and comprising:
a semiconductor layer; and
a gate electrode overlapping a channel region of the semiconductor layer;
a conductive layer disposed between the substrate and the semiconductor layer, and comprising:
a first electrode located in the display area of the substrate; and
a pad electrode located in the peripheral area of the substrate; and
a first insulating layer disposed between the conductive layer and the semiconductor layer and having a first opening that exposes at least a portion of an upper surface of the pad electrode, wherein
the first insulating layer comprises:
a first portion having a first thickness; and
a second portion having a second thickness less than the first thickness of the first portion,
the first opening is located in the second portion of the first insulating layer, and
the first portion is located around the second portion.

21. The display apparatus of claim 20, further comprising a second insulating layer disposed on the thin-film transistor and having a second opening coinciding with the first opening of the first insulating layer, wherein
the second insulating layer includes:
a first portion coinciding with the first portion of the first insulating layer; and
a second portion coinciding with the second portion of the first insulating layer, and
the second opening is located in the second portion of the second insulating layer.

22. The display apparatus of claim 21, wherein
the second opening of the second insulating layer comprises a lower opening portion and an upper opening portion, and,
an opening area of the upper opening portion is greater than an opening area of the lower opening portion in a plan view.

23. A method of manufacturing a display apparatus, the method comprising:
preparing a substrate comprising a display area and a peripheral area adjacent to the display area;
forming a conductive layer on the substrate, the conductive layer comprising a first electrode located in the display area and a pad electrode located in the peripheral area;
forming a first insulating layer on the conductive layer;
forming a semiconductor layer on the first insulating layer, the semiconductor layer having a channel region that overlaps the first electrode;
forming a gate insulating layer that overlaps the semiconductor layer in a plan view;
forming an electrode layer on the gate insulating layer, the electrode layer including a gate electrode that overlaps the channel region of the semiconductor layer in a plan view;
forming a second insulating layer on the electrode layer; the gate electrode being disposed between the second insulating layer and the substrate; and
forming a pixel electrode over the second insulating layer.

24. The method of claim 23, further comprising:
forming an opening in the second insulating layer at a location corresponding to the pad electrode; and then
forming an opening in the first insulating layer to expose the pad electrode using the second insulating layer as an etch mask.

25. The method of claim 24, wherein a lateral surface of the opening in the second insulating layer and a lateral surface of the opening in the first insulating layer are disposed on a same etched surface.

* * * * *